United States Patent
Hayano

(10) Patent No.: US 11,800,786 B2
(45) Date of Patent: Oct. 24, 2023

(54) ORGANIC ELECTROLUMINESCENCE DEVICE AND POLYCYCLIC COMPOUND FOR ORGANIC ELECTROLUMINESCENCE DEVICE

(71) Applicant: Samsung Display Co., Ltd., Yongin-si (KR)

(72) Inventor: Tetsuji Hayano, Yokohama (JP)

(73) Assignee: Samsung Display Co., Ltd., Yongin-si (KR)

( * ) Notice: Subject to any disclaimer, the term of this patent is extended or adjusted under 35 U.S.C. 154(b) by 564 days.

(21) Appl. No.: 16/998,959

(22) Filed: Aug. 20, 2020

(65) Prior Publication Data

US 2021/0143332 A1    May 13, 2021

(30) Foreign Application Priority Data

Nov. 11, 2019  (KR) .................. 10-2019-0143525

(51) Int. Cl.
| | |
|---|---|
| C09K 11/06 | (2006.01) |
| H10K 85/30 | (2023.01) |
| C07F 5/04 | (2006.01) |
| H10K 50/11 | (2023.01) |
| H10K 101/10 | (2023.01) |

(52) U.S. Cl.
CPC .............. *H10K 85/322* (2023.02); *C07F 5/04* (2013.01); *C09K 11/06* (2013.01); *C09K 2211/1018* (2013.01); *H10K 50/11* (2023.02); *H10K 2101/10* (2023.02)

(58) Field of Classification Search
CPC .. H10K 85/322; H10K 2101/10; H10K 50/11; C09K 11/06; C09K 2211/1018; C07F 5/04
USPC ........................................................ 428/690
See application file for complete search history.

(56) References Cited

U.S. PATENT DOCUMENTS

| | | | |
|---|---|---|---|
| 2019/0058124 A1* | 2/2019 | Hatakeyama | ........ H10K 85/631 |
| 2019/0115538 A1 | 4/2019 | Lim et al. | |

FOREIGN PATENT DOCUMENTS

| | | |
|---|---|---|
| KR | 10-2018-0108604 A | 10/2018 |
| KR | 10-2019-0042791 A | 4/2019 |
| WO | WO 2017/138526 A1 | 8/2017 |
| WO | WO 2018/212169 A1 | 11/2018 |

OTHER PUBLICATIONS

Lien, Yi-Jyun et al.; "First N-Borylated Emitters Displaying Highly Efficient Thermally Activated Delayed Fluorescence and High-Performance OLEDs"; *ACS Appl. Mater. Interfaces.*; 2017; 9; pp. 27090-27101.

Matsuo, Kyohei et al.; "Boronate- and borinate-based π-systems for blue thermally activated delayed fluorescence materials"; *Chem. Commun.*; 2019, 55, pp. 2501-2504.

\* cited by examiner

*Primary Examiner* — Hui H Chin
(74) *Attorney, Agent, or Firm* — Lewis Roca Rothgerber Christie LLP

(57) ABSTRACT

An organic electroluminescence device of an embodiment includes a first electrode, a second electrode, and an emission layer disposed between the first electrode and the second electrode and including a polycyclic compound, wherein the polycyclic compound includes a boron atom, a first aromatic ring and a second aromatic ring, which are each directly connected with the boron atom, an oxygen atom or a sulfur atom, which is directly connected with the boron atom, a third aromatic ring, which is directly connected with the oxygen atom or the sulfur atom, a first linker connecting the first aromatic ring and the second aromatic ring, and a second linker connecting the second aromatic ring and the third aromatic ring, thereby showing long-life characteristics and excellent color reproducibility.

20 Claims, 2 Drawing Sheets

ORGANIC ELECTROLUMINESCENCE DEVICE AND POLYCYCLIC COMPOUND FOR ORGANIC ELECTROLUMINESCENCE DEVICE

CROSS-REFERENCE TO RELATED APPLICATION

This application claims priority to and the benefit of Korean Patent Application No. 10-2019-0143525, filed on Nov. 11, 2019, the entire content of which is hereby incorporated by reference.

BACKGROUND

One or more aspects of embodiments of the present disclosure relate to an organic electroluminescence device and a polycyclic compound used therein.

Organic electroluminescence displays are being actively developed as image displays. An organic electroluminescence display is a so-called self-luminescent display, in which holes and electrons respectively injected from a first electrode and a second electrode recombine in an emission layer to produce excitons, and light is emitted through transition of the excitons to the ground state, thereby achieving display.

In the application of an organic electroluminescence device to a display device, a decrease in driving voltage, and an increase in emission efficiency and lifespan of the organic electroluminescence device are desired. Organic electroluminescence device materials capable of stably achieving these demands are desired.

In order to accomplish an organic electroluminescence device with long life (lifespan), materials are being developed that take advantage of phosphorescence emission (which uses energy in a triplet state), delayed fluorescence emission (which uses the generation of singlet excitons from the collision of triplet excitons according to triplet-triplet annihilation, TTA), and/or thermally activated delayed fluorescence (TADF) phenomena.

SUMMARY

One or more aspects of embodiments of the present disclosure are directed toward an organic electroluminescence device showing excellent life characteristics and/or excellent emission efficiency.

One or more aspects of embodiments of the present disclosure are directed toward a polycyclic compound as a material for an organic electroluminescence device having high color purity and/or long-life characteristics.

One or more example embodiments of the present disclosure provide an organic electroluminescence device including a first electrode, a second electrode oppositely disposed to the first electrode, and an emission layer disposed between the first electrode and the second electrode and including a polycyclic compound, wherein the polycyclic compound includes a boron atom, a first aromatic ring, and a second aromatic ring, which are directly connected with the boron atom, an oxygen atom or a sulfur atom, which is directly connected with the boron atom, a third aromatic ring, which is directly connected with the oxygen atom or the sulfur atom, a first linker connecting the first aromatic ring and the second aromatic ring, and a second linker connecting the second aromatic ring and the third aromatic ring, wherein the first electrode and the second electrode each independently comprise at least one selected from Ag, Mg, Cu, Al, Pt, Pd, Au, Ni, Nd, Ir, Cr, Li, Ca, LiF/Ca, LiF/Al, Mo, Ti, In, Sn, and Zn, a compound of two or more thereof, a mixture of two or more thereof, or an oxide thereof.

In an embodiment, the first linker may be a direct linkage, *—O—* or *—NAr$_a$—*, and Ar$_a$ may be a substituted or unsubstituted aryl group of 6 to 30 carbon atoms.

In an embodiment, the second linker may be a direct linkage, *—O—*, *—S—*, *—C(=O)—*, *—SO$_2$—*, or *—NAr$_b$—*, and Ar$_b$ may be a substituted or unsubstituted aryl group of 6 to 30 carbon atoms.

In an embodiment, the first aromatic ring to the third aromatic ring may each independently be a substituted or unsubstituted benzene ring or a substituted or unsubstituted pyrimidine ring.

In an embodiment, the emission layer may be to emit delayed fluorescence.

In an embodiment, the emission layer may include a host and a dopant, and the dopant may include the polycyclic compound.

In an embodiment, the polycyclic compound may be represented by Formula 1:

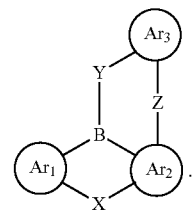

Formula 1

In Formula 1, X may be *—O—* or *—NAr$_4$—*, Y may be *—O—* or *—S—*, Z may be a direct linkage, *—O—*, *—S—*, *—C(=O)—*, *—SO$_2$—*, or *—NAr$_5$—*, Ar$_1$ to Ar$_3$ may each independently be a substituted or unsubstituted aromatic hydrocarbon ring of 6 to 30 carbon atoms for forming a ring, or a substituted or unsubstituted aromatic heterocycle of 2 to 30 carbon atoms for forming a ring, and/or may be combined with an adjacent group to form a ring, and Ar$_4$ and Ar$_5$ may each independently be a substituted or unsubstituted aryl group of 6 to 30 carbon atoms for forming a ring, or a substituted or unsubstituted heteroaryl group of 2 to 30 carbon atoms for forming a ring, and/or may be combined with an adjacent group to form a ring.

In an embodiment, the polycyclic compound represented by Formula 1 may be represented by Formula 1-1:

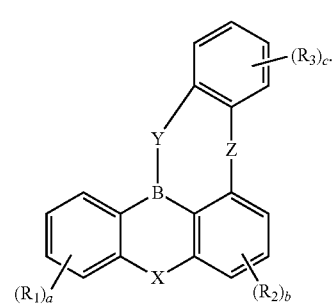

Formula 1-1

In Formula 1-1, $R_1$ to $R_3$ may each independently be a hydrogen atom, a deuterium atom, an oxygen atom, a boron atom, a cyano group, a substituted or unsubstituted amine group, a substituted or unsubstituted nitro group, a substituted or unsubstituted alkyl group of 1 to 20 carbon atoms, a substituted or unsubstituted alkoxy group of 1 to 20 carbon atoms, a substituted or unsubstituted aryl group of 6 to 30 carbon atoms for forming a ring, or a substituted or unsubstituted heteroaryl group of 2 to 30 carbon atoms for forming a ring, and/or may be combined with an adjacent group to form a ring, "a" and "c" may each independently be an integer of 0 to 4, b may be an integer of 0 to 3, and X, Y, Z, $Ar_4$, and $Ar_5$ may each independently be the same as defined in Formula 1.

In an embodiment, the polycyclic compound represented by Formula 1 may be represented by Formula 1-2:

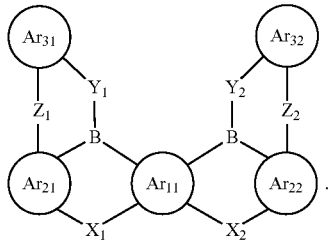

Formula 1-2

In Formula 1-2, $X_1$ and $X_2$ may each independently be *—O—* or *—$NAr_4$—*, $Y_1$ and $Y_2$ may each independently be *—O—* or *—S—*, $Z_1$ and $Z_2$ may each independently be a direct linkage, *—O—*, *—S—*, *—C(=O)—*, *—$SO_2$—*, or *—$NAr_5$—*, $Ar_{11}$, $Ar_{21}$, $Ar_{22}$, $Ar_{31}$, and $Ar_{32}$ may each independently be a substituted or unsubstituted aromatic hydrocarbon ring of 6 to 30 carbon atoms for forming a ring, or a substituted or unsubstituted aromatic heterocycle of 2 to 30 carbon atoms for forming a ring, and/or may be combined with an adjacent group to form a ring, and $Ar_4$ and $Ar_5$ may each independently be the same as defined in Formula 1.

In an embodiment, the polycyclic compound represented by Formula 1 may be represented by one of Formula 2-1 to Formula 2-3:

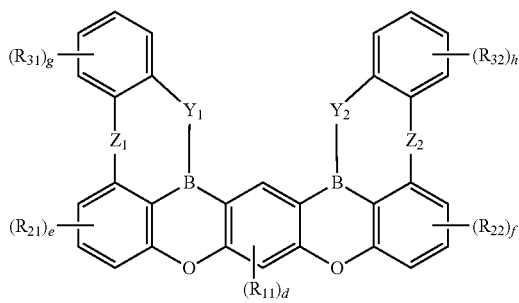

Formula 2-1

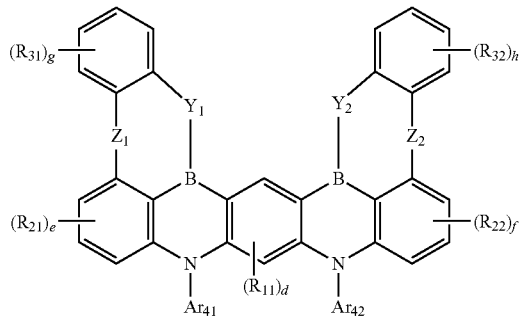

Formula 2-2

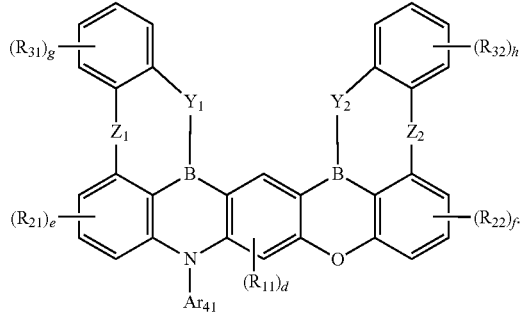

Formula 2-3

In Formula 2-1 to Formula 2-3, $Y_1$ and $Y_2$ may each independently be *—O—* or *—S—*, $Z_1$ and $Z_2$ may each independently be a direct linkage, *—O—*, *—S—*, *—C(=O)—*, *—$SO_2$—*, or *—$NAr_5$—*, $Ar_{41}$ and $Ar_{42}$ may each independently be a substituted or unsubstituted aryl group of 6 to 30 carbon atoms for forming a ring, or a substituted or unsubstituted heteroaryl group of 2 to 30 carbon atoms for forming a ring, and/or may be combined with an adjacent group to form a ring, $R_{11}$, $R_{21}$, $R_{22}$, $R_{31}$, and $R_{32}$ may each independently be a hydrogen atom, a deuterium atom, a cyano group, a substituted or unsubstituted amine group, a substituted or unsubstituted nitro group, a substituted or unsubstituted alkyl group of 1 to 20 carbon atoms, a substituted or unsubstituted alkoxy group of 1 to 20 carbon atoms, a substituted or unsubstituted aryl group of 6 to 30 carbon atoms for forming a ring, or a substituted or unsubstituted heteroaryl group of 2 to 30 carbon atoms for forming a ring, and/or may be combined with an adjacent group to form a ring, "d" may be an integer of 0 to 2, "e" and "f" may each independently be an integer of 0 to 3, "g" and "h" may each independently be an integer of 0 to 4, and $Ar_5$ may be the same as defined in Formula 1.

In an embodiment, the polycyclic compound represented by Formula 1 may be represented by one of Formula 3-1 to Formula 3-3:

Formula 3-1

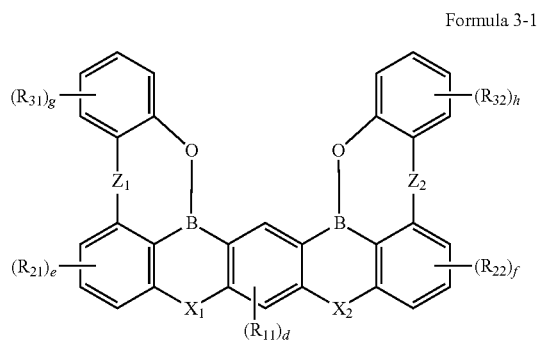

Formula 3-2

Formula 3-3

Formula 4-1

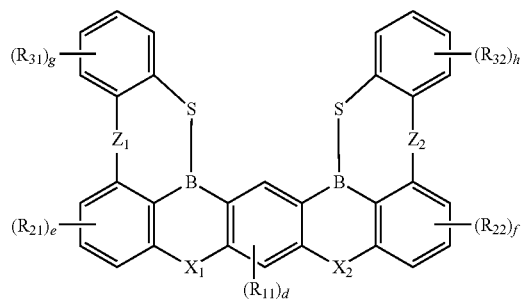

Formula 4-2

Formula 4-3

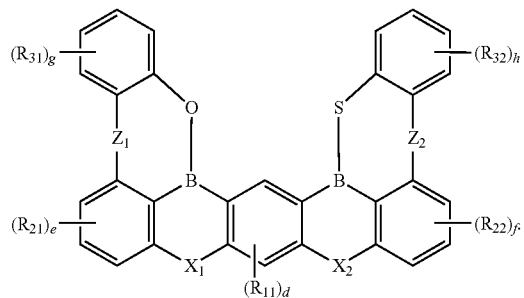

In Formula 3-1 to Formula 3-3, $X_1$ and $X_2$ may each independently be *—O—* or *—$NAr_4$—*, $Z_1$ and $Z_2$ may each independently be a direct linkage, *—O—*, *—S—*, *—C(=O)—*, *—$SO_2$—*, or *—$NAr_5$—*, $R_{11}$, $R_{21}$, $R_{22}$, $R_{31}$, and $R_{32}$ may each independently be a hydrogen atom, a deuterium atom, a cyano group, a substituted or unsubstituted amine group, a substituted or unsubstituted nitro group, a substituted or unsubstituted alkyl group of 1 to 20 carbon atoms, a substituted or unsubstituted alkoxy group of 1 to 20 carbon atoms, a substituted or unsubstituted aryl group of 6 to 30 carbon atoms for forming a ring, or a substituted or unsubstituted heteroaryl group of 2 to 30 carbon atoms for forming a ring, and/or may be combined with an adjacent group to form a ring, "d" may be an integer of 0 to 2, "e" and "f" may each independently be an integer of 0 to 3, "g" and "h" may each independently be an integer of 0 to 4, and $Ar_4$ and $Ar_5$ may each independently be the same as defined in Formula 1.

In an embodiment, the polycyclic compound represented by Formula 1 may be re resented by one of Formula 4-1 to Formula 4-3:

In Formula 4-1 to Formula 4-3, $X_1$ and $X_2$ may each independently be —O—* or *—$NAr_4$—*, $Y_1$ and $Y_2$ may each independently be *—O—* or *—S—*, $Ar_{51}$ and $Ar_{52}$ may each independently be a substituted or unsubstituted aryl group of 6 to 30 carbon atoms for forming a ring, or a substituted or unsubstituted heteroaryl group of 2 to 30 carbon atoms for forming a ring, and/or may be combined with an adjacent group to form a ring, $R_{11}$, $R_{21}$, $R_{22}$, $R_{31}$, and $R_{32}$ may each independently be a hydrogen atom, a deuterium atom, a cyano group, a substituted or unsubstituted amine group, a substituted or unsubstituted nitro group, a substituted or unsubstituted alkyl group of 1 to 20 carbon atoms, a substituted or unsubstituted alkoxy group of 1 to 20 carbon atoms, a substituted or unsubstituted aryl group of 6 to 30 carbon atoms for forming a ring, or a substituted or unsubstituted heteroaryl group of 2 to 30 carbon atoms for forming a ring, and may be combined with an adjacent group to form a ring, "d" may be an integer of 0 to 2, "e" and "f" may each independently be an integer of 0 to 3, "g" and "h" may each independently be an integer of 0 to 4, and $Ar_4$ may be the same as defined in Formula 1.

In an embodiment, the polycyclic compound represented by Formula 1 may be at least one selected among the compounds represented in Compound Group A to Compound Group F:

Compound Group A
A-1
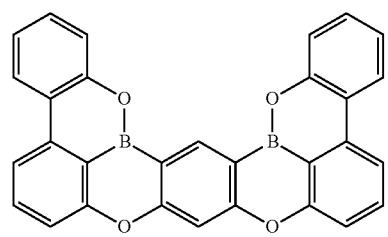
A-2
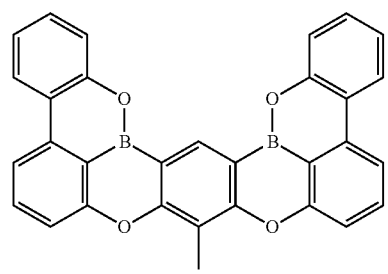
A-3
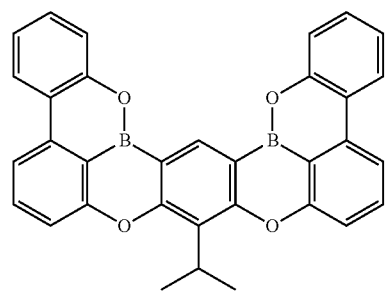
A-4
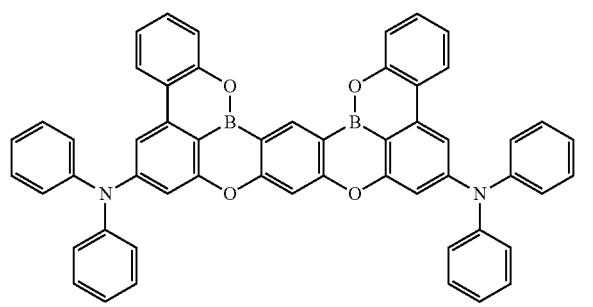
A-5
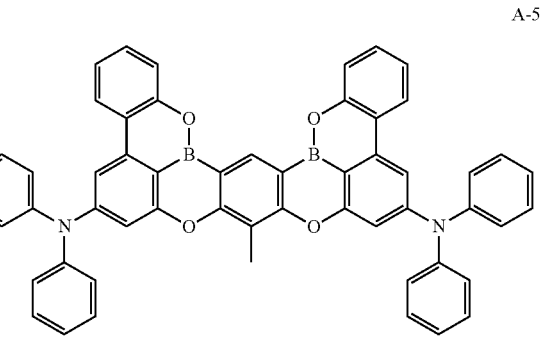
A-6
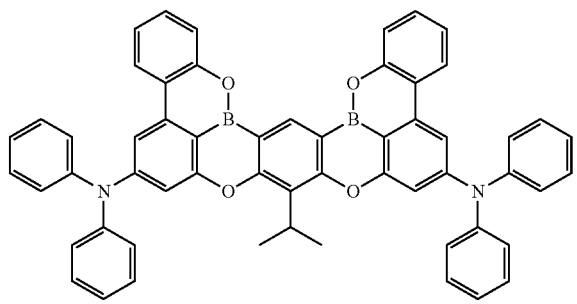
A-7
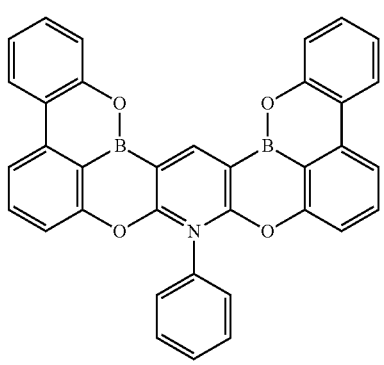
A-8
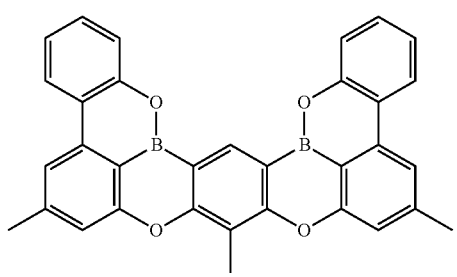
A-9
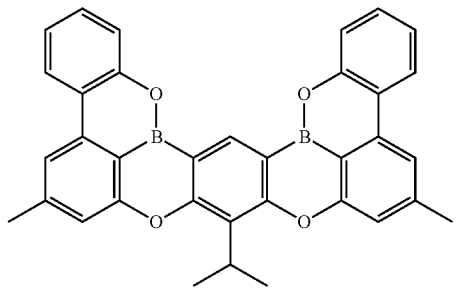
A-10
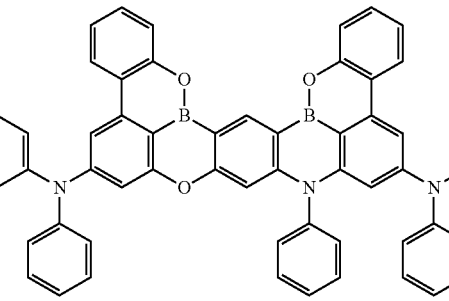

A-11
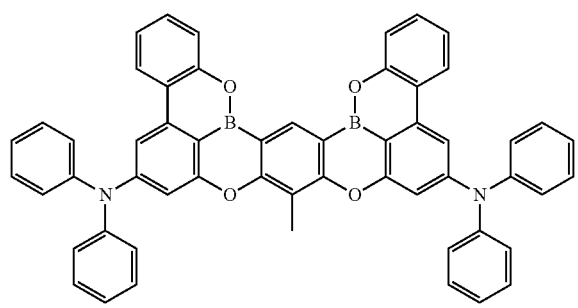
A-12
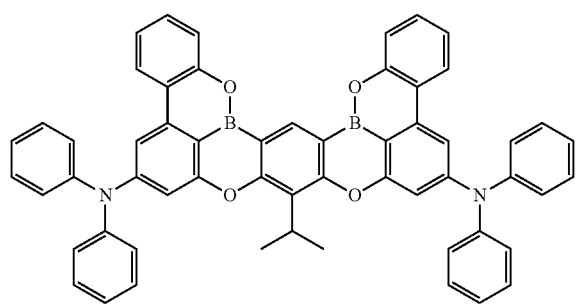
A-13
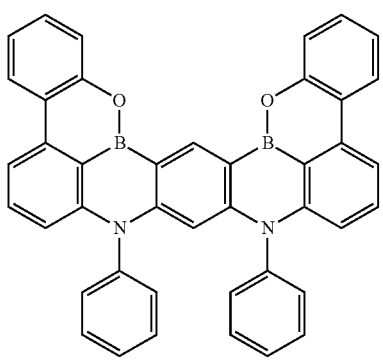
A-14
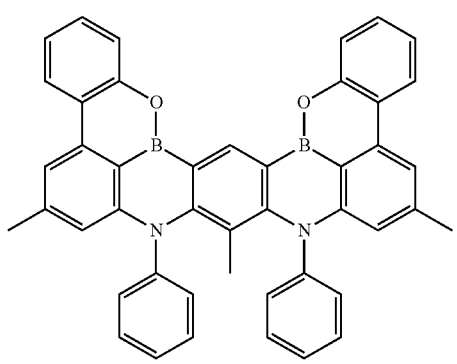
A-15
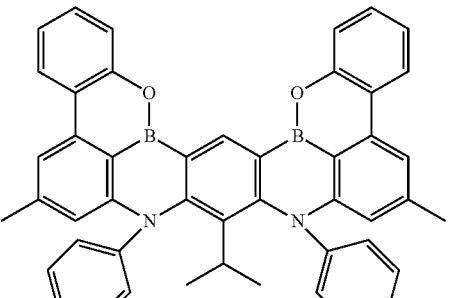
A-16
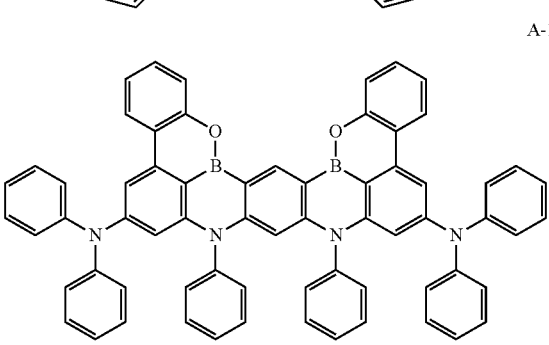
A-17
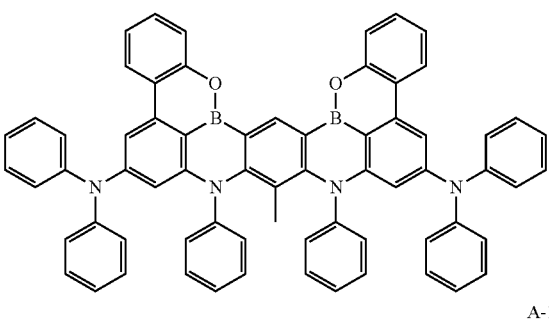
A-18
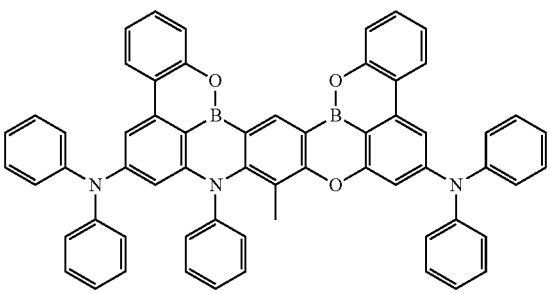
A-19
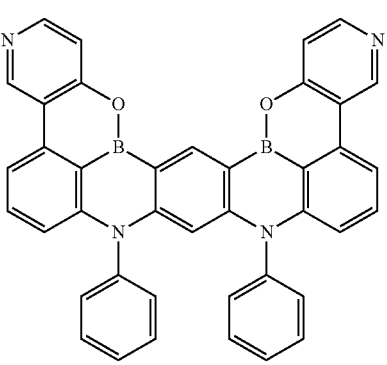

A-20
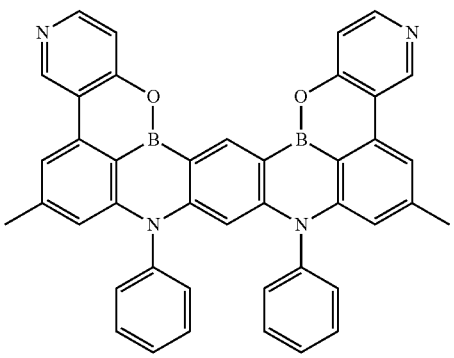
A-21
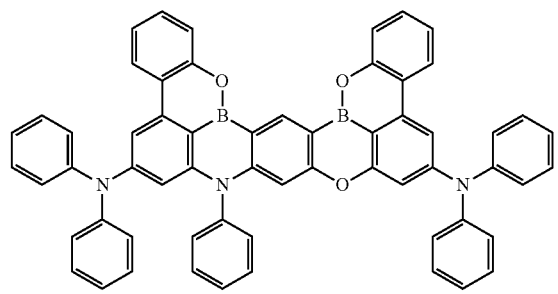
A-22
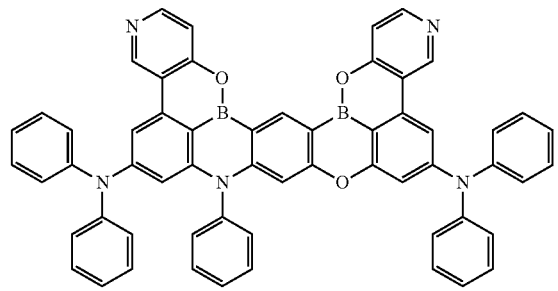
A-23
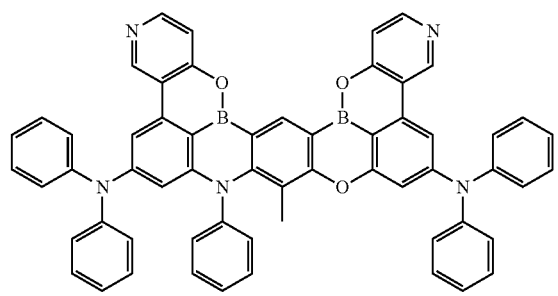
Compound Group B
B-1
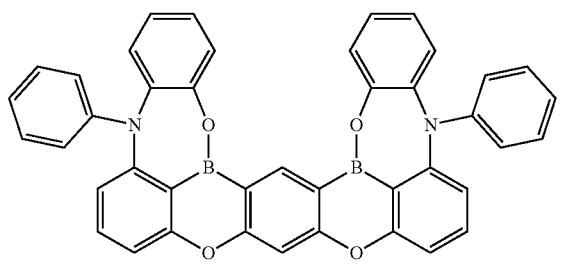
B-2
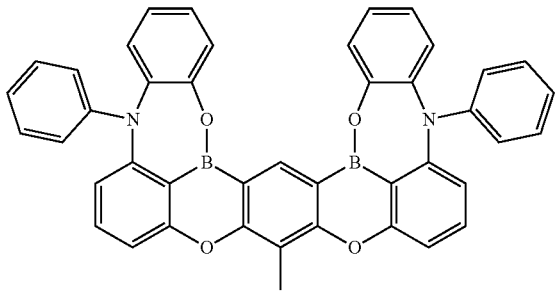
B-3
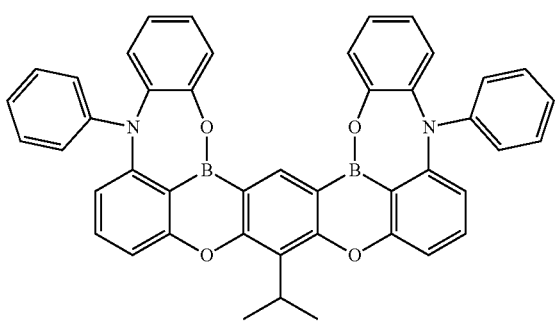
B-4
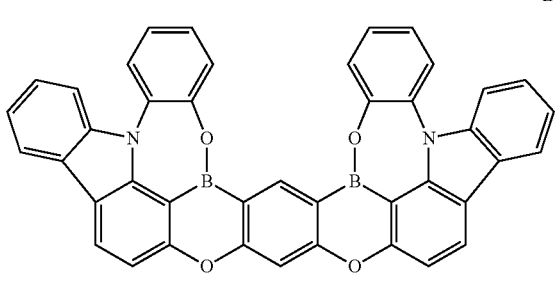
B-5
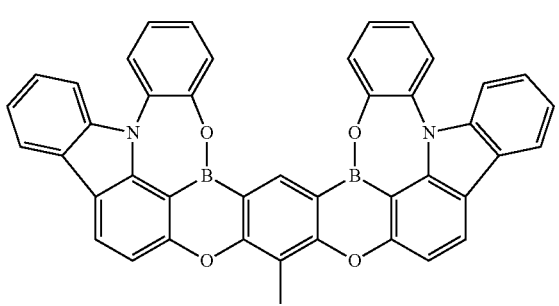
B-6
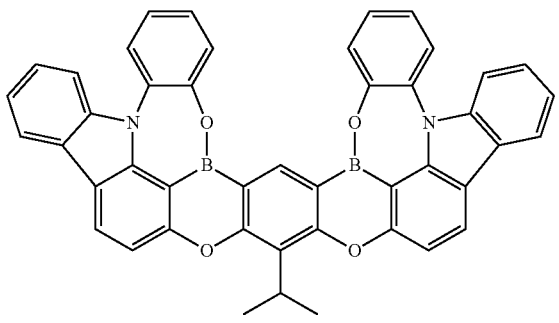

-continued
B-7
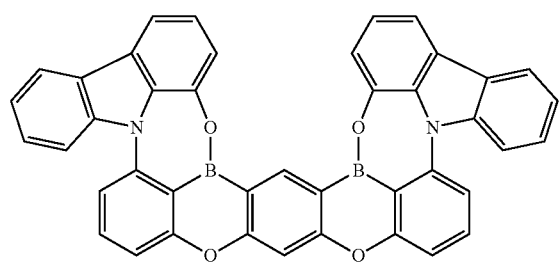
B-8
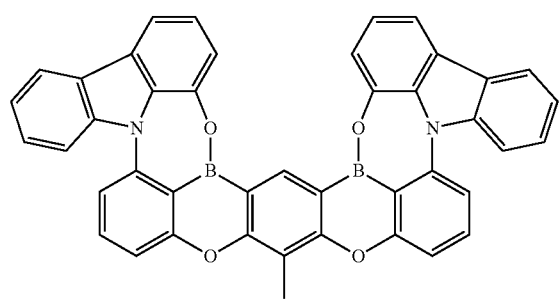
B-9
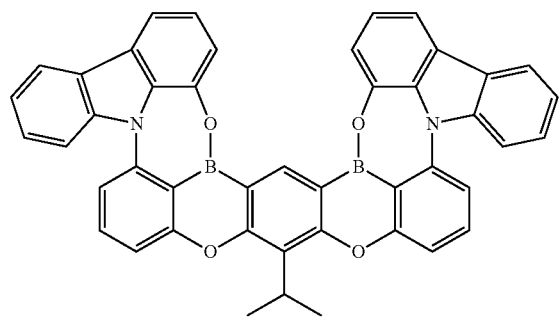
B-10
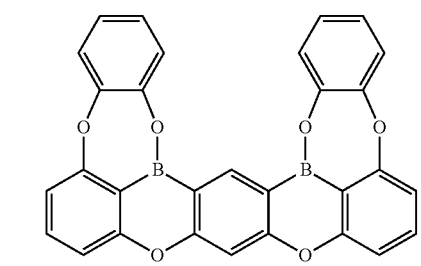
B-11
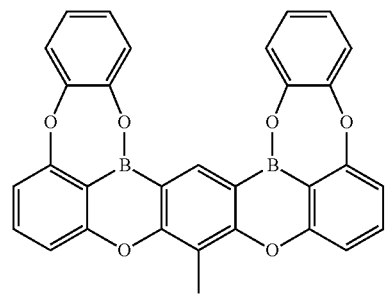
-continued
B-12
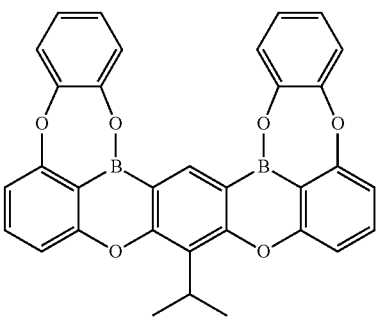
B-13
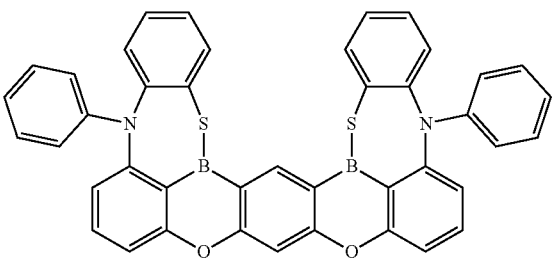
B-14
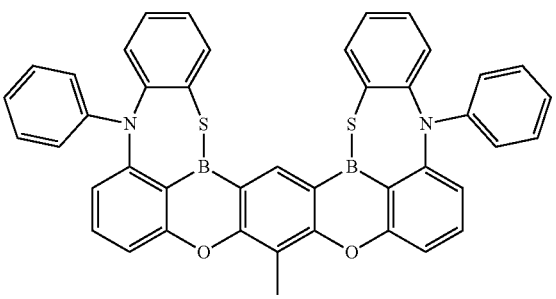
B-15
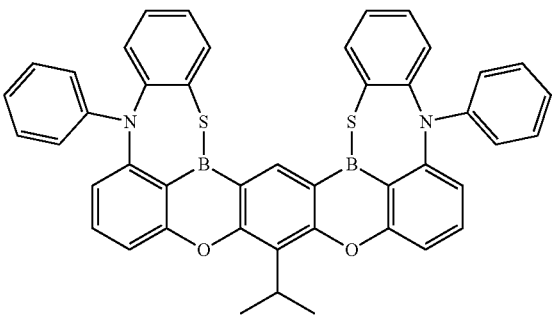
B-16
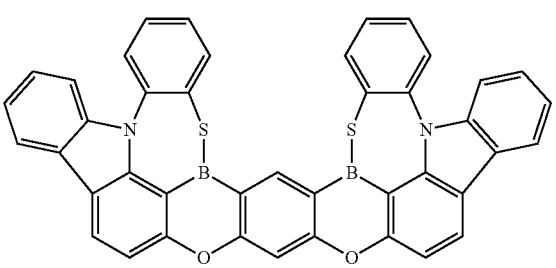

B-17
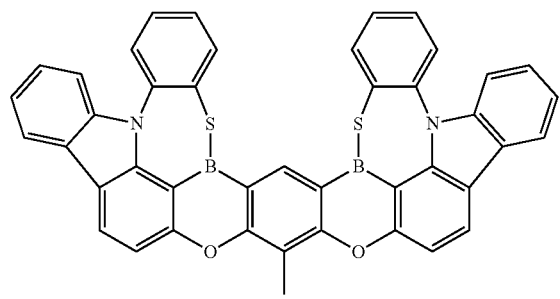
B-18
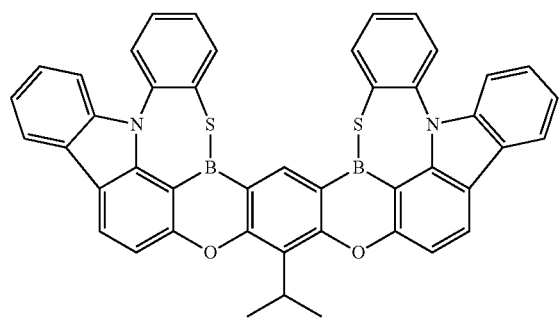
B-19
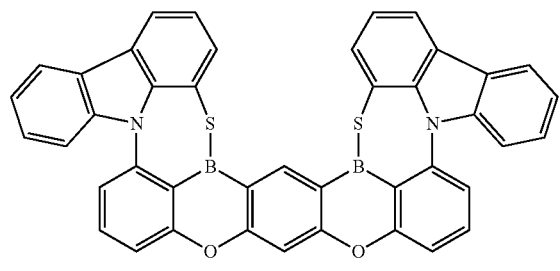
B-20
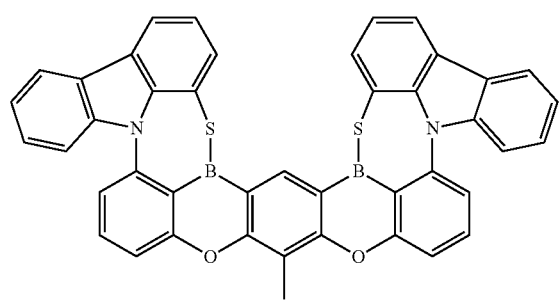
B-21
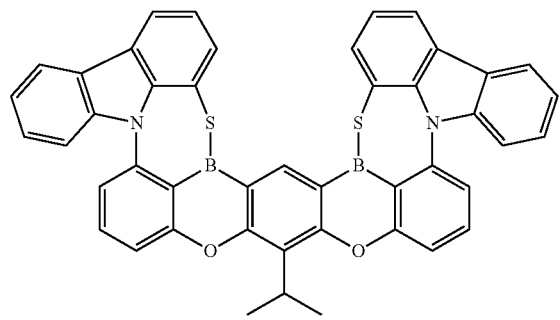
B-22
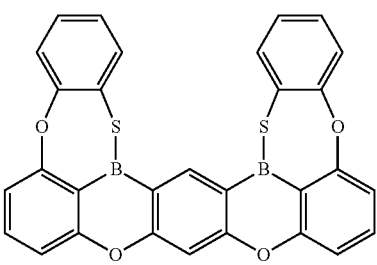
B-23
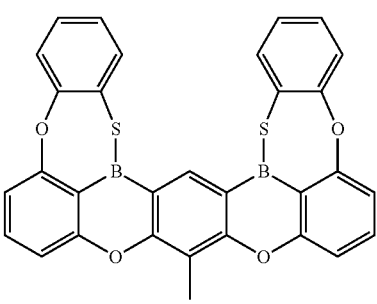
B-24
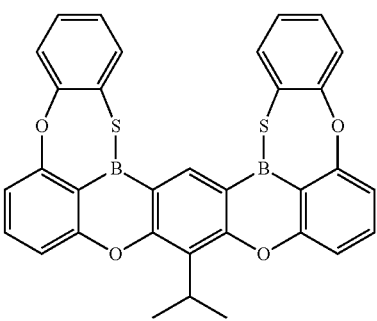
B-25
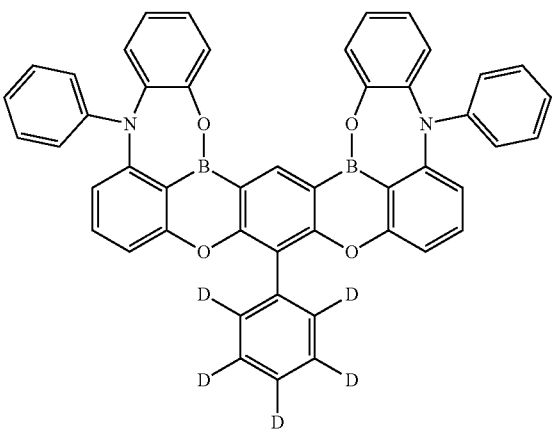

Compound Group C
C-1
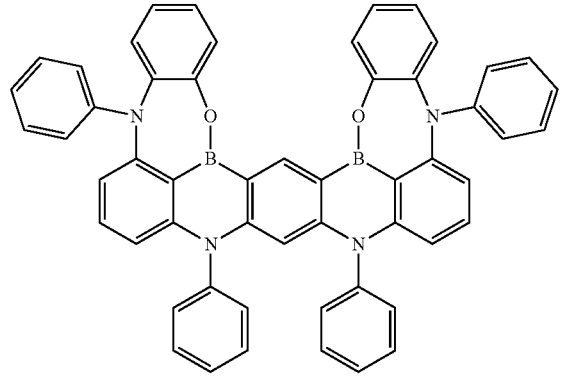
C-5
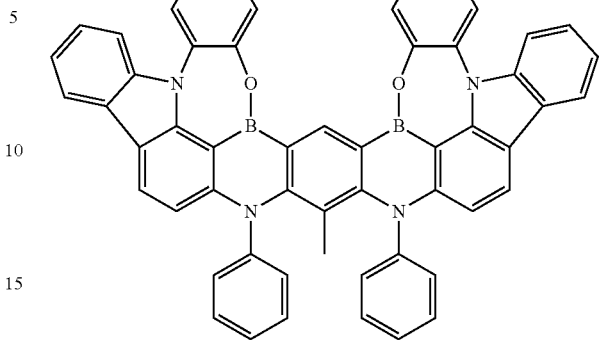
C-2
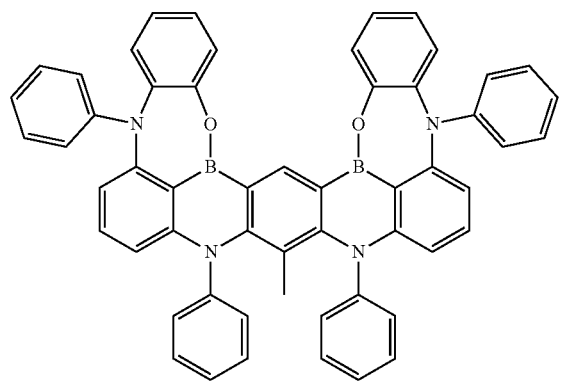
C-6
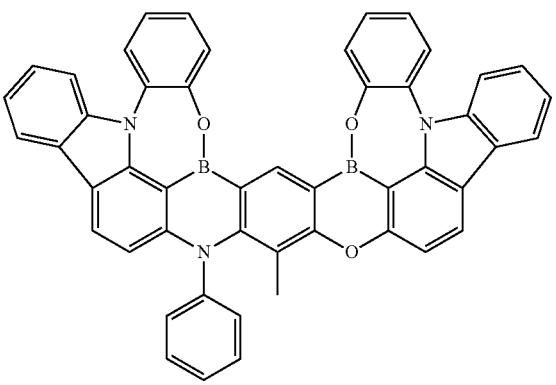
C-3
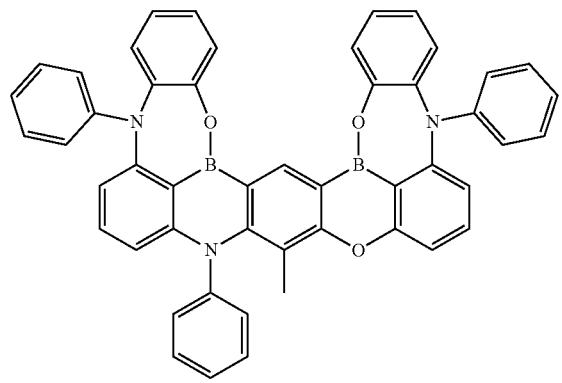
C-7
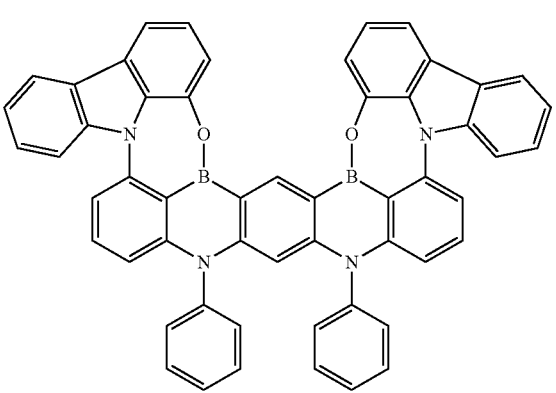
C-4
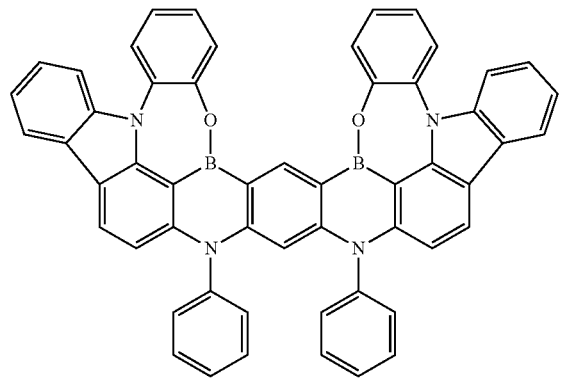
C-8
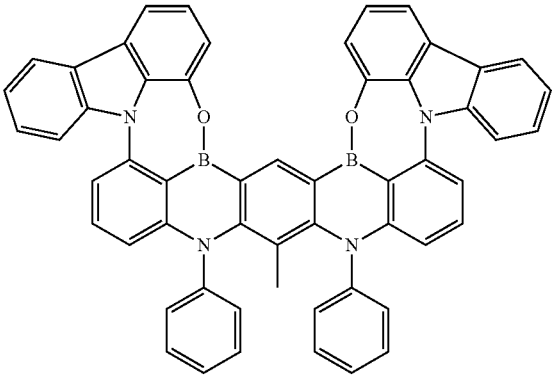

-continued
C-9
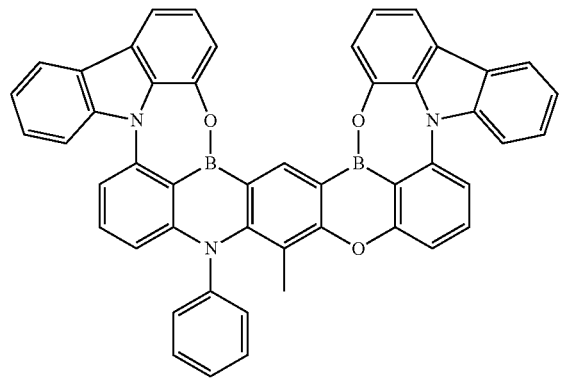
C-10
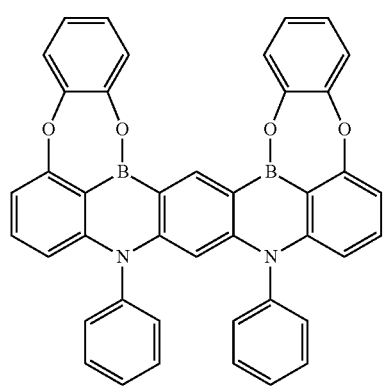
C-11
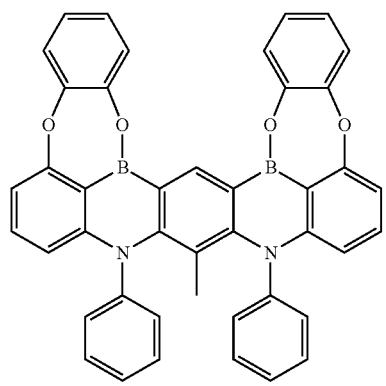
C-12
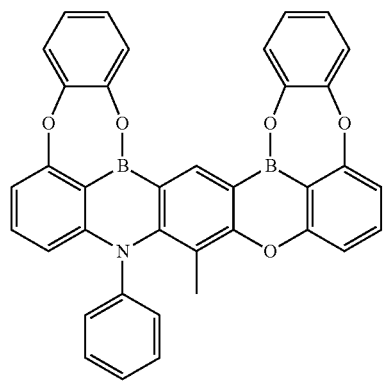
-continued
C-13
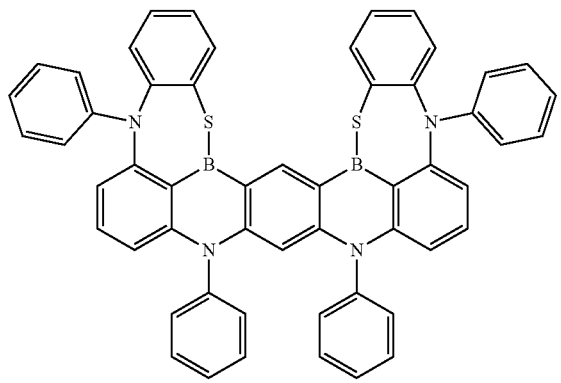
C-14
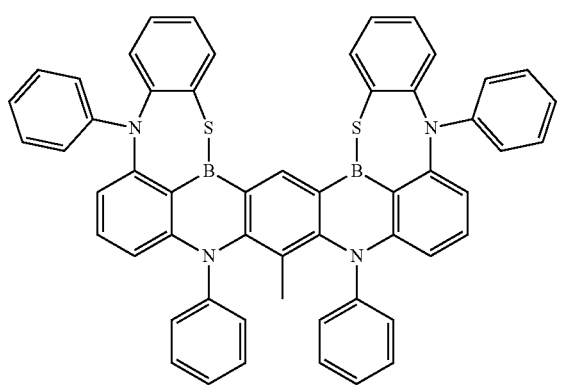
C-15
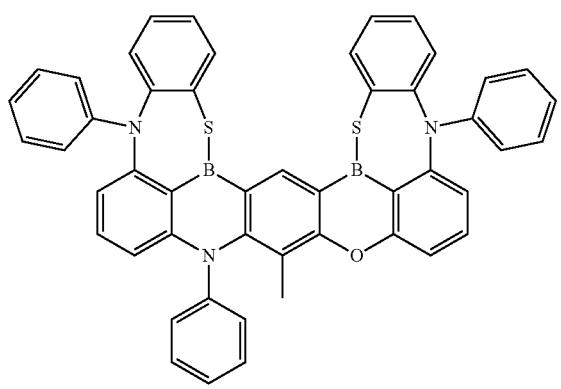
C-16
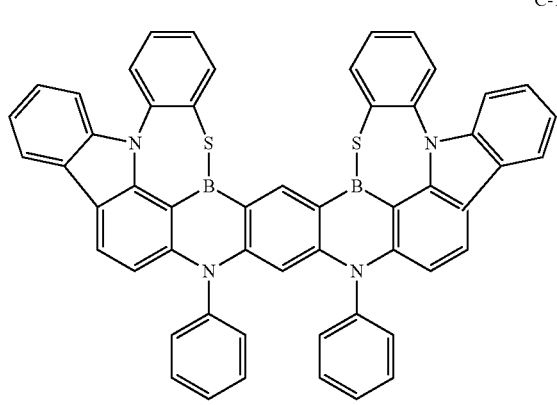

C-17
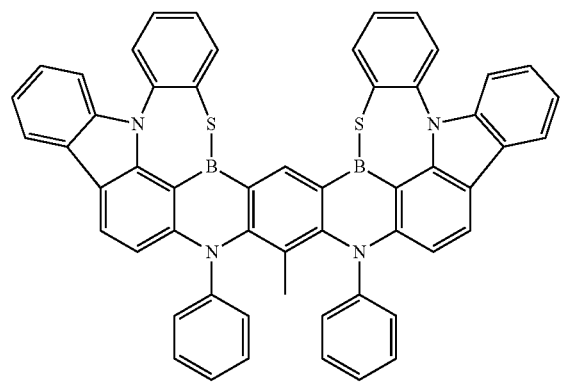
C-21
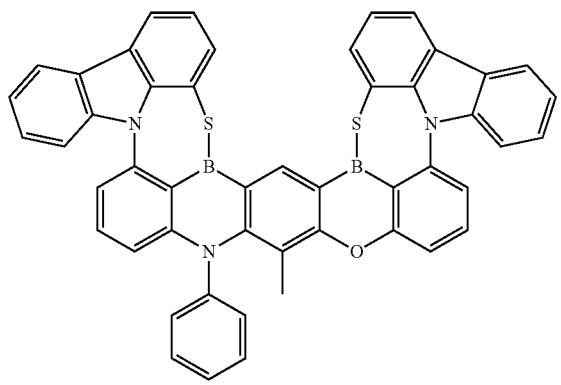
C-18
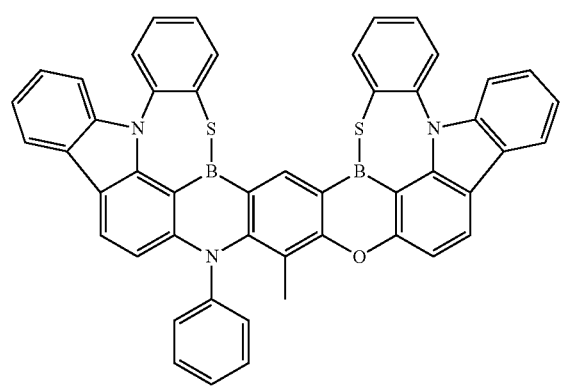
C-22
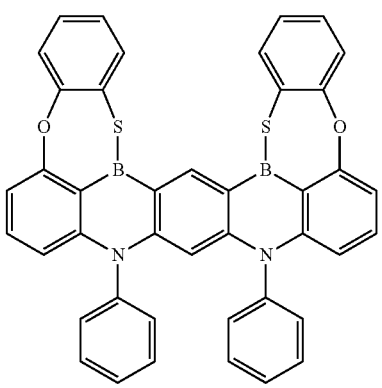
C-19
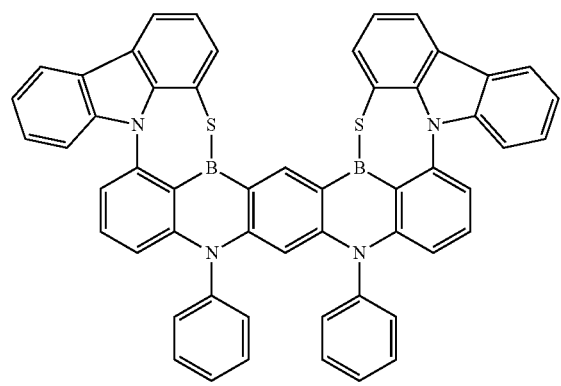
C-23
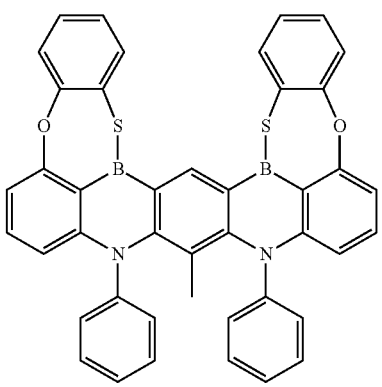
C-20
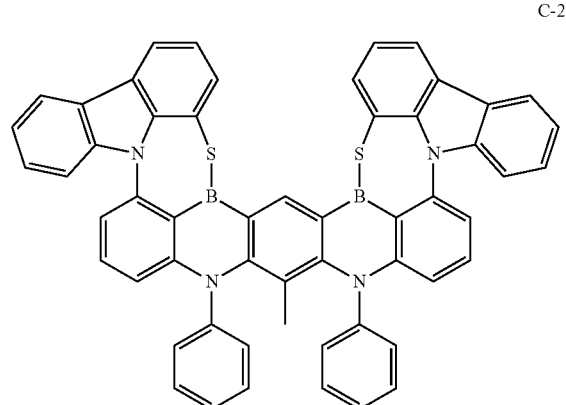
C-24
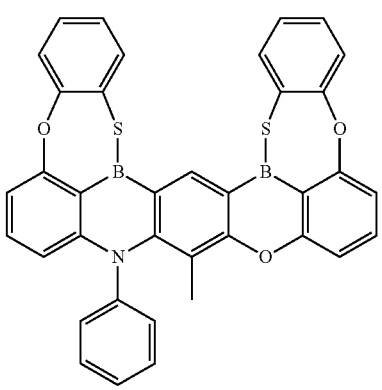

Compound Group D
D-1
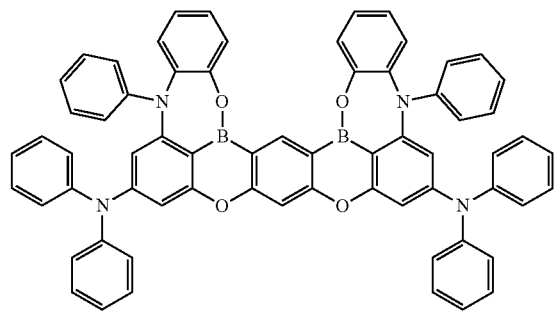
D-2
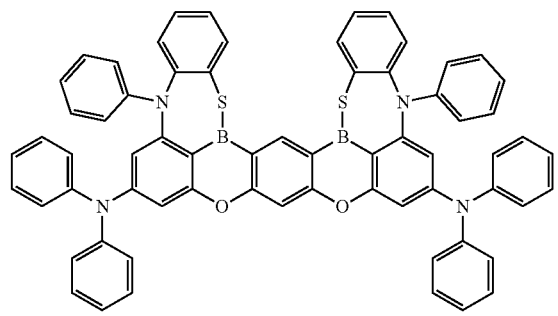
D-3
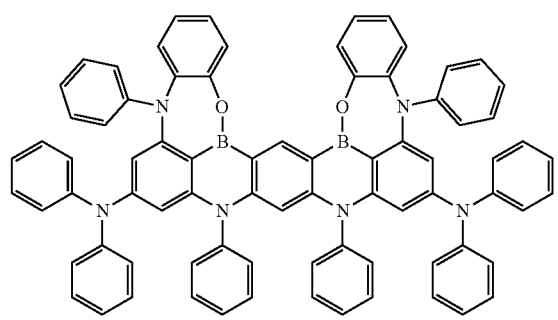
D-4
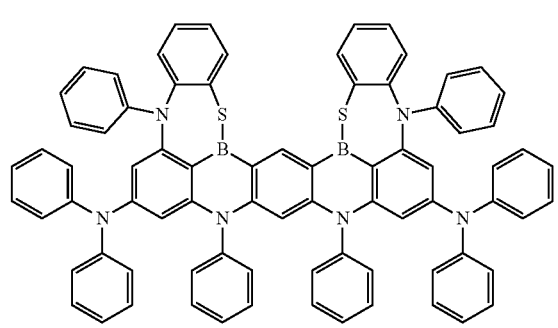
D-5
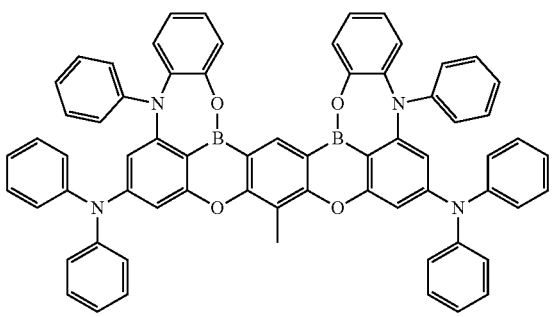
D-6
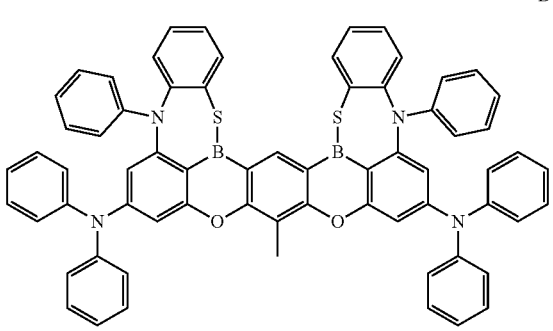
D-7
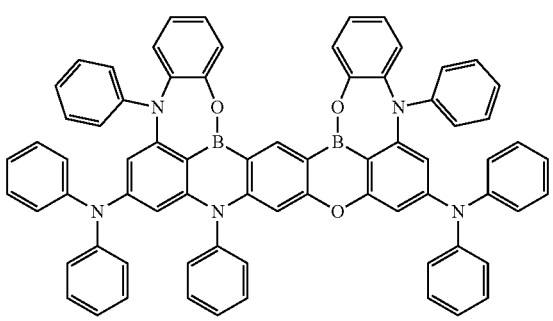
D-8
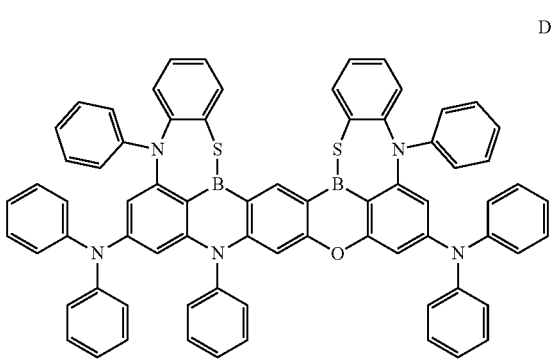

-continued
D-9
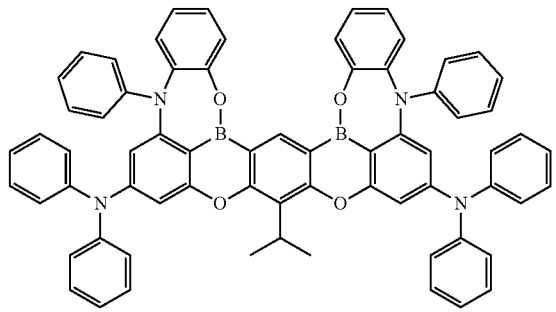
D-10
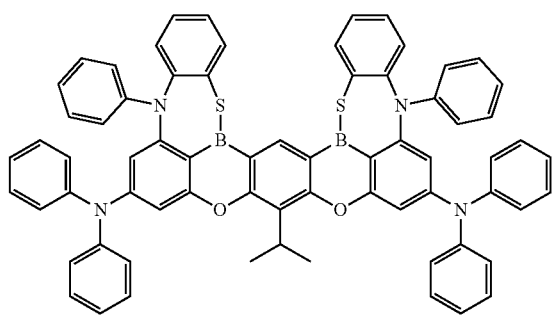
D-11
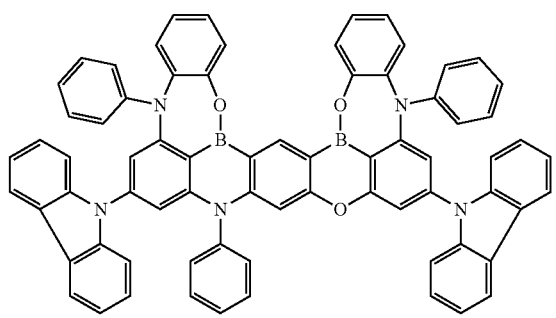
D-12
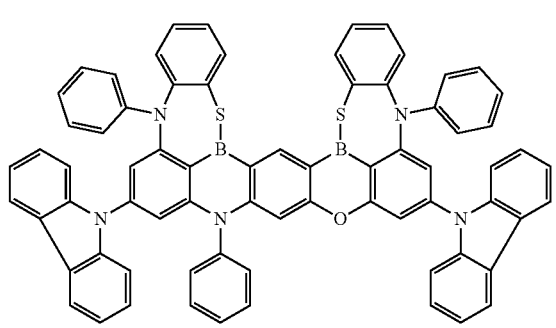
-continued
D-13
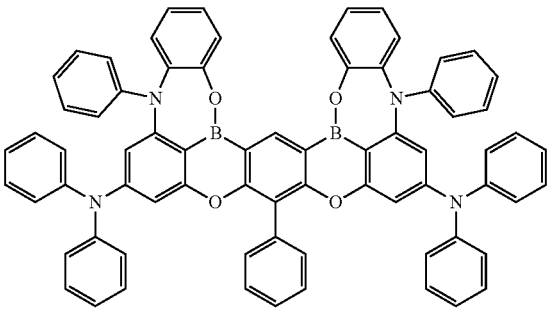
D-14
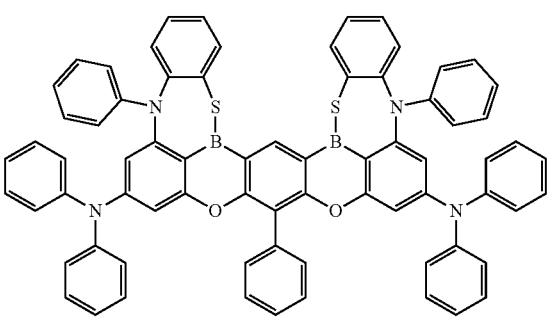
D-15
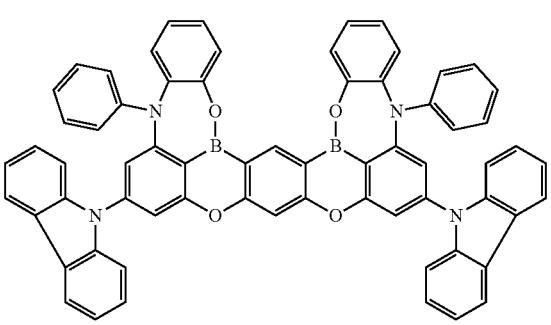
D-16
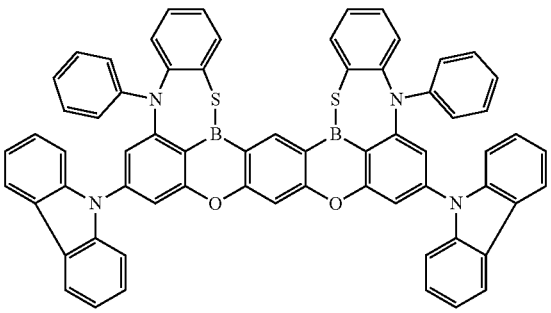
Compound Group E
E-1
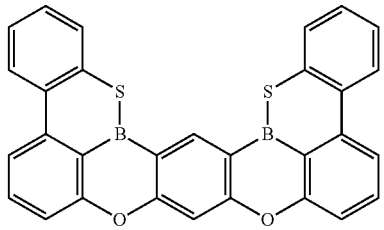

-continued
E-2
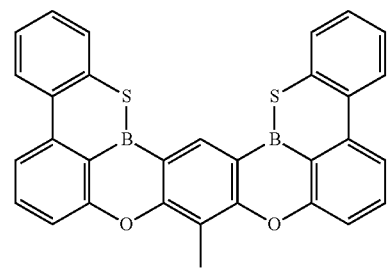
E-3
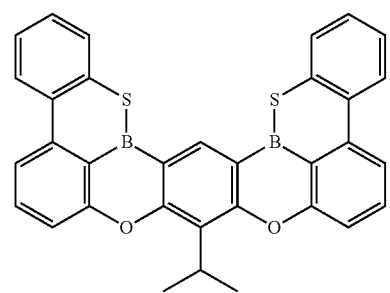
E-4
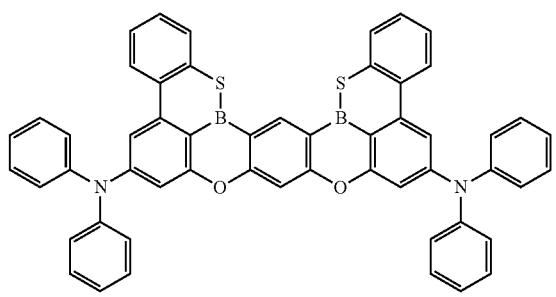
E-5
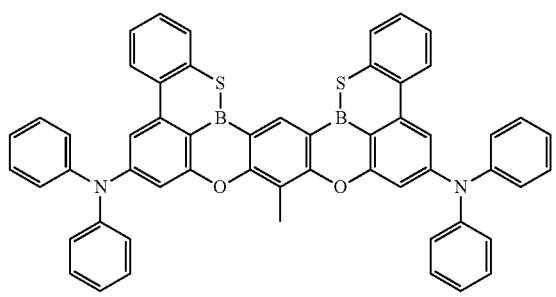
E-6
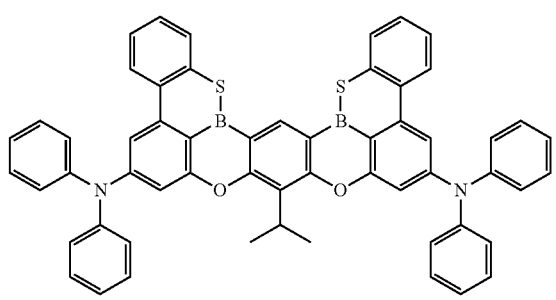
-continued
E-7
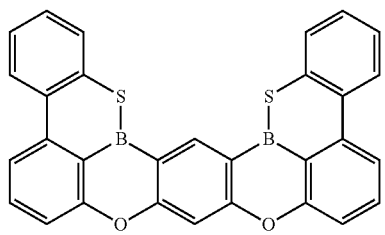
E-8
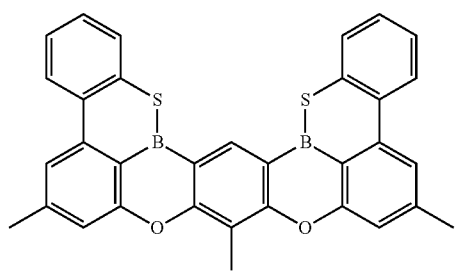
E-9
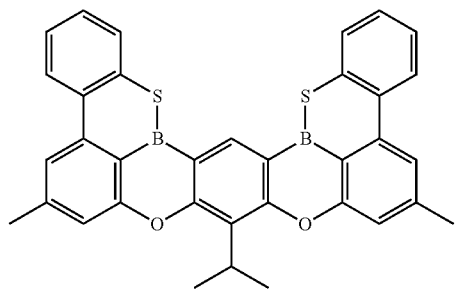
E-10
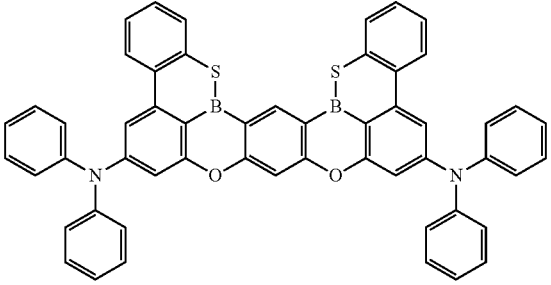
E-11
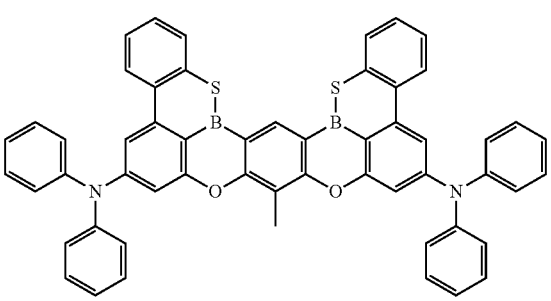

-continued
E-12
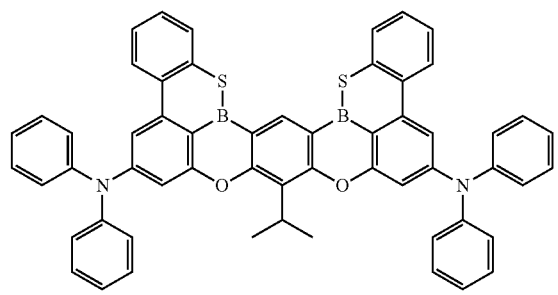
E-13
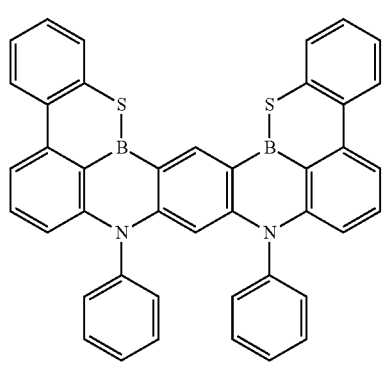
E-14
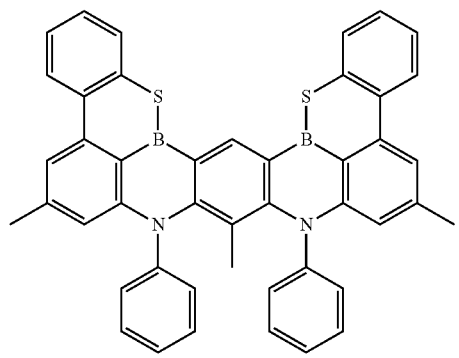
E-15
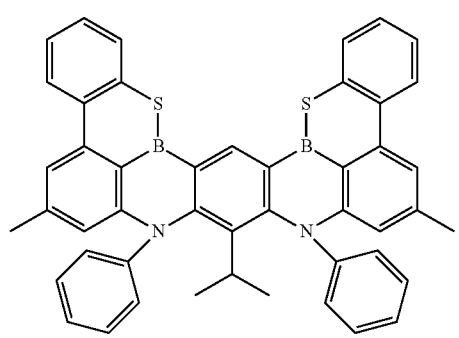
-continued
E-16
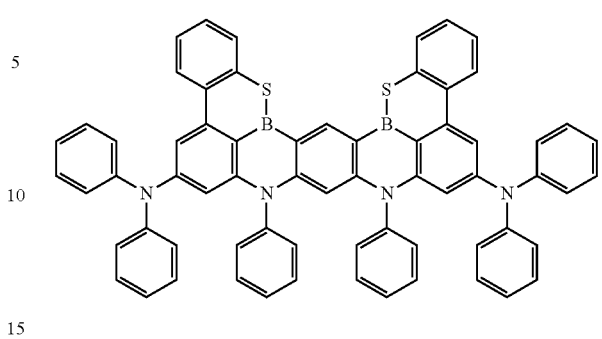
E-17
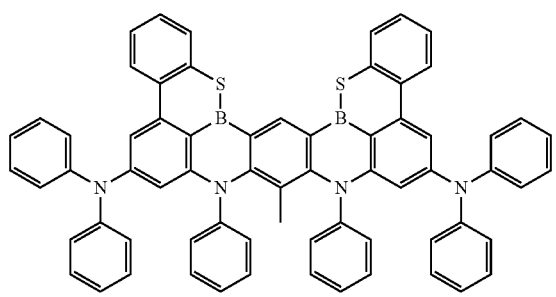
E-18
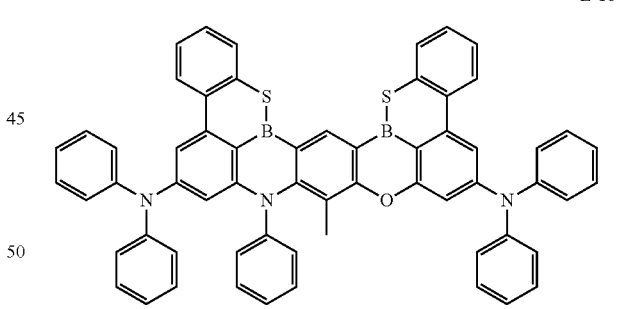
E-19
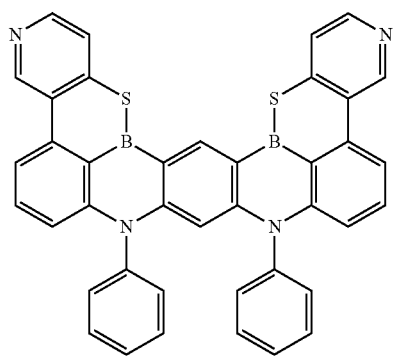

E-20
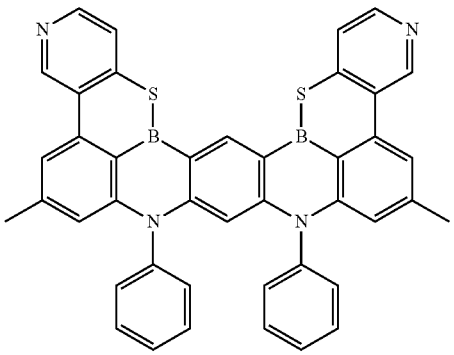
E-21
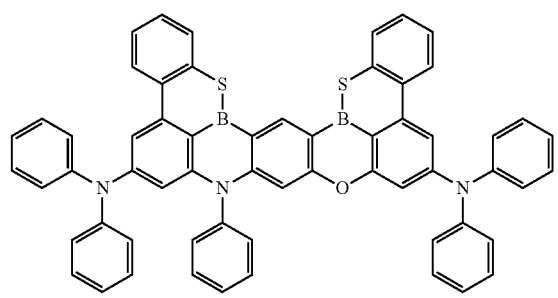
E-22
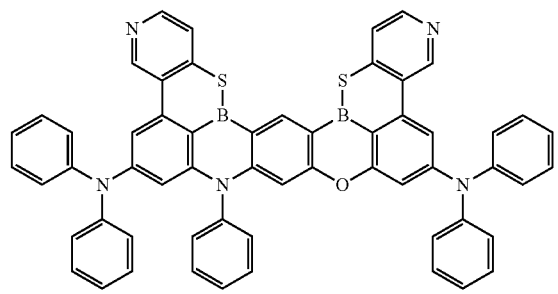
E-23
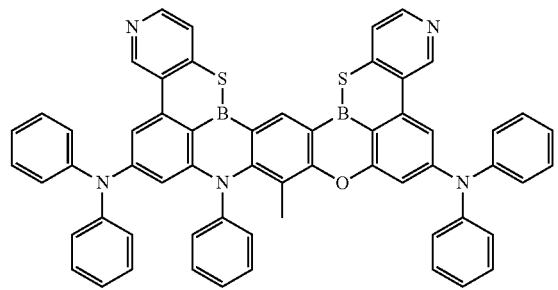
Compound Group F
F-1
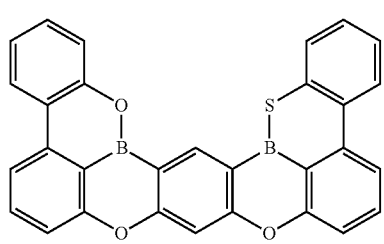
F-2
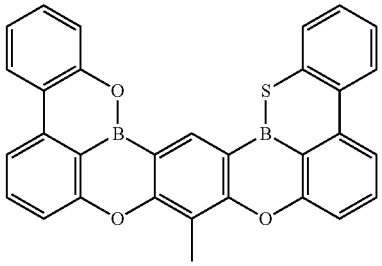
F-3
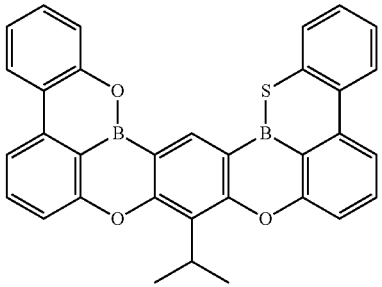
F-4
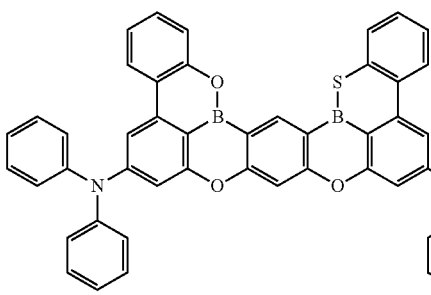
F-5
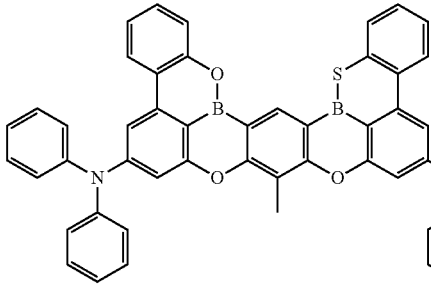
F-6
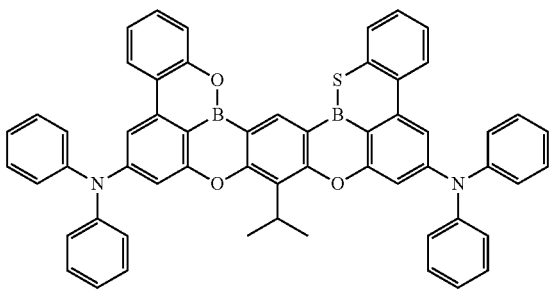

F-7
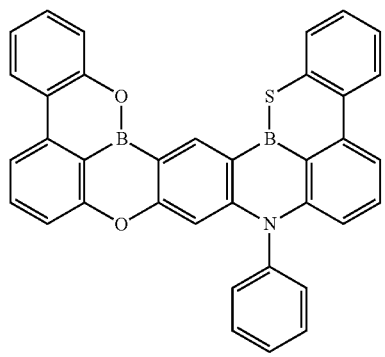
F-8
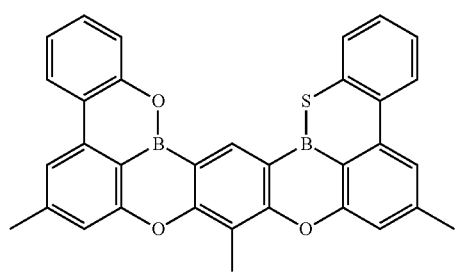
F-9
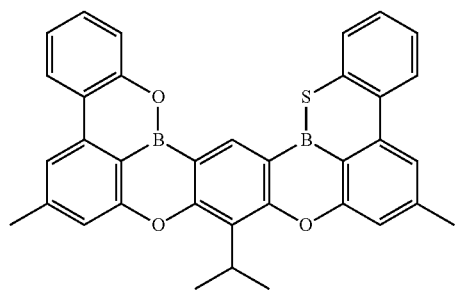
F-10
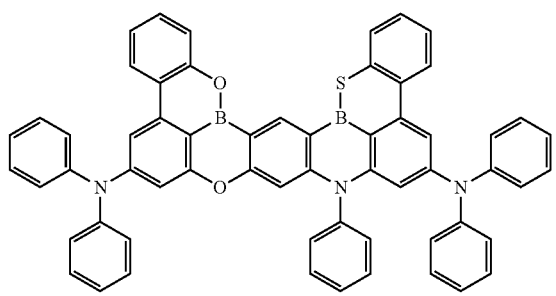
F-11
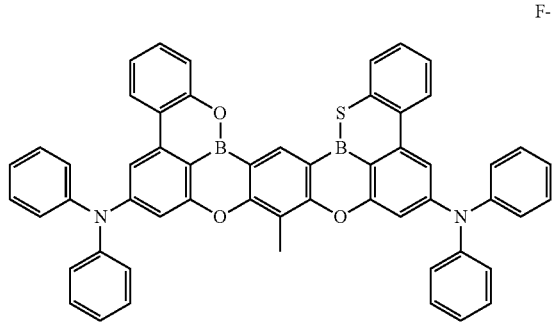
F-12
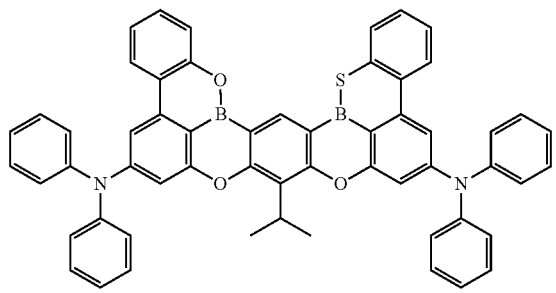
F-13
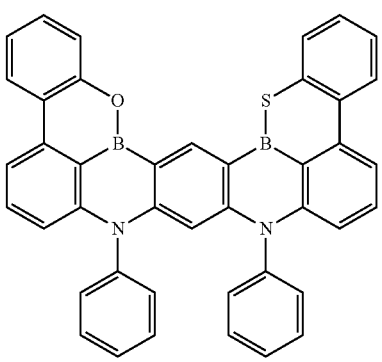
F-14
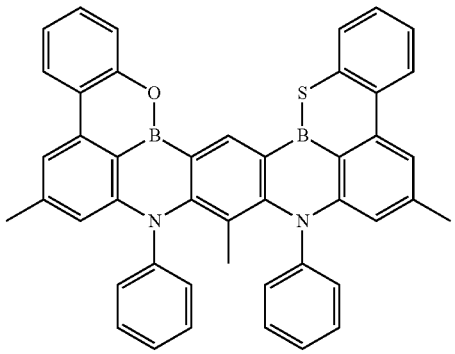
F-15
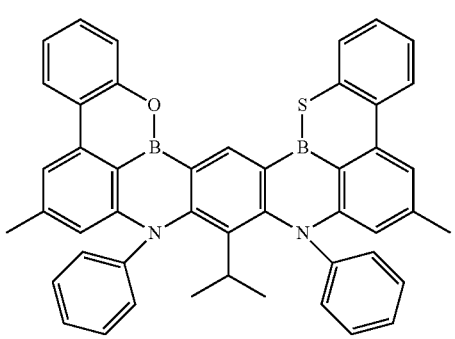

-continued

F-16
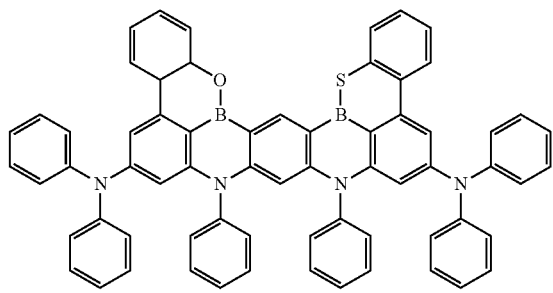

F-17
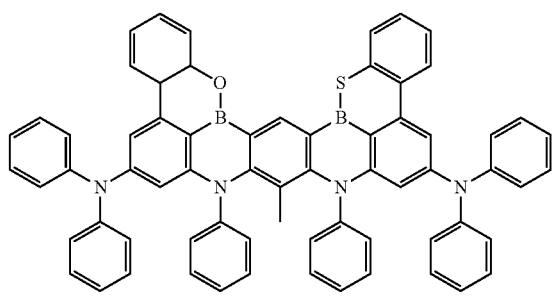

F-18
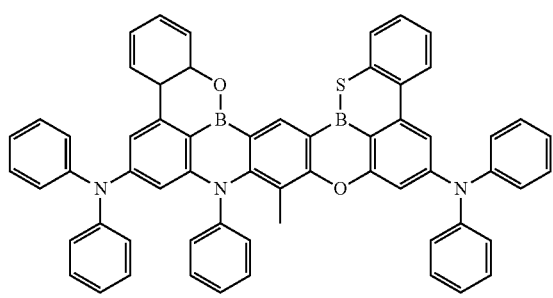

F-19
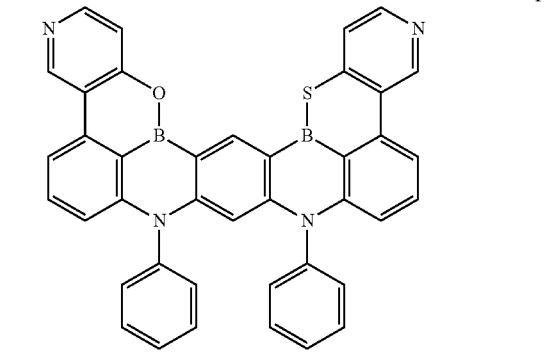

F-20
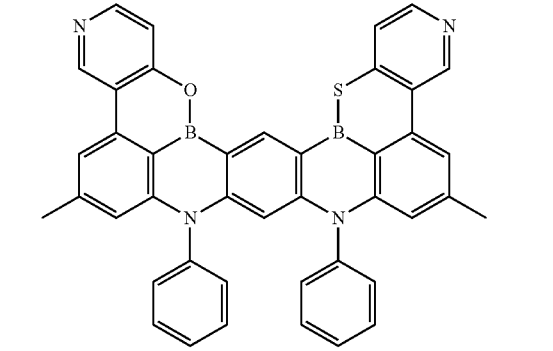

-continued

F-21
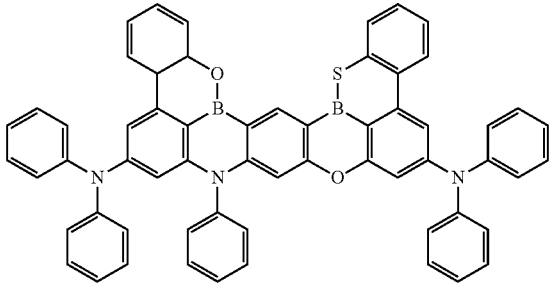

F-22
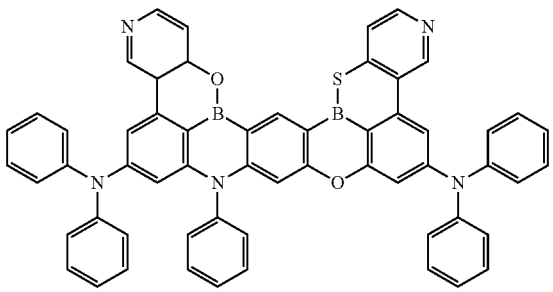

F-23
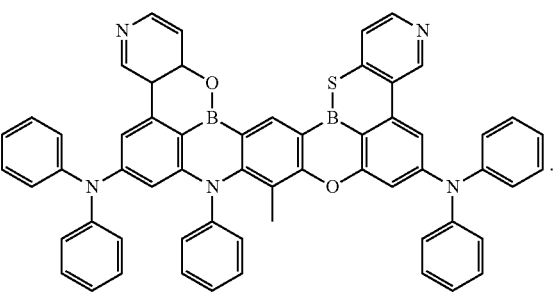

BRIEF DESCRIPTION OF THE DRAWINGS

The accompanying drawings are included to provide a further understanding of the present disclosure and are incorporated in and constitute a part of this specification. The drawings illustrate example embodiments of the present disclosure and, together with the description, serve to explain principles of the present disclosure.

In the drawings.

DETAILED DESCRIPTION

Figure 1:
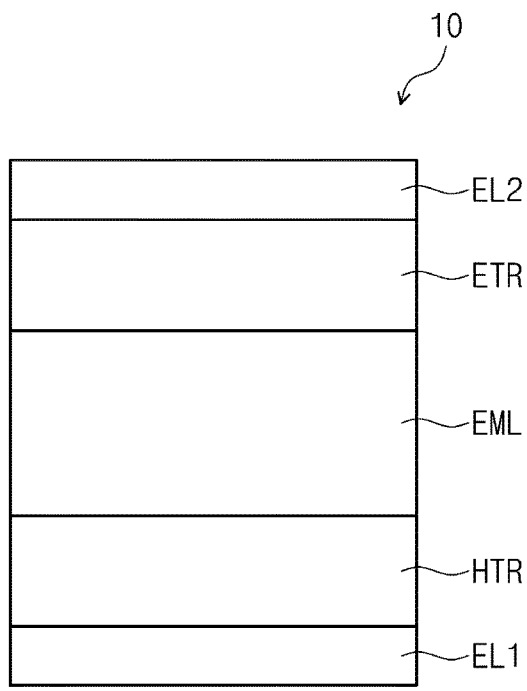
FIG. 1 is a schematic cross-sectional view illustrating an organic electroluminescence device according to an embodiment of the present disclosure.

The present disclosure may have various modifications and may be embodied in different forms, and example embodiments will be explained in detail with reference to the accompany drawings. The present disclosure may, however, be embodied in different forms and should not be construed as being limited to the embodiments set forth herein. Rather, all modifications, equivalents, and substitutions that are included in the spirit and technical scope of the present disclosure should also be included in the present disclosure.

It will be understood that when an element (or region, layer, part, etc.) is referred to as being "on," "connected to," or "coupled to" another element, it can be directly on, connected or coupled to the other element, or intervening elements may be present.

Like reference numerals refer to like elements throughout, and duplicative descriptions thereof may not be provided. In the drawings, thicknesses, ratios, and dimensions of constituent elements may be exaggerated for effective explanation of technical contents.

The term "and/or" includes any and all combinations of one or more of the associated listed items.

It will be understood that, although the terms "first," "second," etc. may be used herein to describe various elements, these elements should not be limited by these terms. These terms are only used to distinguish one element from another element. Thus, a first element could alternatively be termed a second element without departing from the teachings of the present disclosure. Similarly, a second element could alternatively be termed a first element. As used herein, the singular forms are intended to include the plural forms as well, unless the context clearly indicates otherwise.

In addition, the terms "below," "beneath," "on," and "above" are used for explaining the relation of elements shown in the drawings. The terms are relative concept and are used based on the direction shown in the drawing.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be further understood that the terms "includes," "including," "comprises," and/or "comprising," when used in this specification, specify the presence of stated features, numerals, steps, operations, elements, parts, or the combination thereof, but do not preclude the presence or addition of one or more other features, numerals, steps, operations, elements, parts, or the combination thereof.

As used herein, expressions such as "at least one of", "one of", and "selected from", when preceding a list of elements, modify the entire list of elements and do not modify the individual elements of the list. Further, the use of "may" when describing embodiments of the present disclosure refers to "one or more embodiments of the present disclosure".

Hereinafter, the organic electroluminescence device according to an embodiment of the present disclosure will be explained with reference to the attached drawings.

FIG. 1 to FIG. 4 are schematic cross-sectional views of organic electroluminescence devices according to example embodiments of the present disclosure. Referring to FIG. 1 to FIG. 4, in an organic electroluminescence device 10 according to an embodiment, a first electrode EL1 and a second electrode EL2 are oppositely disposed, and between the first electrode EL1 and the second electrode EL2, an emission layer EML may be disposed.

In addition, the organic electroluminescence device 10 of an embodiment further includes a plurality of organic layers between the first electrode EL1 and the second electrode EL2 in addition to the emission layer EML. The plurality of the organic layers may include a hole transport region HTR and an electron transport region ETR. For example, the organic electroluminescence device 10 of an embodiment may include a first electrode EL1, a hole transport region HTR, an emission layer EML, an electron transport region ETR, and a second electrode EL2, stacked one by one. In some embodiments, the organic electroluminescence device 10 of an embodiment may include a capping layer CPL disposed on the second electrode EL2.

The organic electroluminescence device 10 of an embodiment may include a polycyclic compound of an embodiment, which will be explained later, in the plurality of organic layers disposed between the first electrode EL1 and the second electrode EL2.

For example, a polycyclic compound of an embodiment may be included in the emission layer EML and/or the electron transport region ETR. However, an embodiment of the present disclosure is not limited thereto, and the organic electroluminescence device 10 of an embodiment may include a polycyclic compound of an embodiment in the hole transport region HTR (which is among the plurality of organic layers disposed between the first electrode EL1 and the second electrode EL2) in addition to the emission layer EML and the electron transport region ETR, or may include a polycyclic compound of an embodiment in a capping layer CPL disposed on the second electrode EL2.

Figure 2:
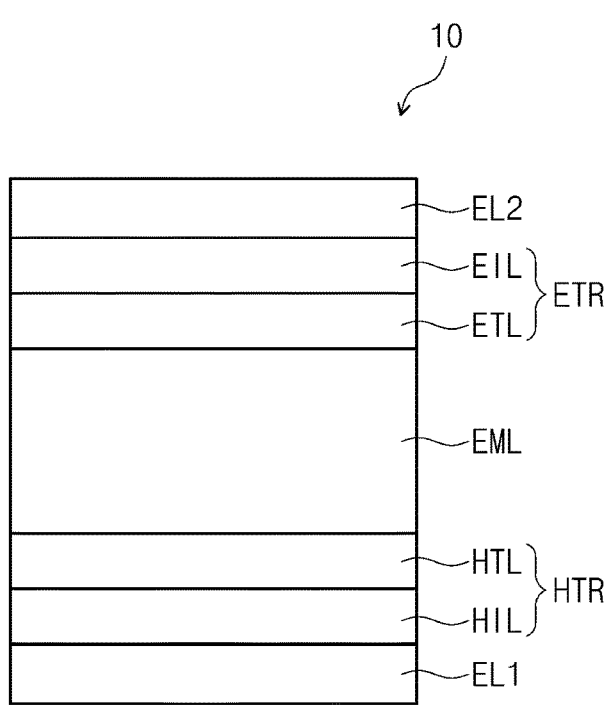
FIG. 2 is a schematic cross-sectional view illustrating an organic electroluminescence device according to an embodiment of the present disclosure.
Figure 3:
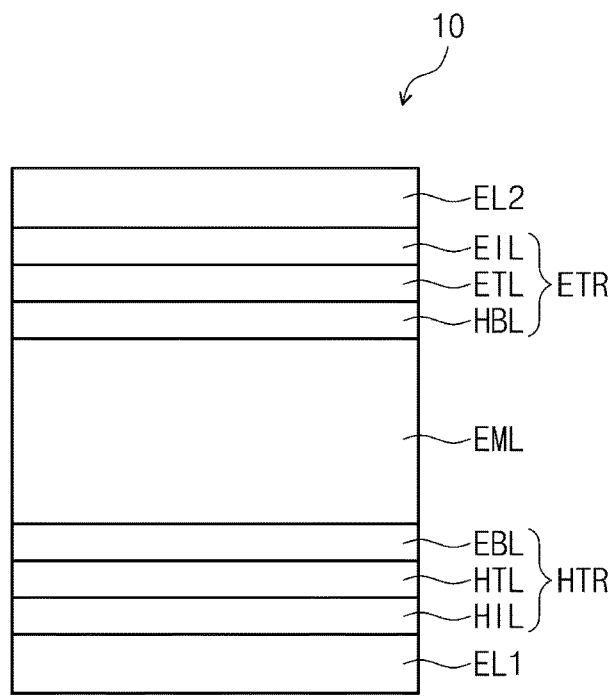
FIG. 3 is a schematic cross-sectional view illustrating an organic electroluminescence device according to an embodiment of the present disclosure.
Figure 4:
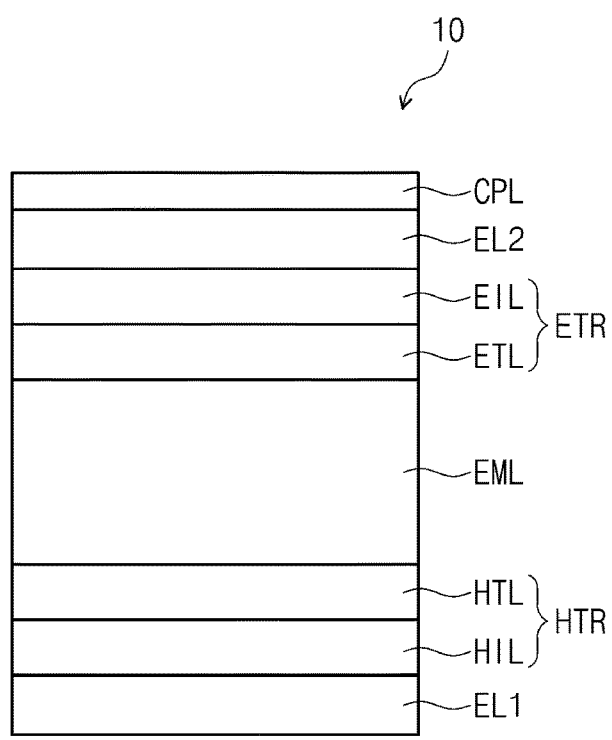
FIG. 4 is a schematic cross-sectional view schematically illustrating an organic electroluminescence device according to an embodiment of the present disclosure.

Compared with FIG. 1, FIG. 2 shows the cross-sectional view of an organic electroluminescence device 10 of an embodiment, wherein the hole transport region HTR includes a hole injection layer HIL and a hole transport layer HTL, and the electron transport region ETR includes an electron injection layer EIL and an electron transport layer ETL. Compared with FIG. 1, FIG. 3 shows the cross-sectional view of an organic electroluminescence device 10 of an embodiment, wherein the hole transport region HTR includes the hole injection layer HIL, the hole transport layer HTL, and an electron blocking layer EBL, and the electron transport region ETR includes the electron injection layer EIL, the electron transport layer ETL, and the hole blocking layer HBL. Compared with FIG. 2, FIG. 4 shows the cross-sectional view of an organic electroluminescence device 10 of an embodiment, including a capping layer CPL disposed on the second electrode EL2.

The first electrode EL1 may have conductivity (e.g., may be conductive). The first electrode EL1 may be formed using a metal alloy or a conductive compound. The first electrode EL1 may be an anode. The first electrode EL1 may be a pixel electrode. The first electrode EL1 may be a transmissive electrode, a transflective electrode, or a reflective electrode. When the first electrode EL1 is a transmissive electrode, the first electrode EL1 may be formed using a transparent metal oxide (such as indium tin oxide (ITO), indium zinc oxide (IZO), zinc oxide (ZnO), and/or indium tin zinc oxide (ITZO)). When the first electrode EL1 is a transflective electrode or a reflective electrode, the first electrode EL1 may include silver (Ag), magnesium (Mg), copper (Cu), aluminum (Al), platinum (Pt), palladium (Pd), gold (Au), nickel (Ni), neodymium (Nd), iridium (Ir), chromium (Cr), lithium (Li), calcium (Ca), LiF/Ca, LiF/Al, molybdenum (Mo), titanium (Ti), a compound thereof, or a mixture thereof (for example, a mixture of Ag and Mg). In some embodiments, the first electrode EL1 may have a structure including a plurality of layers including a reflective layer or a transflective layer formed using the above materials, and a transmissive conductive layer formed using ITO, IZO, ZnO, or ITZO. For example, the first electrode EL1 may include a three-layer structure of ITO/Ag/ITO. However, an embodiment of the present disclosure is not limited thereto. The thickness of the first electrode EL1 may be about 1,000 Å to about 10,000 Å, for example, from about 1,000 Å to about 3,000 Å.

The hole transport region HTR is provided on the first electrode EL1. The hole transport region HTR may include at least one of a hole injection layer HIL, a hole transport layer HTL, a hole buffer layer, or an electron blocking layer EBL. The thickness of the hole transport region HTR may be about 50 Å to about 15,000 Å.

The hole transport region HTR may have a single layer formed using a single material, a single layer formed using a plurality of different materials, or a multilayer structure including a plurality of layers formed using a plurality of different materials.

For example, the hole transport region HTR may have the structure of a single layer of a hole injection layer HIL, or a hole transport layer HTL, and may have a structure of a single layer formed using a hole injection material and a hole transport material. In some embodiments, the hole transport region HTR may have a structure of a single layer formed using a plurality of different materials, or a structure stacked from the first electrode EL1 of hole injection layer HIL/hole transport layer HTL, hole injection layer HIL/hole transport layer HTL/hole buffer layer, hole injection layer HIL/hole buffer layer, hole transport layer HTL/hole buffer layer, or hole injection layer HIL/hole transport layer HTL/electron blocking layer EBL, without limitation.

The hole transport region HTR may be formed using any suitable method (such as a vacuum deposition method, a spin coating method, a cast method, a Langmuir-Blodgett (LB) method, an inkjet printing method, a laser printing method, and/or a laser induced thermal imaging (LITI) method).

The hole injection layer HIL may include, for example, a phthalocyanine compound (such as copper phthalocyanine), N,N'-diphenyl-N,N'-bis-[4-(phenyl-m-tolyl-amino)-phenyl]-phenyl-4,4'-diamine (DNTPD), 4,4',4"-[tris(3-methylphenyl)phenylamino] triphenylamine (m-MTDATA), 4,4', 4"-tris(N,N-diphenylamino)triphenylamine (TDATA), 4,4', 4"-tris{N-2-naphthyl)-N-phenylamino}-triphenylamine (2-TNATA), poly(3,4-ethylene dioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), N,N'-di(1-naphthalene-1-yl)-N,N'-diphenyl-benzidine (NPB), triphenylamine-containing polyether ketone (TPAPEK), 4-isopropyl-4'-methyldiphenyliodonium [tetrakis(pentafluorophenyl)borate], and dipyrazino[2,3-f:2', 3'-h]quinoxaline-2,3,6,7,10,11-hexacarbonitrile (HAT-CN).

The hole transport layer HTL may include, for example, carbazole derivatives (such as N-phenyl carbazole and/or polyvinyl carbazole), fluorene-based derivatives, N,N'-bis (3-methylphenyl)-N,N'-diphenyl-[1,1-biphenyl]-4,4'-diamine (TPD), triphenylamine-based derivatives (such as 4,4',4"-tris(N-carbazolyl)triphenylamine (TCTA)), N,N'-di (1-naphthalene-1-yl)-N,N'-diphenyl-benzidine (NPB), 4,4'-cyclohexylidene bis[N,N-bis(4-methylphenyl)benzeneamine (TAPC), 4,4'-bis[N,N'-(3-tolyl)amino]-3,3'-dimethylbiphenyl (HMTPD), 1,3-bis(N-carbazolyl)benzene (mCP), etc.

The thickness of the hole transport region HTR may be about 50 Å to about 10,000 Å, for example, about 100 Å to about 5,000 Å. The thickness of the hole injection layer HIL may be, for example, about 30 Å to about 1,000 Å, and the thickness of the hole transport layer HTL may be about 30 Å to about 1,000 Å. For example, the thickness of the electron blocking layer EBL may be about 10 Å to about 1,000 Å. When the thicknesses of the hole transport region HTR, the hole injection layer HIL, the hole transport layer HTL and the electron blocking layer EBL satisfy the above-described ranges, satisfactory hole transport properties may be achieved without a substantial increase in driving voltage.

The hole transport region HTR may further include a charge generating material in addition to the above-described materials to increase conductivity. The charge generating material may be dispersed substantially uniformly or non-uniformly in the hole transport region HTR. The charge generating material may be, for example, a p-dopant. The p-dopant may be a quinone derivative, a metal oxide, or a cyano group-containing compound, without limitation. Non-limiting examples of the p-dopant include quinone derivatives (such as tetracyanoquinodimethane (TCNQ) and/or 2,3,5,6-tetrafluoro-7,7',8,8'-tetracyanoquinodimethane (F4-TCNQ)), metal oxides (such as tungsten oxide and/or molybdenum oxide), etc.

As described above, the hole transport region HTR may further include at least one of a hole buffer layer or an electron blocking layer EBL in addition to the hole injection layer HIL and the hole transport layer HTL. The hole buffer layer may compensate for an optical resonance distance depending on the wavelength of light emitted from an emission layer EML, and may increase light emission efficiency. The same materials that may be included in a hole transport region HTR may be used in the hole buffer layer. The electron blocking layer EBL may prevent or reduce electron injection from the electron transport region ETR into the hole transport region HTR.

The emission layer EML is provided on the hole transport region HTR. The emission layer EML may have a thickness of, for example, about 100 Å to about 1,000 Å or about 100 Å to about 300 Å. The emission layer EML may have or be a single layer formed using a single material, a single layer formed using a plurality of different materials, or a multi-layer structure having a plurality of layers formed using a plurality of different materials.

In the organic electroluminescence device 10 of an embodiment, the emission layer EML may include the polycyclic compound of an embodiment.

The polycyclic compound of an embodiment may include a boron atom, a first aromatic ring and a second aromatic ring, which are each directly connected with the boron atom, an oxygen atom or a sulfur atom, which is directly connected with the boron atom, a third aromatic ring that is directly connected with the oxygen atom or the sulfur atom, a first linker connecting the first aromatic ring and the second aromatic ring, and a second linker connecting the second aromatic ring and the third aromatic ring.

In the description, the term "substituted or unsubstituted" refers to a state of being unsubstituted, or substituted with at least one substituent selected from the group consisting of a deuterium atom, a halogen atom, a cyano group, a nitro group, an amino group, a silyl group, an oxy group, a thio group, a sulfinyl group, a sulfonyl group, a carbonyl group, a boron group, a phosphine oxide group, a phosphine sulfide group, an alkyl group, an alkenyl group, an alkoxy group, a hydrocarbon ring group, an aryl group, and a heterocyclic group. In addition, each of the substituents may be unsubstituted, or further substituted. For example, a biphenyl group may be interpreted as an aryl group or a phenyl group substituted with a phenyl group.

In the description, the term "forming a ring via combination with an adjacent group" may refer to forming a substituted or unsubstituted hydrocarbon ring or a substituted or unsubstituted heterocycle via combination with an adjacent group. The hydrocarbon ring may be an aliphatic hydrocarbon ring or an aromatic hydrocarbon ring. The heterocycle may be an aliphatic heterocycle or an aromatic heterocycle. The hydrocarbon ring and the heterocycle may each independently be a monocycle or a polycycle. In some embodiments, the ring formed via combination with an adjacent group may be further combined with another ring to form a spiro structure.

In the description, the term "forming a ring via combination with an adjacent group" may refer to forming a substituted or unsubstituted hydrocarbon ring, or a substituted or unsubstituted heterocycle via the combination of two adjacent rings.

In the description, the term "adjacent group" may refer to a substituent on the same atom or point, a substituent on an atom that is directly connected to the base atom or point, or a substituent sterically positioned (e.g., within intramolecular bonding distance) to the corresponding substituent. For example, in 1,2-dimethylbenzene, two methyl groups may be interpreted as "adjacent groups" to each other, and in 1,1-diethylcyclopentane, the two ethyl groups may be interpreted as "adjacent groups" to each other.

In the description, the term "halogen atom" may refer to a fluorine atom, a chlorine atom, a bromine atom, or an iodine atom.

In the description, the term "alkyl" may refer to a linear, branched or alkyl group. The carbon number of the alkyl may be 1 to 50, 1 to 30, 1 to 20, 1 to 10, or 1 to 6. Non-limiting examples of the alkyl include methyl, ethyl, n-propyl, isopropyl, n-butyl, s-butyl, t-butyl, i-butyl, 2-ethylbutyl, 3,3-dimethylbutyl, n-pentyl, i-pentyl, neopentyl, t-pentyl, cyclopentyl, 1-methylpentyl, 3-methylpentyl, 2-ethylpentyl, 4-methyl-2-pentyl, n-hexyl, 1-methylhexyl, 2-ethylhexyl, 2-butylhexyl, cyclohexyl, 4-methylcyclohexyl, 4-t-butylcyclohexyl, n-heptyl, 1-methylheptyl, 2,2-dimethylheptyl, 2-ethylheptyl, 2-butylheptyl, n-octyl, t-octyl, 2-ethyloctyl, 2-butyloctyl, 2-hexyloctyl, 3,7-dimethyloctyl, cyclooctyl, n-nonyl, n-decyl, adamantyl, 2-ethyldecyl, 2-butyldecyl, 2-hexyldecyl, 2-octyldecyl, n-undecyl, n-dodecyl, 2-ethyldodecyl, 2-butyldodecyl, 2-hexyldocecyl, 2-octyldodecyl, n-tridecyl, n-tetradecyl, n-pentadecyl, n-hexadecyl, 2-ethylhexadecyl, 2-butylhexadecyl, 2-hexylhexadecyl, 2-octylhexadecyl, n-heptadecyl, n-octadecyl, n-nonadecyl, n-eicosyl, 2-ethyleicosyl, 2-butyleicosyl, 2-hexyleicosyl, 2-octyleicosyl, n-henicosyl, n-docosyl, n-tricosyl, n-tetracosyl, n-pentacosyl, n-hexacosyl, n-heptacosyl, n-octacosyl, n-nonacosyl, n-triacontyl, etc.

In the description, the term "hydrocarbon ring" may refer to an optional functional group or substituent derived from an aliphatic hydrocarbon ring. The hydrocarbon ring may be a saturated hydrocarbon ring of 5 to 20 carbon atoms for forming a ring.

In the description, the term "aryl group" may refer to an optional functional group or substituent derived from an aromatic hydrocarbon ring. The aryl group may be a monocyclic aryl group or a polycyclic aryl group. The carbon number for forming a ring in the aryl group may be 6 to 30, 6 to 20, or 6 to 15. Non-limiting examples of the aryl group include phenyl, naphthyl, fluorenyl, anthracenyl, phenanthryl, biphenyl, terphenyl, quaterphenyl, quinqphenyl, sexiphenyl, triphenylenyl, pyrenyl, benzofluoranthenyl, chrysenyl, etc.

In the description, the term "heterocyclic group" may refer to an optional functional group or substituent derived from a ring including one or more boron (B), oxygen (O), nitrogen (N), phosphorus (P), silicon (Si), or sulfur (S) atoms as heteroatoms. The heterocyclic group may be an aliphatic heterocyclic group or an aromatic heterocyclic group. The aromatic heterocyclic group may be a heteroaryl group. The aliphatic heterocycle and the aromatic heterocycle may each be a monocycle or a polycycle.

When the heterocyclic group includes two or more heteroatoms, the two or more heteroatoms may be the same or different. The heterocyclic group may be a monocyclic heterocyclic group or a polycyclic heterocyclic group, and in some embodiments may be a heteroaryl group. The carbon number for forming a ring of the heteroaryl may be 2 to 30, 2 to 20, or 2 to 10.

The carbon number for forming a ring of the aliphatic heterocyclic group may be 2 to 30, 2 to 20, or 2 to 10. Non-limiting examples of the aliphatic heterocyclic group include an oxirane group, a thiirane group, a pyrrolidine group, a piperidine group, a tetrahydrofuran group, a tetrahydrothiophene group, a thiane group, a tetrahydropyrane group, a 1,4-dioxane group, etc.

When the heteroaryl group includes two or more heteroatoms, the two or more heteroatoms may be the same or different. The heteroaryl group may be a monocyclic heteroaryl group or a polycyclic heteroaryl group. The carbon number for forming a ring of the heteroaryl group may be 2 to 30, 2 to 20, or 2 to 10. Non-limiting examples of the heteroaryl group include thiophene, furan, pyrrole, imidazole, triazole, pyridine, bipyridine, pyrimidine, triazine, triazole, acridyl, pyridazine, pyrazinyl, quinoline, quinazoline, quinoxaline, phenoxazine, phthalazine, pyrido pyrimidine, pyrido pyrazine, pyrazino pyrazine, isoquinoline, indole, carbazole, N-arylcarbazole, N-heteroarylcarbazole, N-alkylcarbazole, benzoxazole, benzimidazole, benzothiazole, benzocarbazole, benzothiophene, dibenzothiophene, thienothiophene, benzofuran, phenanthroline, thiazole, isooxazole, oxazole, oxadiazole, thiadiazole, phenothiazine, dibenzosilole, dibenzofuran, etc.

In the description, the term "oxy group" may refer to an alkoxy group or an aryl oxy group. The alkoxy group may include a linear, branched or cyclic alkyl chain. The carbon number of the alkoxy group is not specifically limited but may be, for example, 1 to 20 or 1 to 10. The carbon number of the aryl oxy group is not specifically limited but may be, for example, 6 to 30, 6 to 20 or 6 to 15. Non-limiting examples of the oxy group include methoxy, ethoxy, n-propoxy, isopropoxy, butoxy, pentyloxy, hexyloxy, octyloxy, nonyloxy, decyloxy, benzyloxy, etc. However, an embodiment of the present disclosure is not limited thereto.

In the description, the term "boryl group" may refer to an alkyl boryl group or an aryl boryl group. Non-limiting examples of the boryl group include a trimethylboryl group, a triethylboryl group, a t-butyldimethylboryl group, a triphenylboryl group, a diphenylboryl group, a phenylboryl group, etc. For example, the alkyl group in the alkyl boryl group may be the same as the above-exemplified alkyl group, and the aryl group in the aryl boryl group may be the same as the above-exemplified aryl group.

In the description, the carbon number of the amine group is not specifically limited, but may be 1 to 30. The amine group may be an alkyl amine group or an aryl amine group.

Non-limiting examples of the amine group include a methylamine group, a dimethylamine group, a phenylamine group, a diphenylamine group, a naphthylamine group, a 9-methyl-anthracenylamine group, a triphenylamine group, etc.

In the description, the alkyl group in the alkyl amine group may be the same as the above-exemplified alkyl group.

In the description, the aryl group in the aryl amine group may be the same as the above-exemplified aryl group.

In the description, the term "direct linkage" may refer to a single bond.

In the description, "—·" refers to a connected position.

In the polycyclic compound of an embodiment, the first aromatic ring to the third aromatic ring may each independently be a substituted or unsubstituted aromatic hydrocarbon ring of 6 to 30 carbon atoms or a substituted or unsubstituted aromatic heterocycle of 2 to 30 carbon atoms. For example, the first aromatic ring and the second aromatic ring may each independently be a substituted or unsubstituted benzene ring. For example, the third aromatic ring may be a substituted or unsubstituted benzene ring or a substituted or unsubstituted pyrimidine ring.

In the polycyclic compound of an embodiment, the first linker may be a direct linkage, *—O—* or *—NAr$_a$—*. Ar$_a$ may be a substituted or unsubstituted aryl group of 6 to 30 carbon atoms. For example, Ar$_a$ may be a substituted or unsubstituted phenyl group.

In the polycyclic compound of an embodiment, the second linkage may be a direct linkage, *—O—*, *—S—*, *—C(=O)—*, *—SO$_2$—*, or *—NAr$_b$—*. Ar$_b$ may be a substituted or unsubstituted aryl group of 6 to 30 carbon atoms. For example, the second linker may be *—O—* or *—NAr$_b$—*.

In the polycyclic compound of an embodiment, the first aromatic ring to the third aromatic ring may each independently be combined with an adjacent ring to form a ring. For example, neighboring rings among the two or more rings selected from the first aromatic ring to the third aromatic ring may be directly combined or combined via a linker, or adjacent substituents may be combined with each other to form a condensed ring.

The emission layer EML of an organic electroluminescence device 10 of an embodiment may include a polycyclic compound of an embodiment, represented by Formula 1:

Formula 1

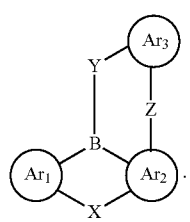

In Formula 1, Ar$_1$ to Ar$_3$ may each independently be a substituted or unsubstituted aromatic hydrocarbon ring of 6 to 30 carbon atoms for forming a ring, or a substituted or unsubstituted aromatic heterocycle of 2 to 30 carbon atoms for forming a ring, and/or may be combined with an adjacent group to form a ring. For example, Ar$_1$ and Ar$_2$ may each independently be a substituted or unsubstituted benzene ring. For example, Ar$_3$ may be a substituted or unsubstituted benzene ring or a substituted or unsubstituted pyrimidine ring.

In Formula 1, X may be *—O—* or *—NAr$_4$—*. In the polycyclic compound of an embodiment, X may connect the Ar$_1$ ring and the Ar$_2$ ring to form a condensed ring including a boron atom. In Formula 1, Y may be *—O—* or *—S—*. Z may be a direct linkage, *—O—*, *—S—*, *—C(=)—*, *—SO$_2$—*, or *—NAr$_5$—*. In the polycyclic compound of an embodiment, Y and Z may connect the boron atom, the Ar$_2$ ring, and the Ar$_3$ ring to form a condensed ring. For example, Z may be a direct linkage, *—O—*, or *—NAr$_5$—*. When Z is a direct linkage, the neighboring Ar$_2$ ring and Ar$_3$ ring may be connected via a single bond.

In some embodiments, Ar$_4$ and Ar$_5$ may each independently be a substituted or unsubstituted aryl group of 6 to 30 carbon atoms for forming a ring, or a substituted or unsubstituted heteroaryl group of 2 to 30 carbon atoms for forming a ring, and/or may be combined with an adjacent group to form a ring. For example, Ar$_4$ may be an unsubstituted phenyl group. For example, Ar$_5$ may be an unsubstituted phenyl group. In some embodiments, Ar$_5$ may be combined with an adjacent group to form a ring, for example, a carbazole group.

In an embodiment, the polycyclic compound represented by Formula 1 may be represented by Formula 1-1:

Formula 1-1

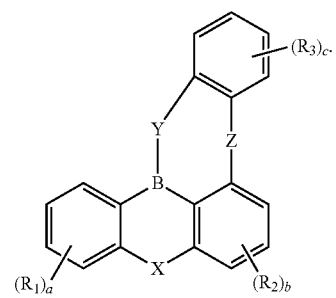

Formula 1-1 is an example embodiment of Formula 1 in which each of Ar$_1$ to Ar$_3$ is a substituted or unsubstituted benzene ring. In Formula 1-1, X, Y, Z, Ar$_4$ and Ar$_5$ may each independently be the same as described in connection with Formula 1.

In Formula 1-1, R$_1$ to R$_3$ may each independently be a hydrogen atom, a deuterium atom, an oxygen atom, a boron atom, a cyano group, a substituted or unsubstituted amine group, a substituted or unsubstituted nitro group, a substituted or unsubstituted alkyl group of 1 to 20 carbon atoms, a substituted or unsubstituted alkoxy group of 1 to 20 carbon atoms, a substituted or unsubstituted aryl group of 6 to 30 carbon atoms for forming a ring, or a substituted or unsubstituted heteroaryl group of 2 to 30 carbon atoms for forming a ring, and/or may be combined with an adjacent group to form a ring. For example, R$_1$ may be an oxygen atom or a boron atom. For example, R$_2$ may be an alkyl group of 1 to 20 carbon atoms, particularly, a methyl group. For example, R$_2$ may be a substituted or unsubstituted amine group, and for example, an amine group where two substituted or unsubstituted phenyl groups are connected with a nitrogen atom. For example, R$_2$ may be a heteroaryl group of 2 to 30 carbon atoms, for example, a carbazole group. For example, R$_3$ may be a hydrogen atom. However, an embodiment of the present disclosure is not limited thereto.

In Formula 1-1, "a" and "c" may each independently be an integer of 0 to 4, and b may be an integer of 0 to 3. When "a" to "c" are each independently an integer of 2 or more, a plurality of $R_1$ to $R_3$ may each independently be the same, or at least one thereof may be different. For example, when "a" is an integer of 2 or more, a plurality of $R_1$ groups may be the same, or at least one thereof may be different from the other groups. This is an example illustration, and the same explanation may be applied to $R_2$ and $R_3$ when each of "b" and "c" is an integer of 2 or more.

In an embodiment, "a" may be 2. When "a" is 2, the two $R_1$ groups may each independently be an oxygen atom or a boron atom. The two $R_1$ groups may be the same or different. Accordingly the polycyclic compound of an embodiment may include a plurality of structures

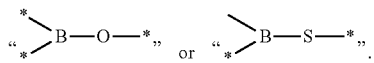

In some embodiments, the two $R_1$ groups may be combined with each other to form a ring. For example, two $R_1$ groups may be combined with a benzene ring to form a condensed ring.

In an embodiment, the polycyclic compound represented by Formula 1 may be represented by Formula 1-2:

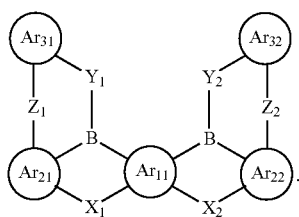

Formula 1-2

Formula 1-2 is an example embodiment of Formula 1-1 where "a" is 2 and the two $R_1$ groups are combined with $Ar_{21}$ to form a ring. The polycyclic compound of an embodiment may have a symmetric structure with respect to $Ar_{11}$, as shown in Formula 1-2.

In Formula 1-2, $Ar_{11}$, $Ar_{21}$, $Ar_{22}$, $Ar_{31}$, and $Ar_{32}$ may each independently be a substituted or unsubstituted aromatic hydrocarbon ring of 6 to 30 carbon atoms for forming a ring, or a substituted or unsubstituted aromatic heterocycle of 2 to 30 carbon atoms for forming a ring, and/or may be combined with an adjacent group to form a ring. For example, $Ar_{11}$, $Ar_{21}$, and $Ar_{22}$ may each independently be a substituted or unsubstituted benzene ring. For example, $Ar_{31}$ and $Ar_{32}$ may be each independently a substituted or unsubstituted benzene ring or a substituted or unsubstituted pyrimidine ring.

In Formula 1-2, $X_1$ and $X_2$ may each independently be *—O—* or *—NAr$_4$—*. In the polycyclic compound of an embodiment, $X_1$ may connect an $Ar_{11}$ ring and an $Ar_{21}$ ring to form a condensed ring including a boron atom. In the polycyclic compound of an embodiment, $X_2$ may connect an $Ar_{11}$ ring and an $Ar_{22}$ ring to form a condensed ring including a boron atom. In Formula 1-2, $Y_1$ and $Y_2$ may each independently be *—O—* or *—S—*. $Z_1$ and $Z_2$ may each independently a direct linkage, *—O—*, *—S—*, *—C(=O)—*, *—SO$_2$—* or *—NAr$_5$—*. In the polycyclic compound of an embodiment, $Y_1$ and $Z_1$ may connect a boron atom, an $Ar_{21}$ ring and an $Ar_{31}$ ring to form a condensed ring. In the polycyclic compound of an embodiment, $Y_2$ and $Z_2$ may connect a boron atom, an $Ar_{22}$ ring, and an $Ar_{32}$ ring to form a condensed ring.

$Ar_4$ and $Ar_5$ may each independently be the same as described in connection with Formula 1.

In an embodiment, the polycyclic compound represented by Formula 1-2 may be represented by Formula 1-3:

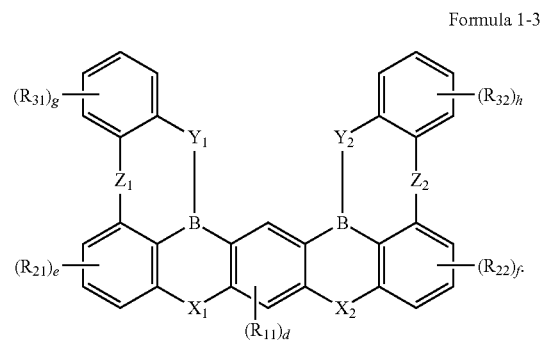

Formula 1-3

Formula 1-3 is an example embodiment of Formula 1-2 where $Ar_{11}$, $Ar_{21}$, $Ar_{22}$, $Ar_{31}$, and $Ar_{32}$ are each independently a substituted or unsubstituted benzene ring. In Formula 1-3, $X_1$, $X_2$, $Y_1$, $Y_2$, $Z_1$, $Z_2$, $Ar_4$, and $Ar_5$ may each independently be the same as described in connection with Formula 1-2.

In Formula 1-3, $R_{11}$, $R_{21}$, $R_{22}$, $R_{31}$, and $R_{32}$ may each independently be a hydrogen atom, a deuterium atom, a cyano group, a substituted or unsubstituted amine group, a substituted or unsubstituted nitro group, a substituted or unsubstituted alkyl group of 1 to 20 carbon atoms, a substituted or unsubstituted alkoxy group of 1 to 20 carbon atoms, a substituted or unsubstituted aryl group of 6 to 30 carbon atoms for forming a ring, or a substituted or unsubstituted heteroaryl group of 2 to 30 carbon atoms for forming a ring, and/or may be combined with an adjacent group to form a ring.

For example, $R_{11}$ may be a hydrogen atom, or a substituted or unsubstituted alkyl group of 1 to 20 carbon atoms. In some embodiments, $R_{11}$ may be an unsubstituted methyl group or an unsubstituted isopropyl group.

For example, $R_{21}$ and $R_{22}$ may each independently be a hydrogen atom or a substituted or unsubstituted alkyl group of 1 to 20 carbon atoms, for example, an unsubstituted methyl group. For example, $R_{21}$ and $R_{22}$ may each independently be a substituted or unsubstituted amine group, for example, a substituted or unsubstituted diphenylamine group. For example, $R_{21}$ and $R_{22}$ may each independently be a substituted or unsubstituted heteroaryl group of 2 to 30 carbon atoms, for example, an unsubstituted carbazole group.

For example, $R_{31}$ and $R_{32}$ may each independently be a hydrogen atom. However, an embodiment of the present disclosure is not limited thereto.

In Formula 1-3, "d" may be an integer of 0 to 2. For example, "d" may be 0 or 1. "e" and "f" may each independently be an integer of 0 to 3. For example, "e" and "f" may each independently be 0 or 1. "g" and "h" may each independently be an integer of 0 to 4. For example, "g" and "h" may each independently be 0 or 1.

In an embodiment, the polycyclic compound represented by Formula 1 may be represented by Formula 2-1 to Formula 2-3:

Formula 2-1

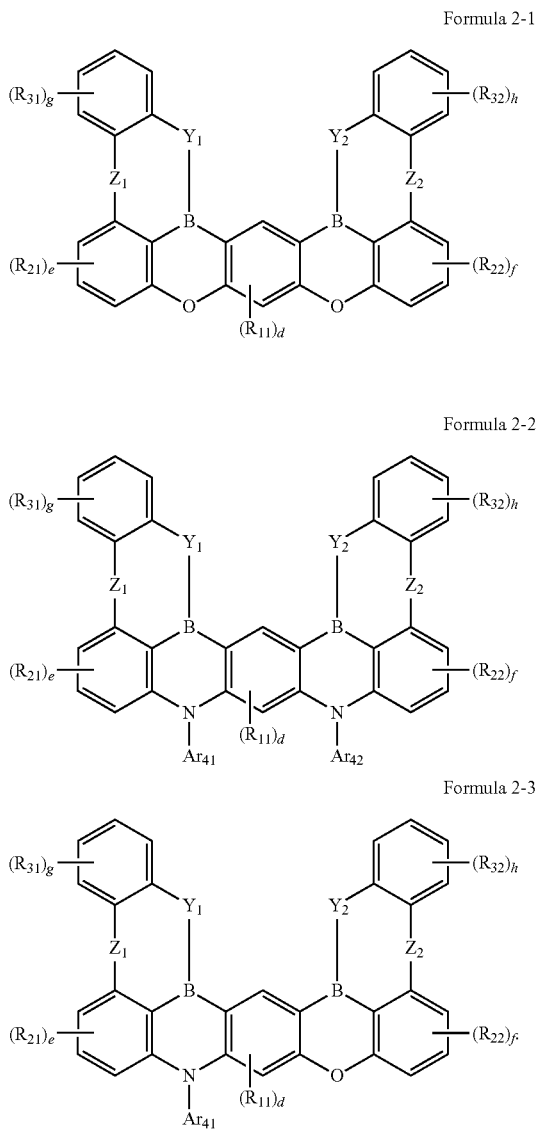

Formula 2-2

Formula 2-3

Formula 3-1

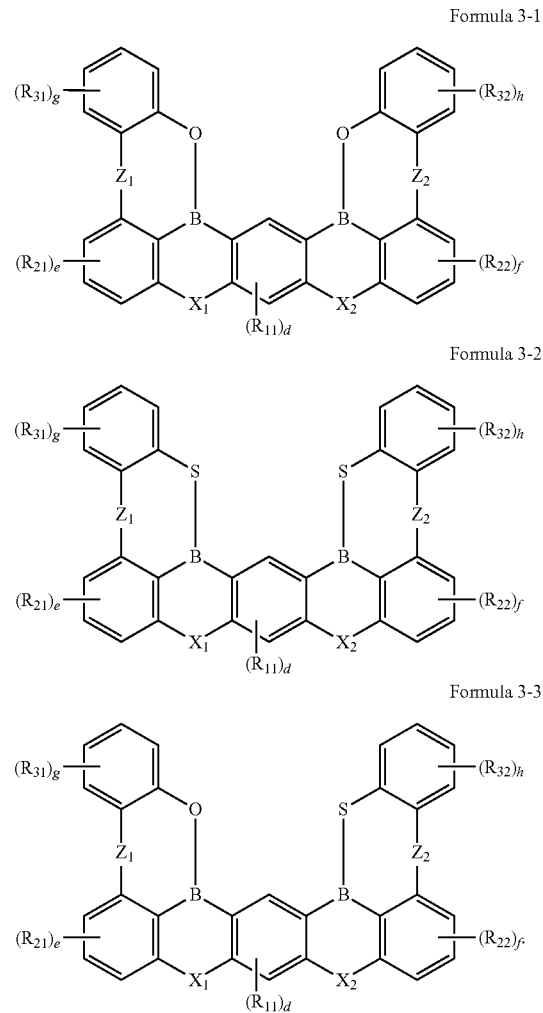

Formula 3-2

Formula 3-3

Formula 2-1 to Formula 2-3 are example embodiments of Formula 1-3 where $X_1$ and $X_2$ are each independently *—O—*, *—$NAr_{41}$—* or *—$NAr_{42}$—*. Formula 2-1 and Formula 2-2 are example embodiments where $X_1$ and $X_2$ are the same. In Formula 2-1 to Formula 2-3, $Y_1$, $Y_2$, $Z_1$, $Z_2$, $Ar_5$, $R_{11}$, $R_{21}$, $R_{22}$, $R_{31}$, $R_{32}$, and "d" to "h" may each independently be the same as described in connection with Formula 1-2 and Formula 1-3.

In Formula 2-1 to Formula 2-3, $Ar_{41}$ and $Ar_{42}$ may each independently be a substituted or unsubstituted aryl group of 6 to 30 carbon atoms for forming a ring, or a substituted or unsubstituted heteroaryl group of 2 to 30 carbon atoms for forming a ring, and/or may be combined with an adjacent group to form a ring. For example, $Ar_{41}$ and $Ar_{42}$ may each independently be a substituted or unsubstituted aryl group of 6 to 30 carbon atoms. For example, $Ar_{41}$ and $Ar_{42}$ may each independently be an unsubstituted phenyl group.

In an embodiment, the polycyclic compound represented by Formula 1 may be represented by Formula 3-1 to Formula 3-3:

Formula 3-1 to Formula 3-3 are example embodiments of Formula 1-3 where $Y_1$ and $Y_2$ are each independently *—O—* or *—S—*. Formula 3-1 and Formula 3-2 are example embodiments where $Y_1$ and $Y_2$ are the same. In Formula 3-1 to Formula 3-3, $X_1$, $X_2$, $Z_1$, $Z_2$, $Ar_4$, $Ar_5$, $R_{11}$, $R_{21}$, $R_{22}$, $R_{31}$, $R_{32}$, and "d" to "h" may each independently be the same as described in connection with Formula 1-2 and Formula 1-3.

In an embodiment, the polycyclic compound represented by Formula 1 may be represented by Formula 4-1 to Formula 4-3:

Formula 4-1

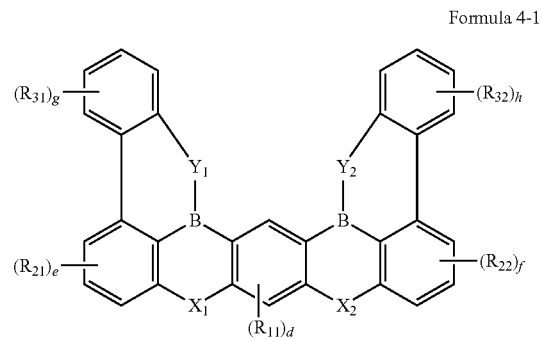

-continued

Formula 4-2

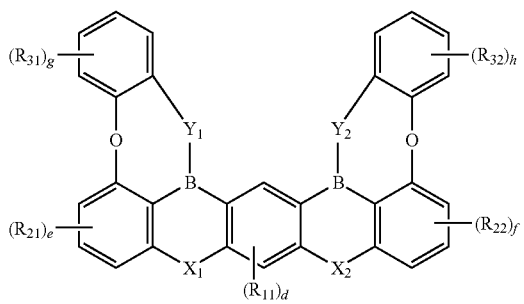

Formula 4-3

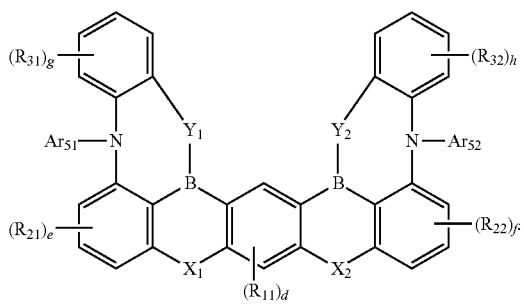

Formula 4-1 to Formula 4-3 represent cases where $Z_1$ and $Z_2$ represent a direct linkage, *—O—*, *—NAr$_{51}$—* or *—NAr$_{52}$—*, respectively. In Formula 4-1 to Formula 4-3, $X_1$, $X_2$, $Y_1$, $Y_2$, $Ar_4$, $R_{11}$, $R_{21}$, $R_{22}$, $R_{31}$, $R_{32}$, and "d" to "h" may each independently be the same as described in connection with Formula 1-2 and Formula 1-3.

In Formula 4-3, $Ar_{51}$ and $Ar_{52}$ may each independently be a substituted or unsubstituted aryl group of 6 to 30 carbon atoms for forming a ring, or a substituted or unsubstituted heteroaryl group of 2 to 30 carbon atoms for forming a ring, and/or may be combined with an adjacent group to form a ring. For example, $Ar_{51}$ and $Ar_{52}$ may each independently be an unsubstituted phenyl group. In some embodiments, $Ar_{51}$ and $Ar_{52}$ may each independently be combined with an adjacent group to form a ring, for example, a carbazole group.

The polycyclic compound of an embodiment includes a direct bond structure

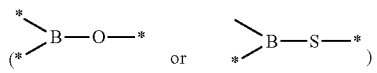

of a boron atom (B) with an oxygen atom (O) or a sulfur atom (S), so that the aromatic rings forming the polycyclic compound may be crosslinked and fixed, thereby improving the stability of a molecule. Accordingly, when the polycyclic compound of an embodiment is used as a material for the emission layer of an organic electroluminescence device, the lifespan characteristics of the organic electroluminescence device may be improved.

In addition, the polycyclic compound of an embodiment includes a plurality of condensed aromatic rings with a boron atom as a center, so that multiple resonance molecular structure may be formed, and structural changes in the molecule may be minimized or reduced even in an excited state.

For example, the polycyclic compound of an embodiment includes a B—O bond or a B—S bond and has a molecular structure capable of forming multiple resonance structures, and may thereby show a low ΔEST value, be used as a material for a thermally activated delayed fluorescence (TADF), and/or be to emit light having a narrow full width at half maximum in a light-emitting wavelength region.

The polycyclic compound represented by Formula 1 may be at least one selected among the compounds represented in Compound Group A to Compound Group F:

Compound Group A

A-1

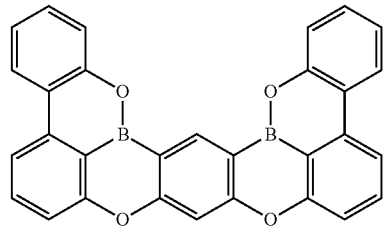

A-2

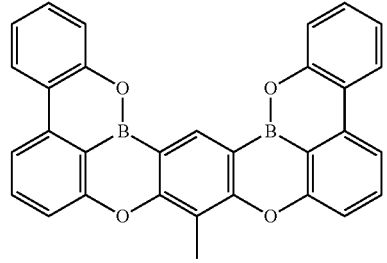

A-3

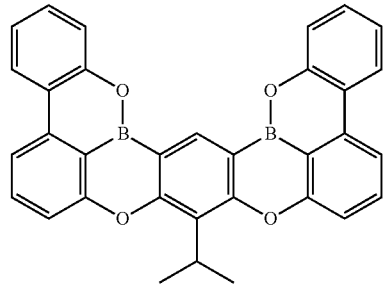

A-4

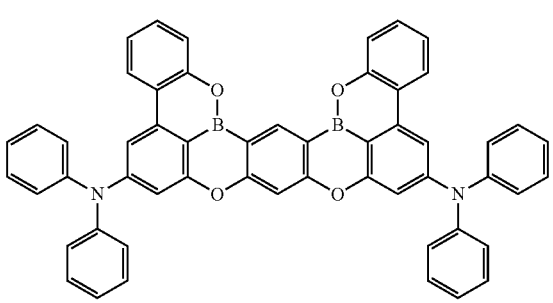

A-5
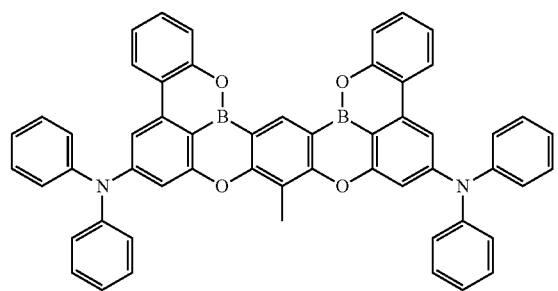
A-10
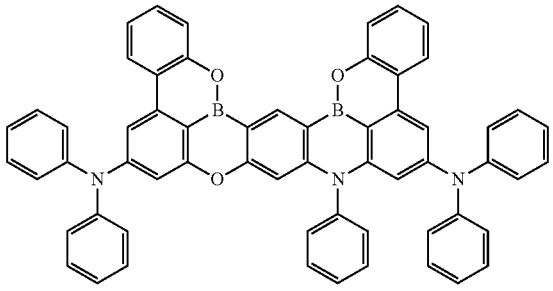
A-6
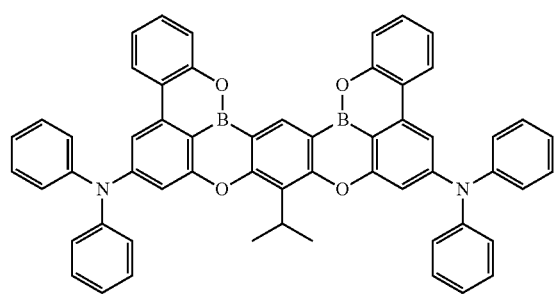
A-11
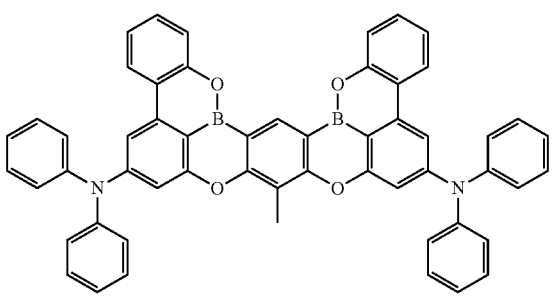
A-7
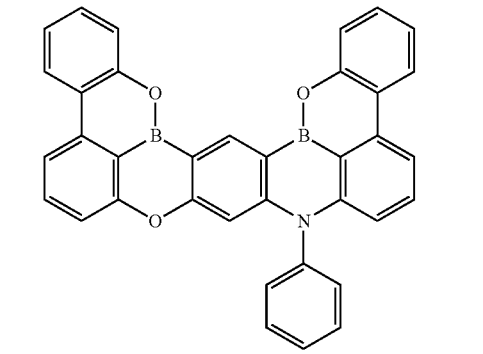
A-12
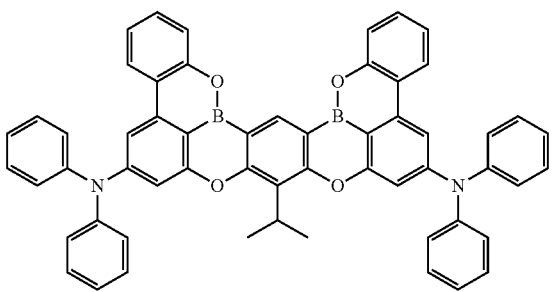
A-8
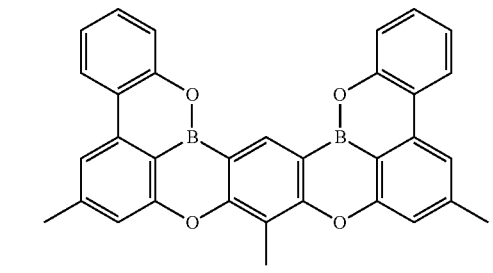
A-13
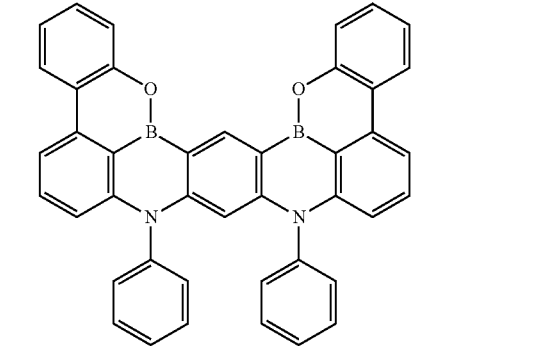
A-9
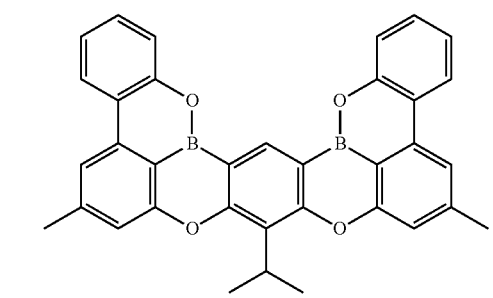
A-14
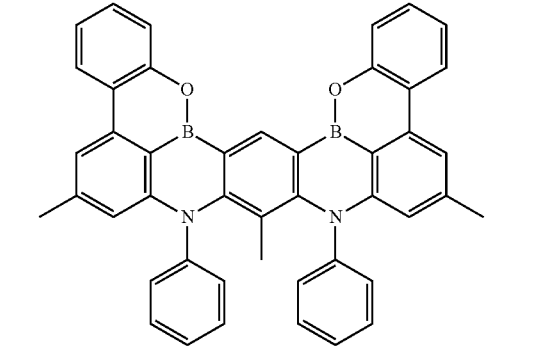

A-15
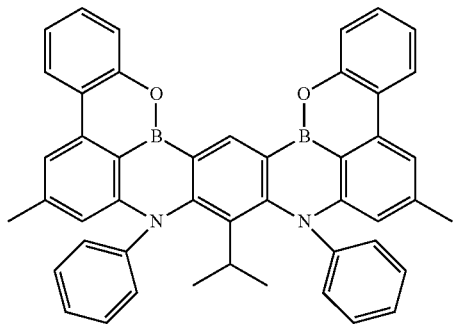
A-16
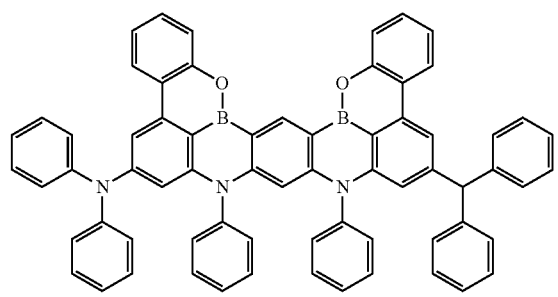
A-17
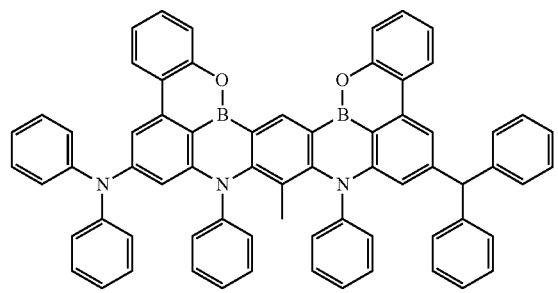
A-18
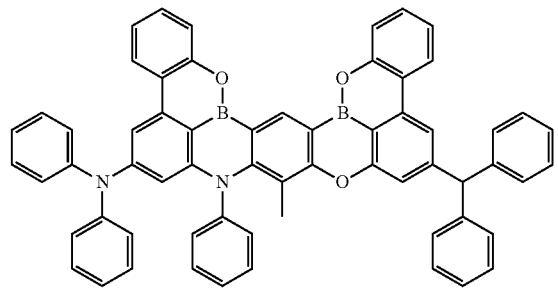
A-19
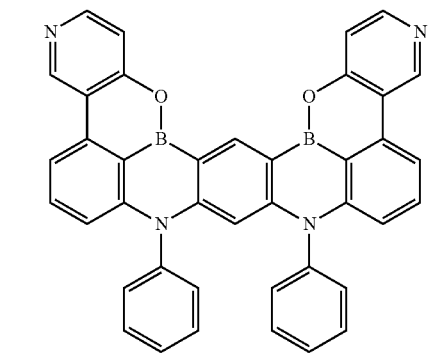
A-20
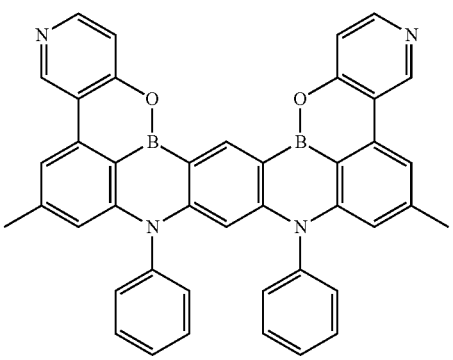
A-21
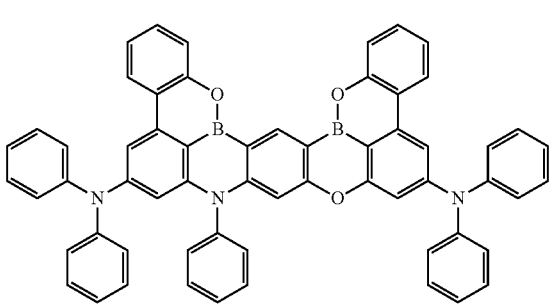
A-22
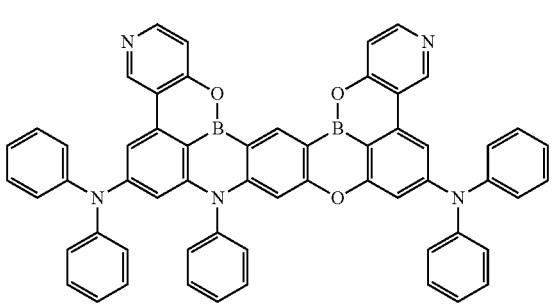
A-23
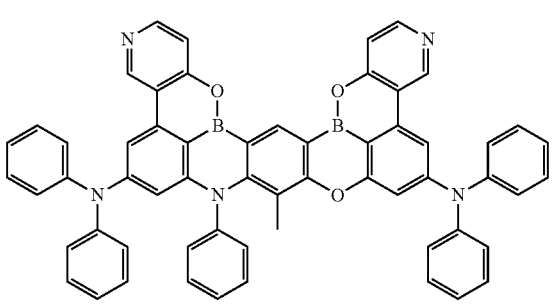
Compound Group B
B-1
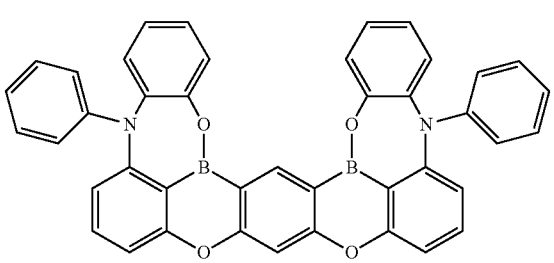

B-2
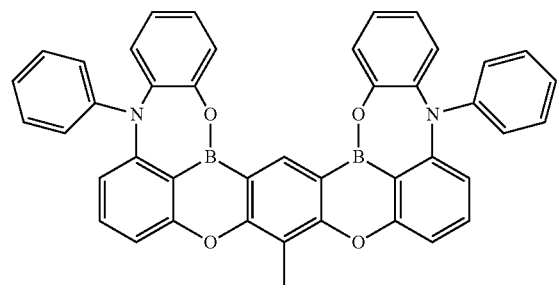
B-3
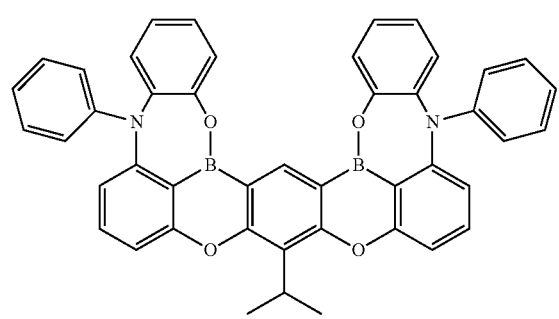
B-4
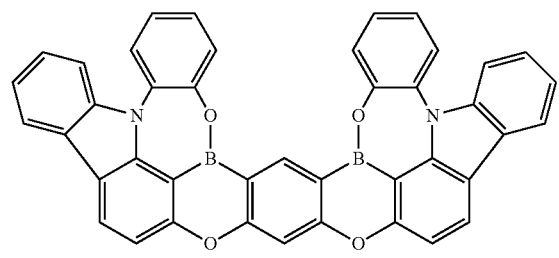
B-5
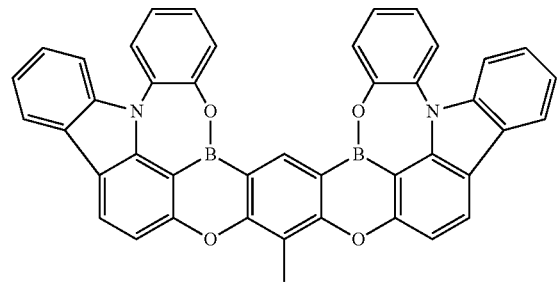
B-6
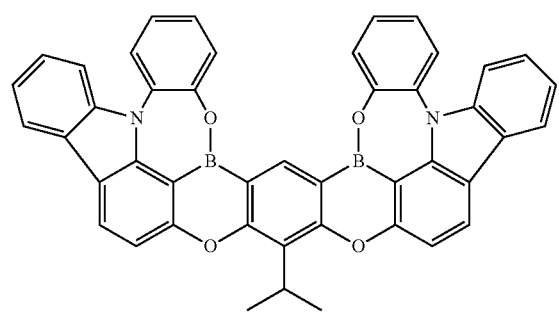
B-7
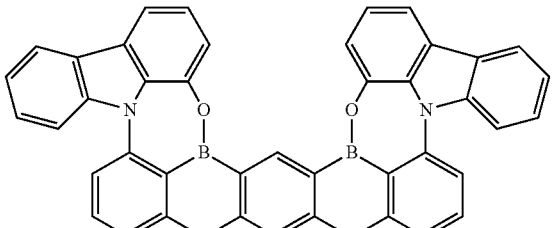
B-8
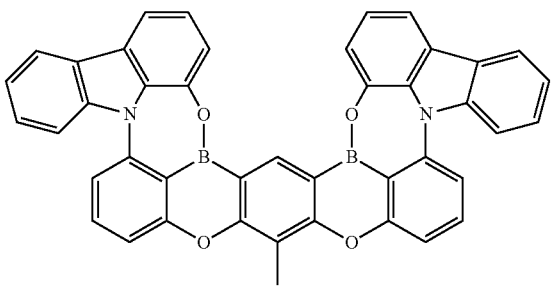
B-9
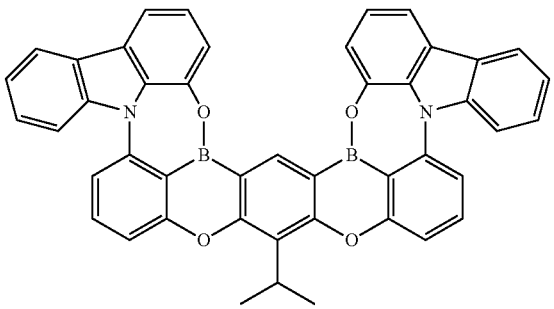
B-10
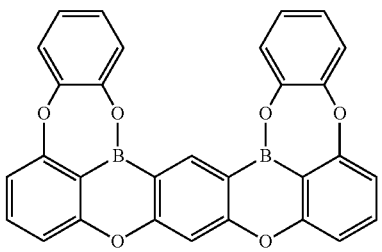
B-11
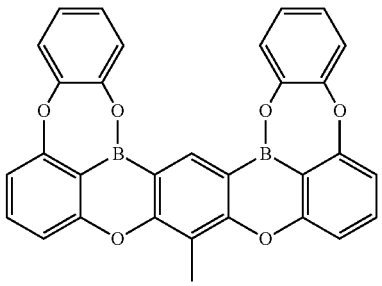

B-12
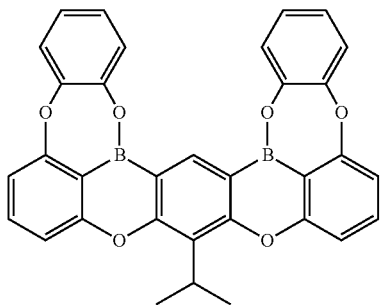
B-13
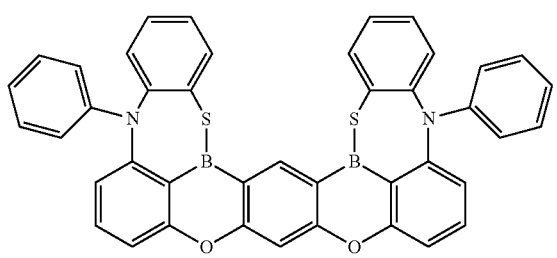
B-14
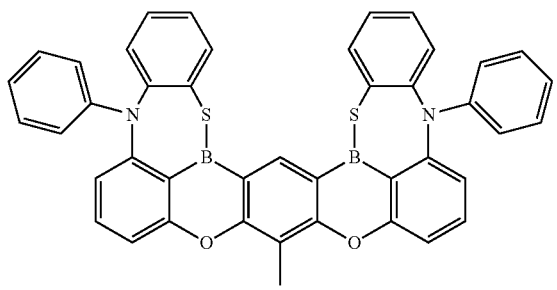
B-15
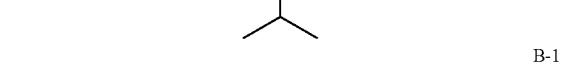
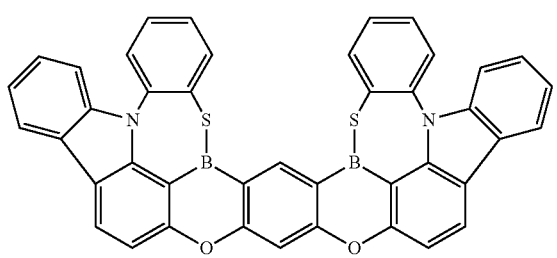
B-16
B-17
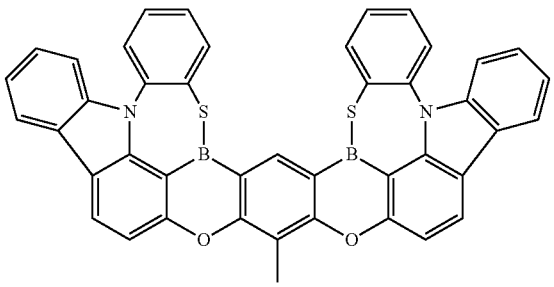
B-18
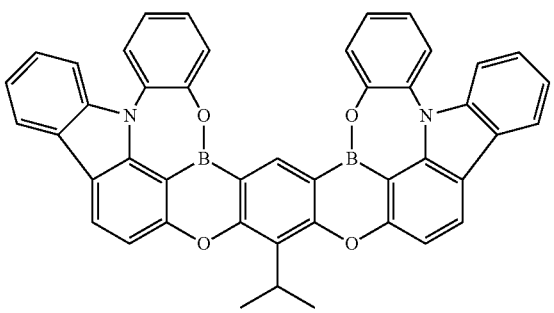
B-19
B-20
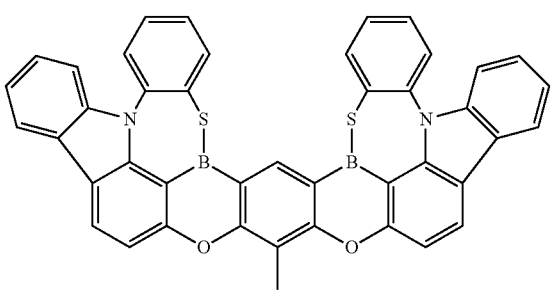
B-21
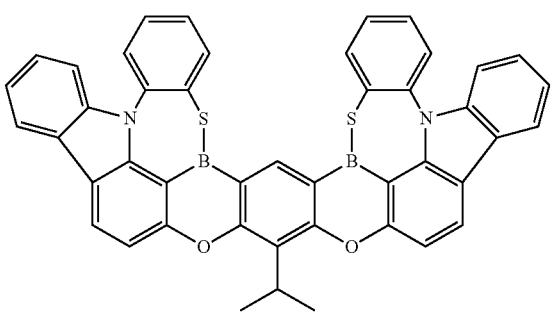

B-22 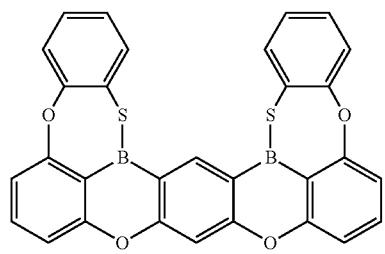
B-23 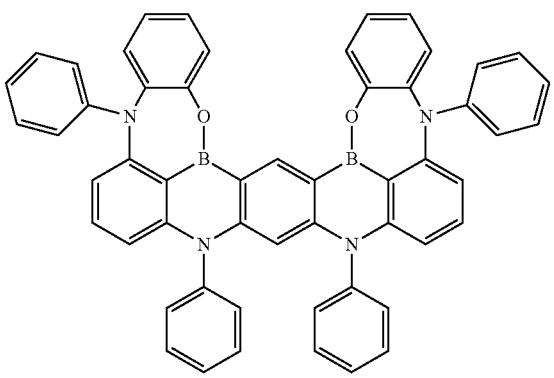
B-24 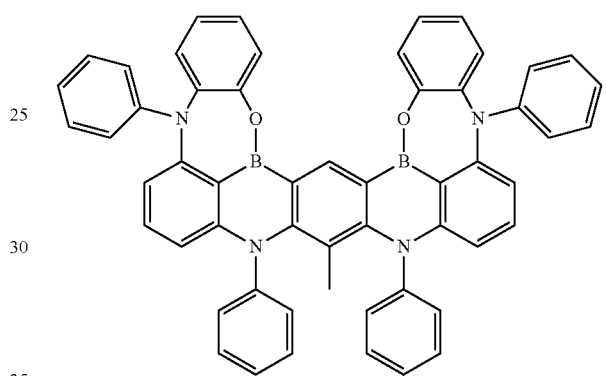
B-25 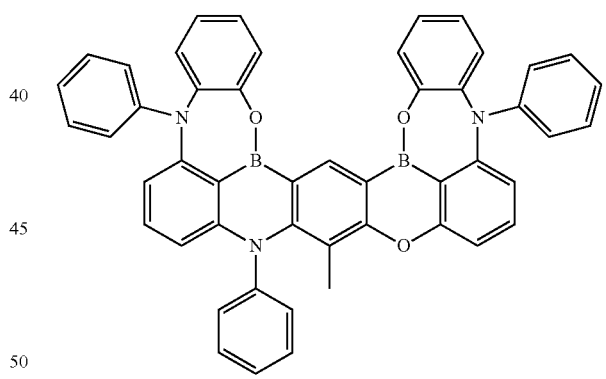
Compound Group C
C-1 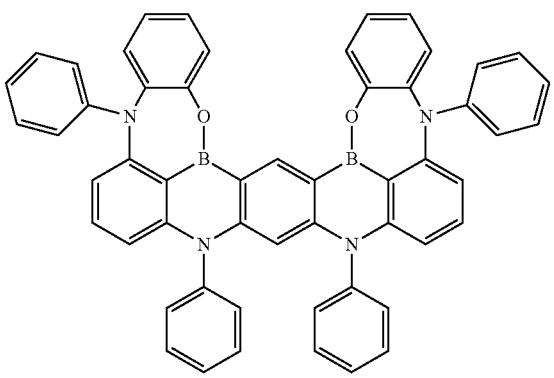
C-2 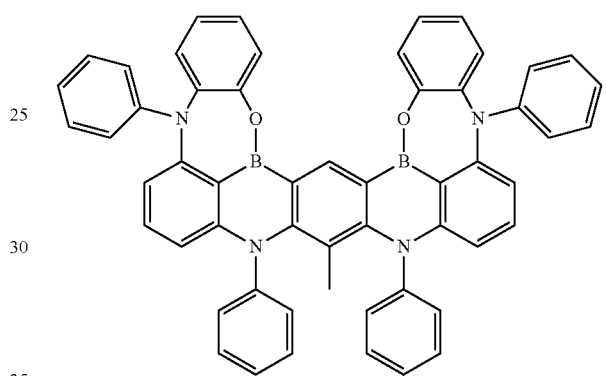
C-3 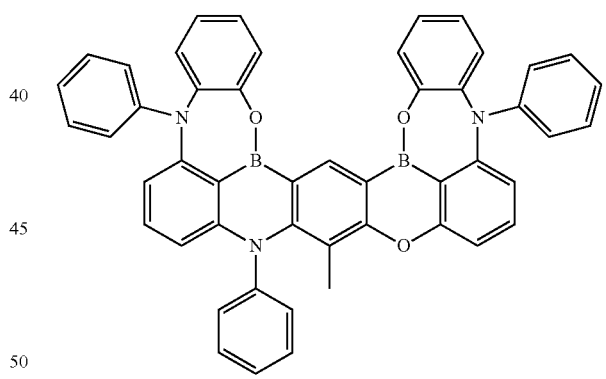
C-4 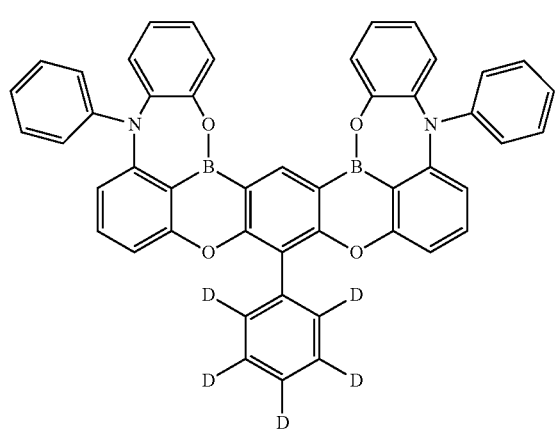

-continued
C-5
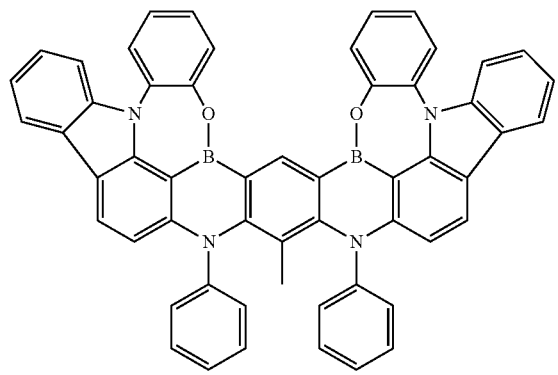
C-6
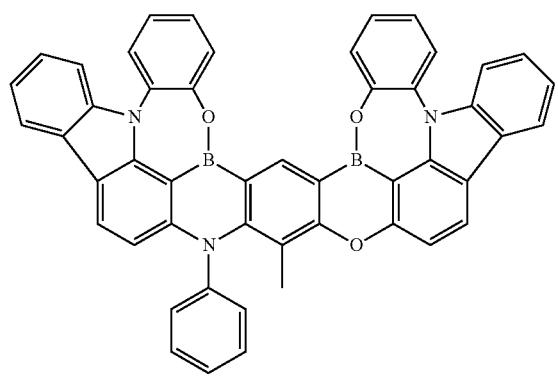
C-7
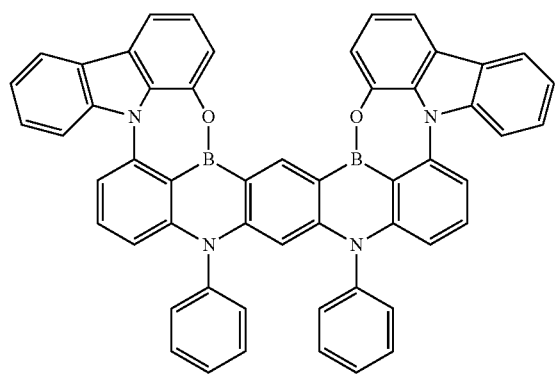
C-8
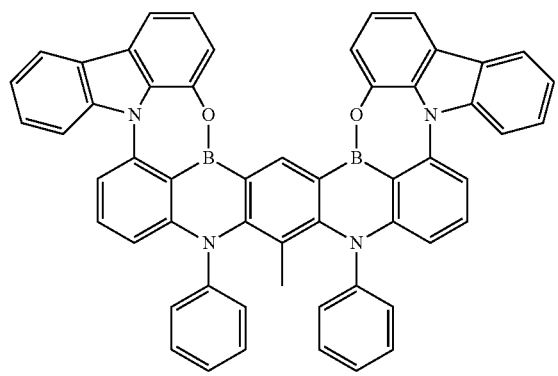
-continued
C-9
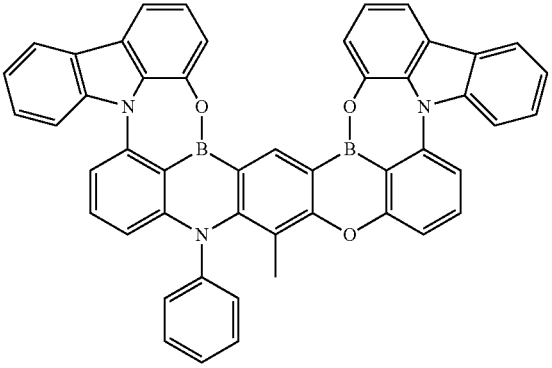
C-10
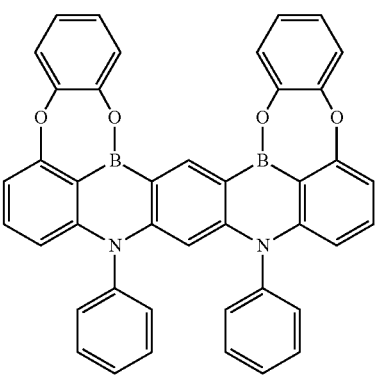
C-11
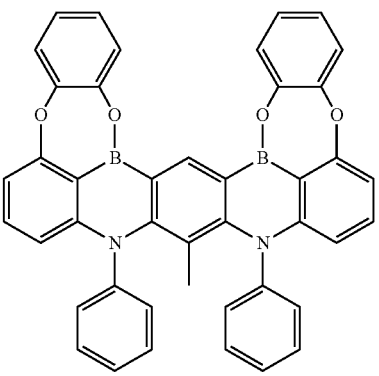
C-12
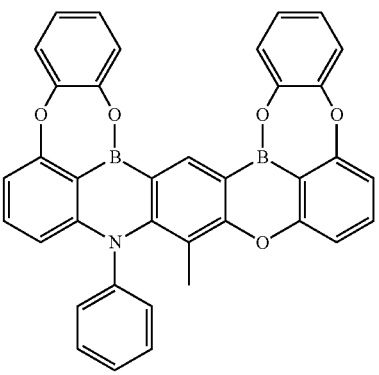

C-13
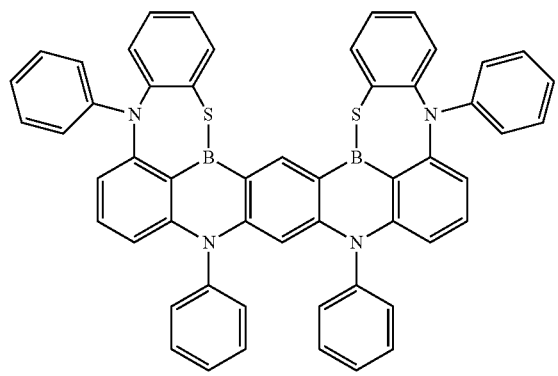
C-17
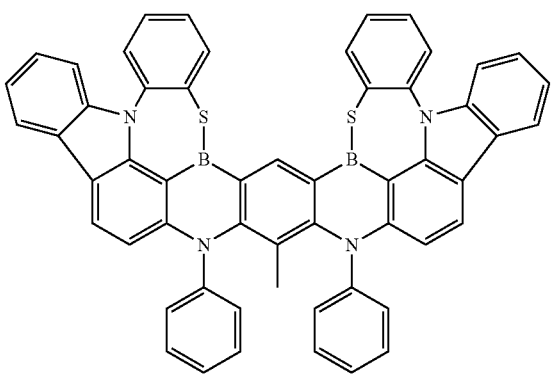
C-14
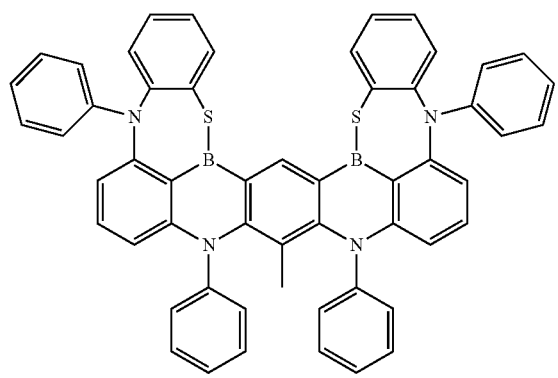
C-18
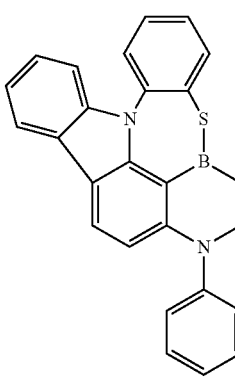
C-15
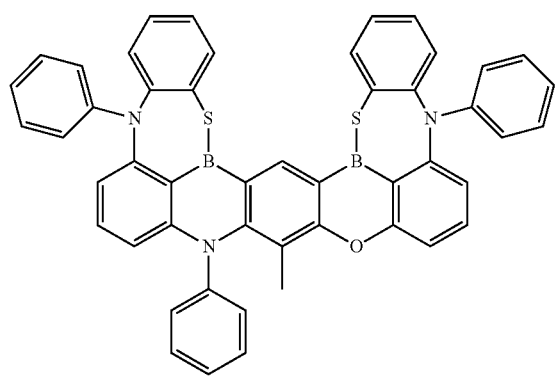
C-19
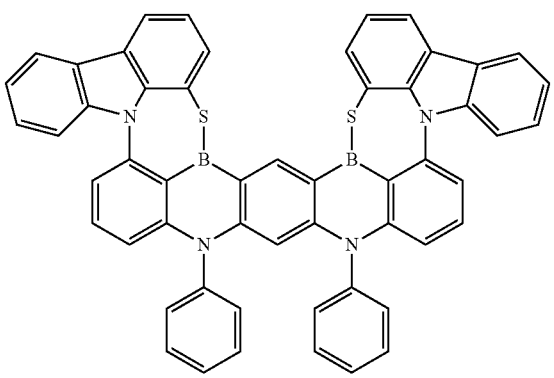
C-16
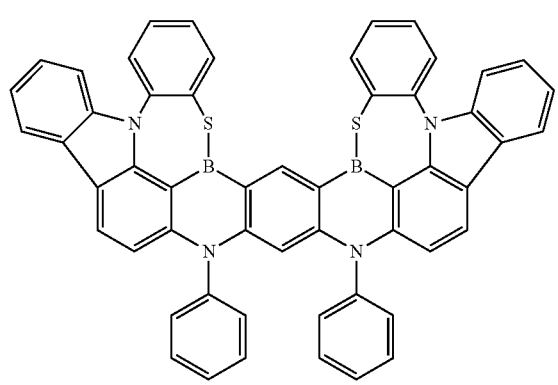
C-20
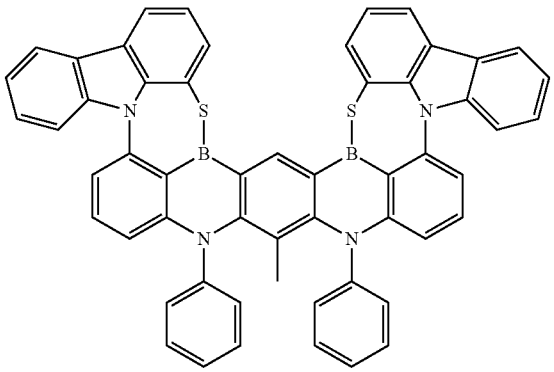

-continued
C-21
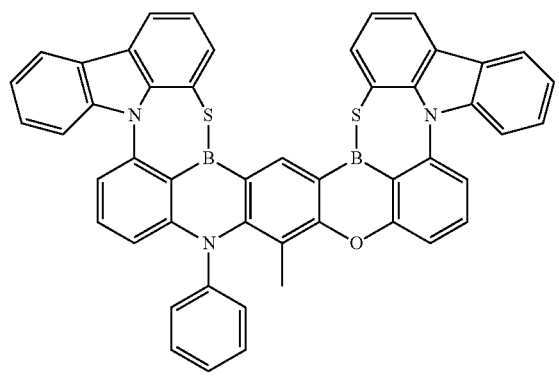
Compound Group D
D-1
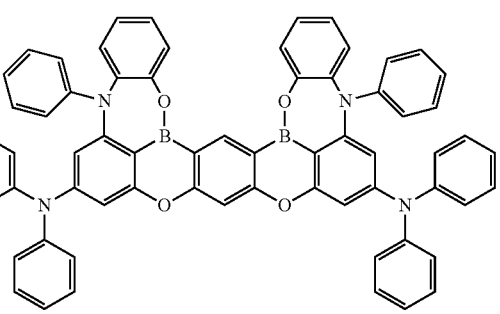
C-22
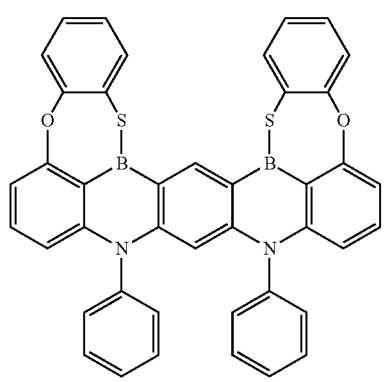
D-2
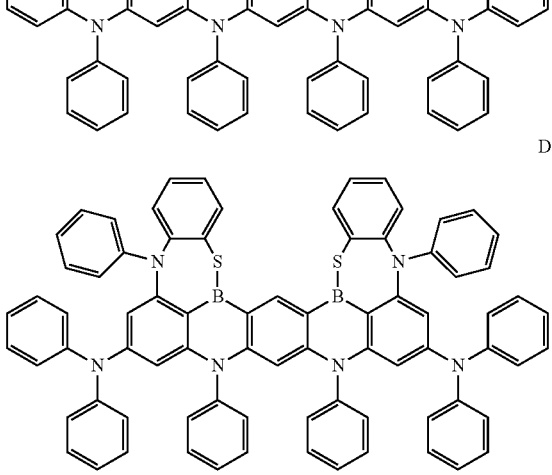
C-23
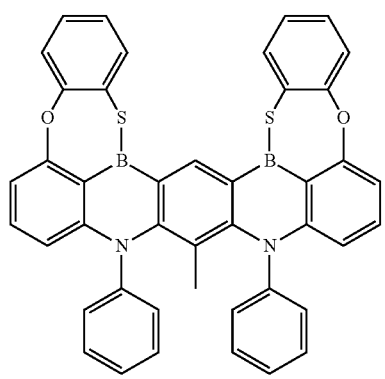
D-3
D-4
C-24
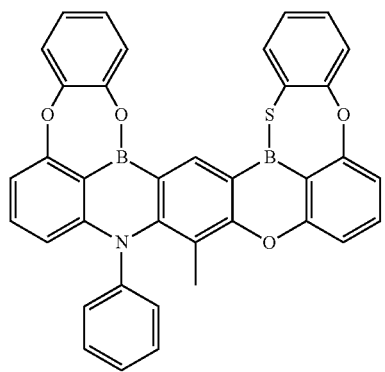
D-5
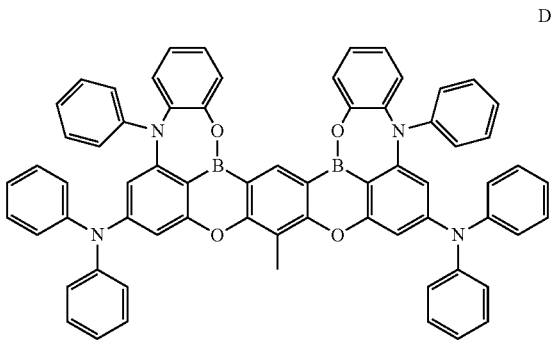

-continued
D-6
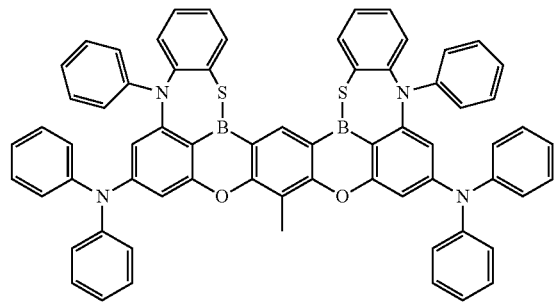
D-7
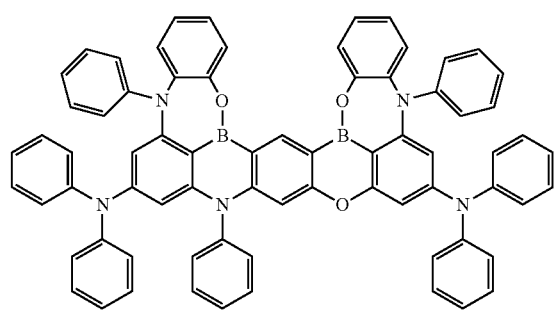
D-8
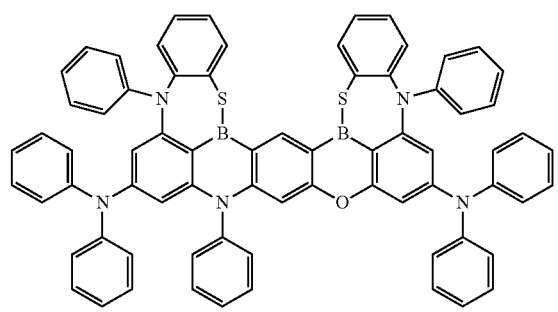
D-9
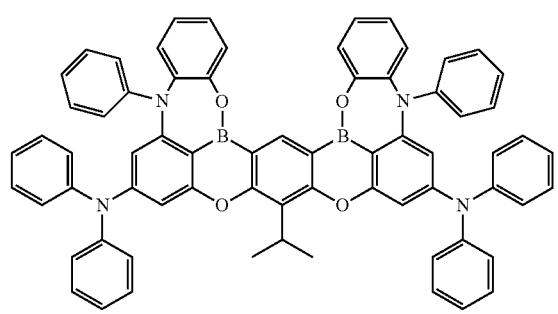
D-10
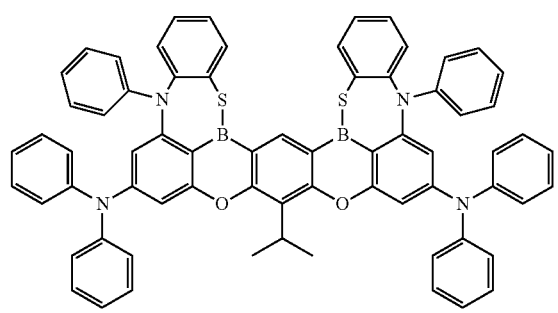
-continued
D-11
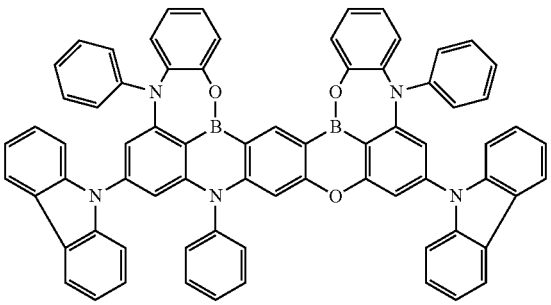
D-12
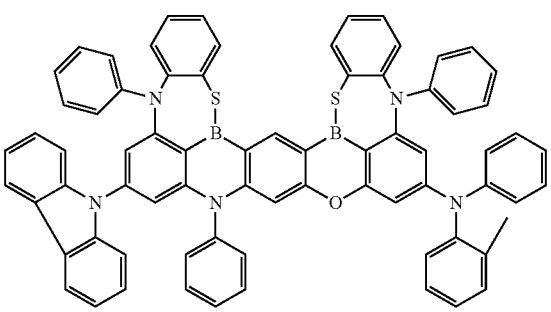
D-13
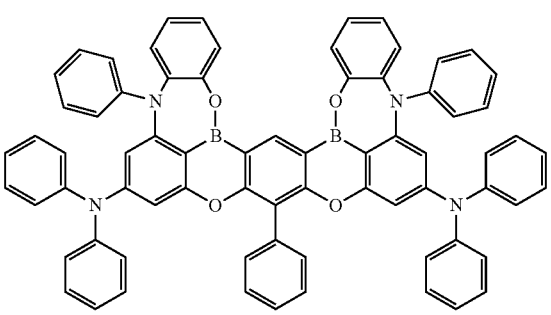
D-14
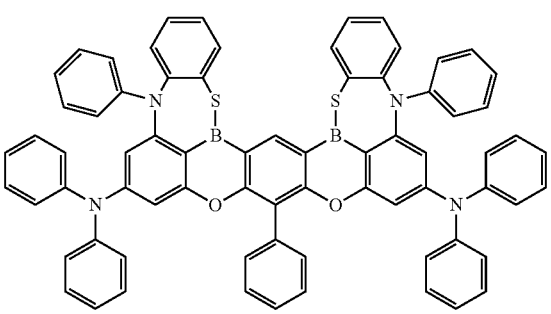
D-15

D-16
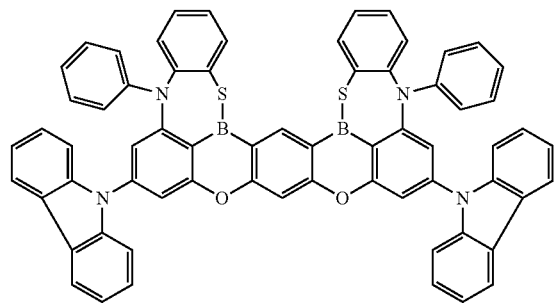
Compound Group D
E-1
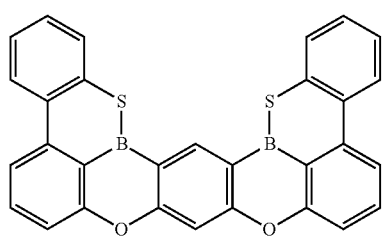
E-2
E-3
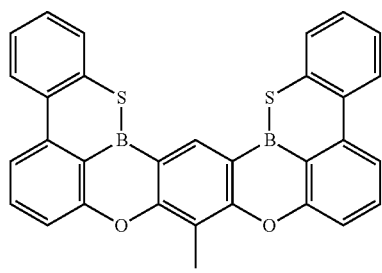
E-4
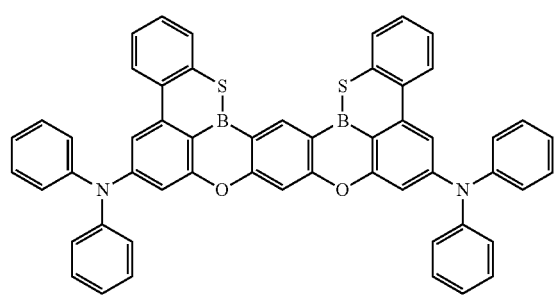
E-5
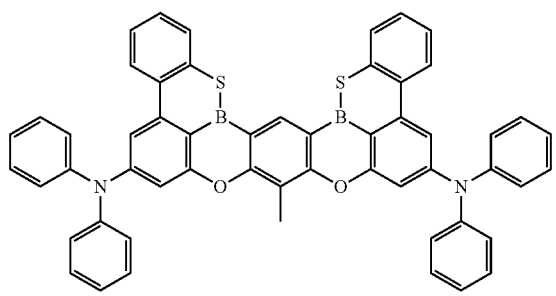
E-6
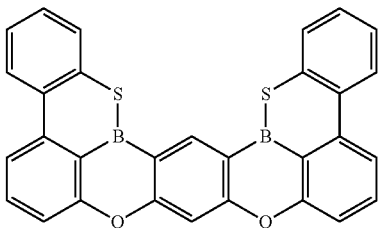
E-7
E-8
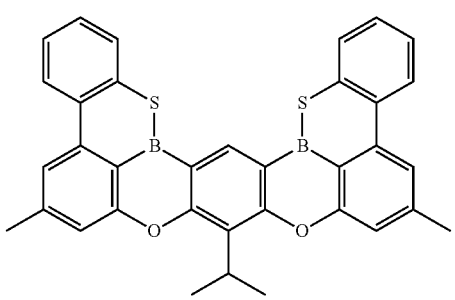
E-9
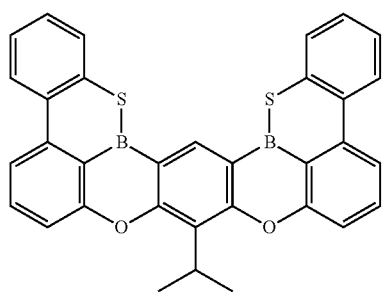

E-10
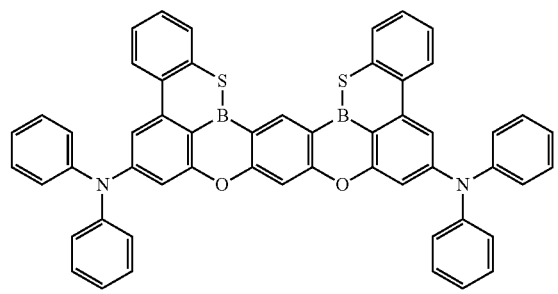
E-11
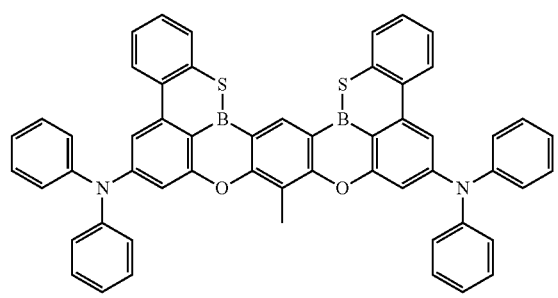
E-12
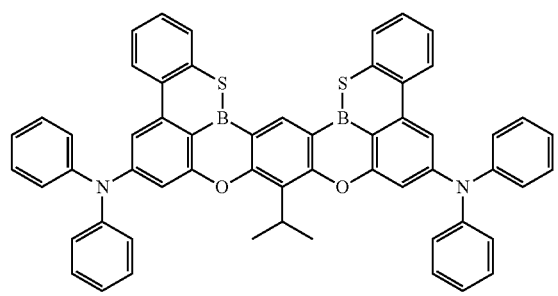
E-13
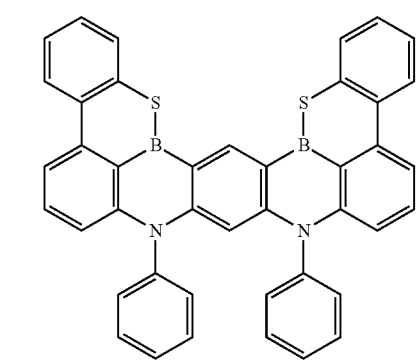
E-14
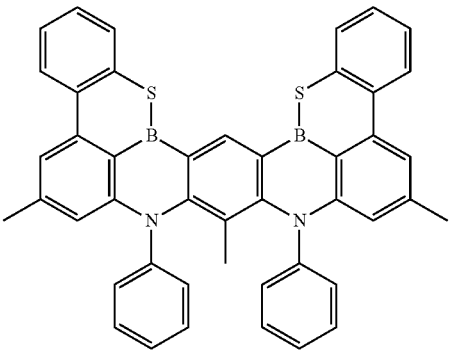
E-15
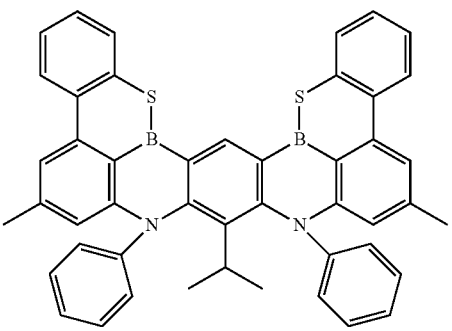
E-16
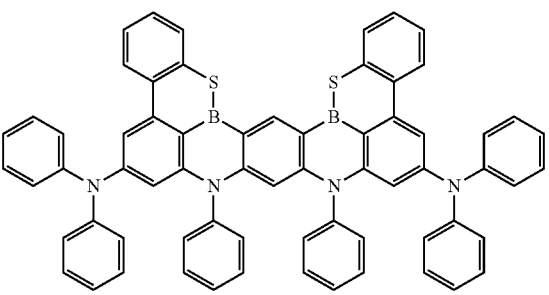
E-17
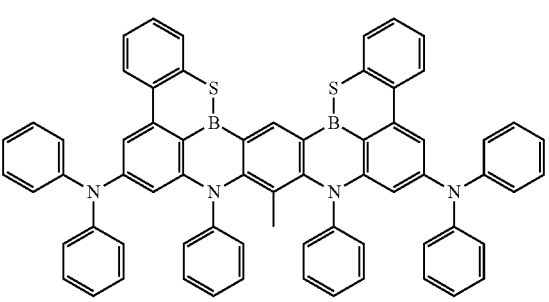
E-18
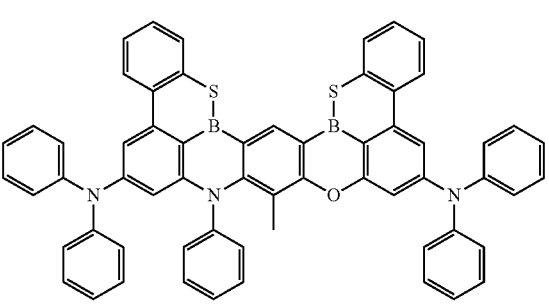

E-19
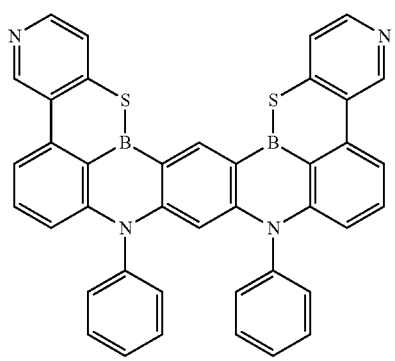
E-20
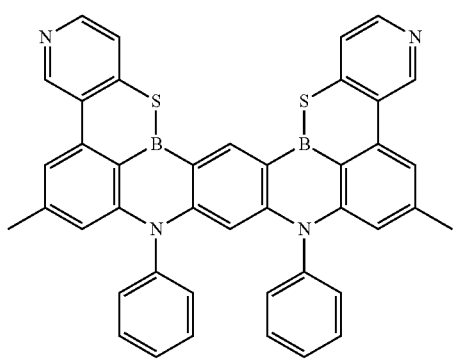
E-21
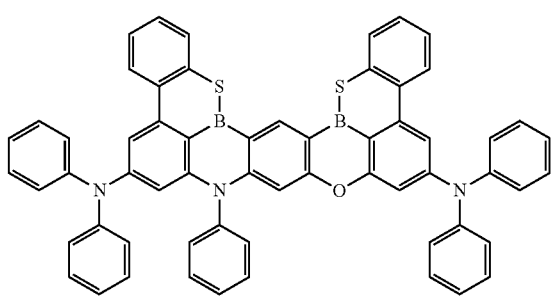
E-22
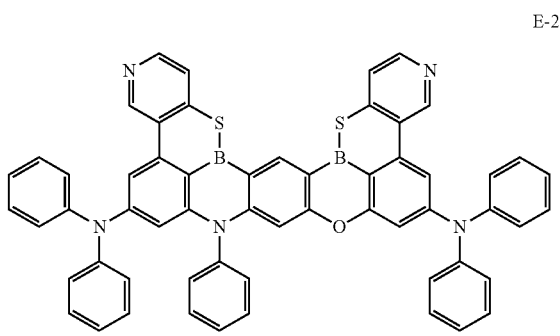
E-23
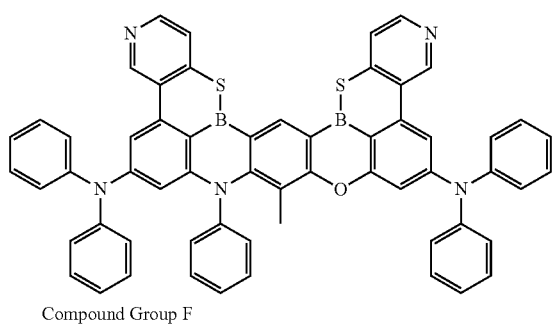
Compound Group F
F-1
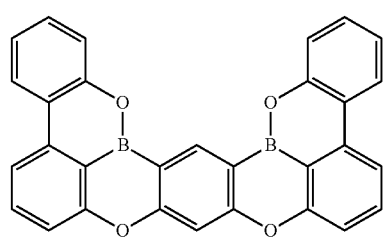
F-2
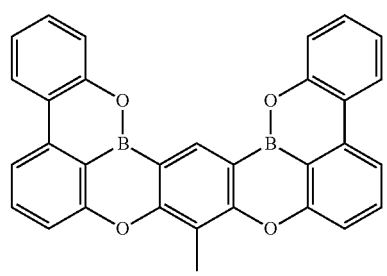
F-3
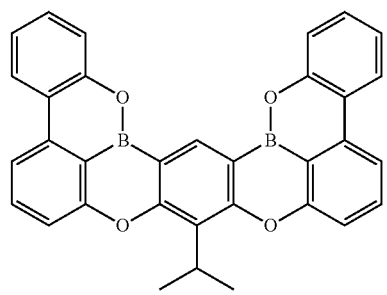
F-4
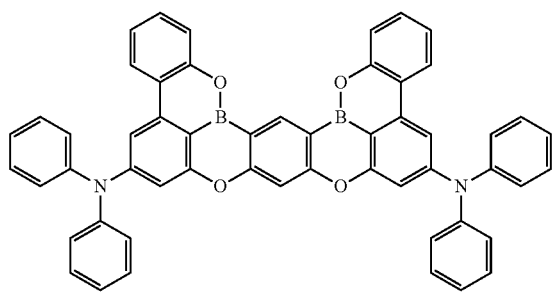

-continued
F-5
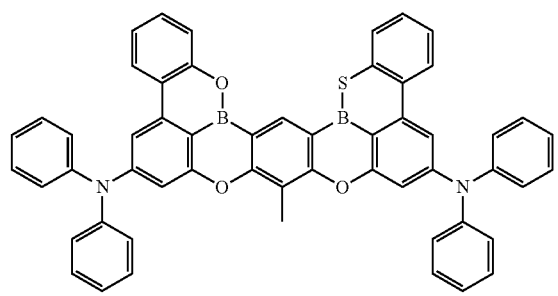
F-6
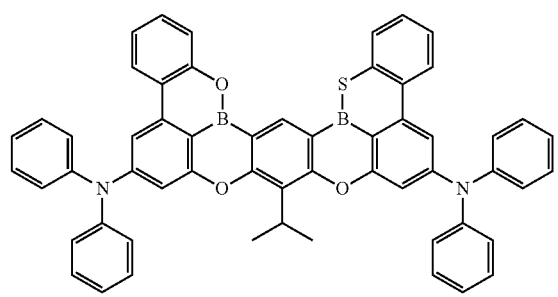
F-7
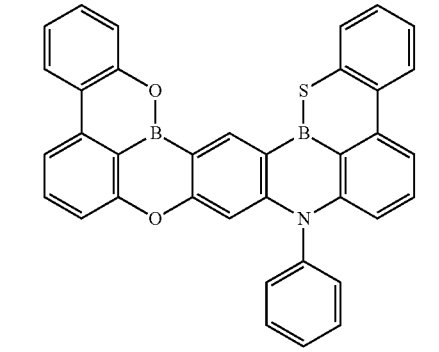
-continued
F-10
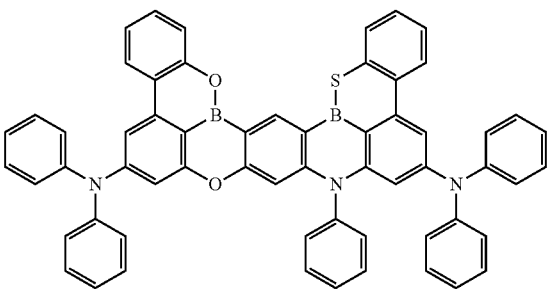
F-11
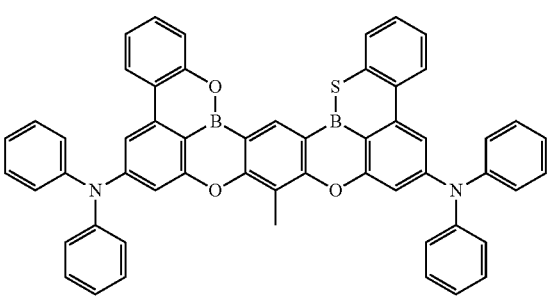
F-12
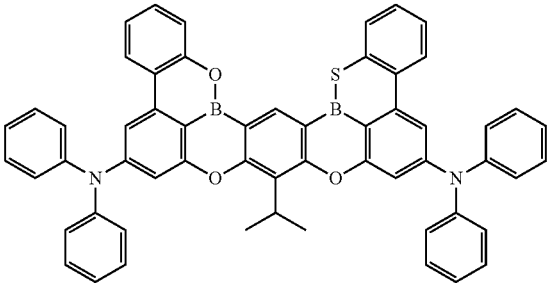
F-13
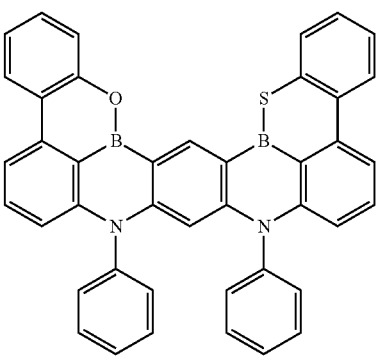

F-14
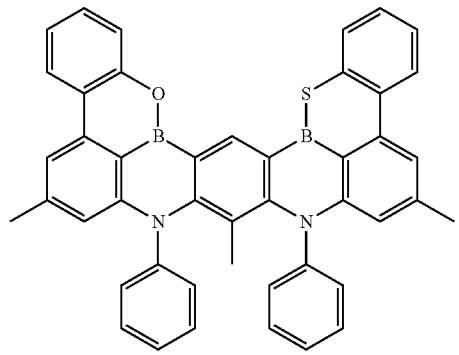
F-15
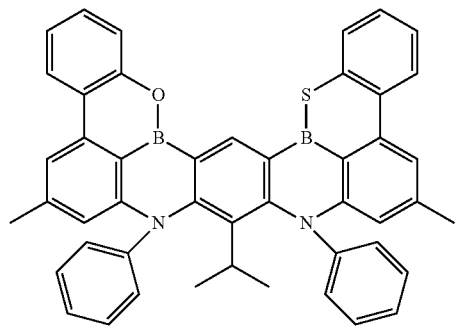
F-16
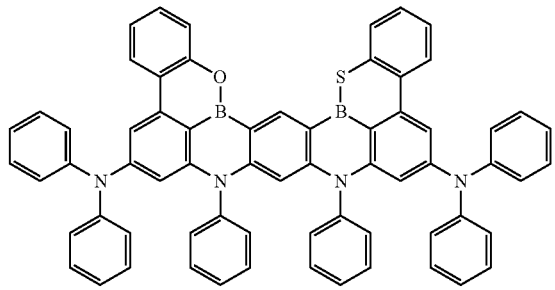
F-17
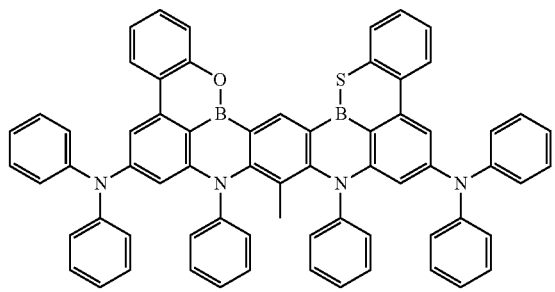
F-18
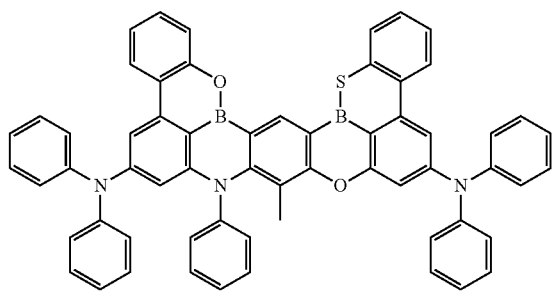
F-19
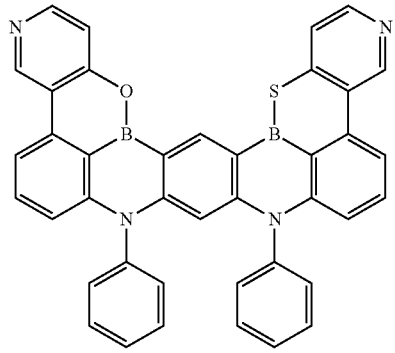
F-20
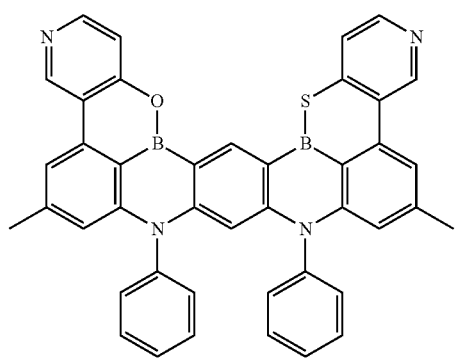
F-21
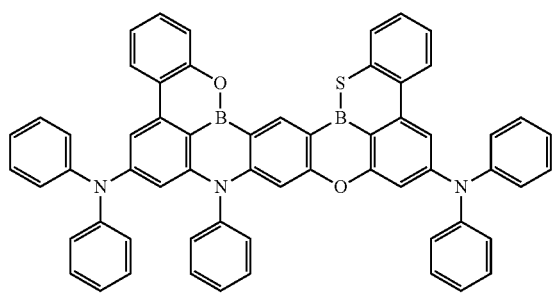
F-22
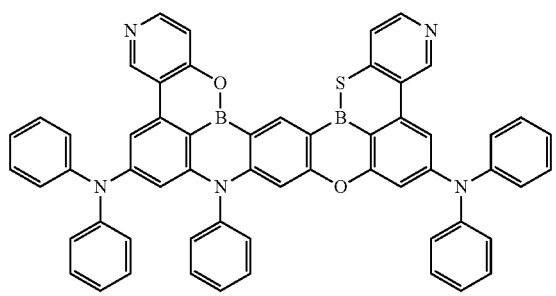

F-23

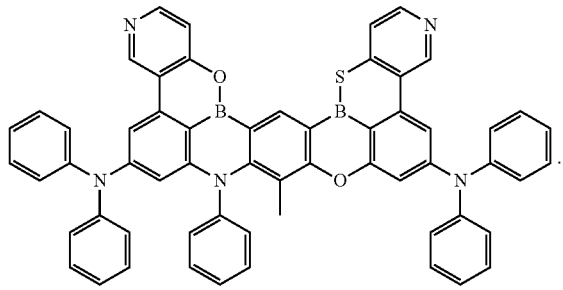

The polycyclic compound of an embodiment may be used as a blue light-emitting material. For example, the polycyclic compound according to an embodiment may be used as a blue light-emitting material having a center wavelength (λmax) of about 470 nm or less. For example, the polycyclic compound of an embodiment may be a light-emitting material having a center wavelength of about 430 nm to about 470 nm. The polycyclic compound of an embodiment represented by Formula 1 may be a blue light-emitting thermally activated delayed fluorescence dopant.

The polycyclic compound of an embodiment may have a stabilized molecular structure in which aromatic rings are combined via a B—O bond or a B—S bond, and may emit light having a narrow full width at half maximum due to having multiple resonance structures. For example, the organic electroluminescence device of an embodiment includes the polycyclic compound of an embodiment in an emission layer and may show long-life characteristics and/or excellent color reproducibility.

In the organic electroluminescent device 10 of an embodiment, the emission layer EML may be to emit delayed fluorescence. For example, the emission layer EML may be to emit thermally activated delayed fluorescence (TADF).

In some embodiments, the organic electroluminescence device 10 of an embodiment may include a plurality of emission layers. The plurality of emission layers may be provided as a stack. For example, the organic electroluminescence device 10 including a plurality of emission layers may be to emit white light. In some embodiments, the organic electroluminescence device including the plurality of emission layers may be an organic electroluminescence device having a tandem structure. When the organic electroluminescence device 10 includes a plurality of emission layers, at least one emission layer EML may include the polycyclic compound of an embodiment.

In an embodiment, the emission layer EML includes a host and a dopant, and may include the polycyclic compound of an embodiment as a dopant. For example, in the organic electroluminescence device 10 of an embodiment, the emission layer EML may include a host for emitting delayed fluorescence and a dopant for emitting delayed fluorescence, and may include the polycyclic compound as the dopant for emitting delayed fluorescence. The emission layer EML may include at least one among the polycyclic compounds represented in Compound Groups A through F as a thermally activated delayed fluorescence dopant.

In an embodiment, the emission layer EML may be a delayed fluorescence emission layer, and the emission layer EML may include any suitable host material and the above-described polycyclic compound of an embodiment. For example, in an embodiment, the polycyclic compound may be used as a TADF dopant.

The polycyclic compound of an embodiment may be a thermally activated delayed fluorescence (TADF) host, or a phosphorescent host. The emission layer EML including the polycyclic compound of an embodiment may be to emit phosphorescence or thermally activated delayed fluorescence. For example, the emission layer EML may be to emit thermally activated delayed fluorescence.

The emission layer EML may include one kind (e.g., structure) or two or more kinds of the polycyclic compounds in the Compound Groups.

In the organic electroluminescence device 10 of an embodiment, the emission layer EML may include any suitable host material. For example, the emission layer EML may include as a host material, at least one of bis[2-(diphenylphosphino)phenyl] ether oxide (DPEPO), 4,4'-bis(carbazol-9-yl)biphenyl (CBP), 1,3-bis(carbazol-9-yl)benzene (mCP), 2,8-bis(diphenylphosphoryl)dibenzo[b,d]furan (PPF), 4,4',4''-tris(carbazol-9-yl)-triphenylamine (TCTA), or 1,3,5-tris(1-phenyl-1H-benzo[d]imidazole-2-yl)benzene (TPBi). However, an embodiment of the present disclosure is not limited thereto. For example, tris(8-hydroxyquinolino)aluminum (Alq3), poly(N-vinylcarbazole) (PVK), 9,10-di(naphthalene-2-yl)anthracene (ADN), 3-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), hexaphenyl cyclotriphosphazene (CP1), 1,4-bis(triphenylsilyl)benzene (UGH2), hexaphenylcyclotrisiloxane (DPSiO₃), octaphenylcyclotetrasiloxane (DPSiO₄), etc., may be used as the host material.

In an embodiment, the emission layer EML may further include any suitable dopant material. In an embodiment, the dopant material may include styryl derivatives (for example, 1,4-bis[2-(3-N-ethylcarbazolyl)vinyl]benzene (BCzVB), 4-(di-p-tolylamino)-4'-[(di-p-tolylamino)styryl]stilbene (DPAVB), and N-(4-((E)-2-(6-((E)-4-(diphenylamino)styryl)naphthalen-2-yl)vinyl)phenyl)-N-phenylbenzenamine (N-BDAVBi)), perylene and derivatives thereof (for example, 2,5,8,11-tetra-t-butylperylene (TBP)), pyrene and derivatives thereof (for example, 1,1-dipyrene, 1,4-dipyrenylbenzene, 1,4-bis(N,N-diphenylamino)pyrene), etc.

In the organic electroluminescence device 10 of an embodiment, as shown in FIGS. 1 to 4, the electron transport region ETR is provided on the emission layer EML. The electron transport region ETR may include at least one of an electron blocking layer HBL, an electron transport layer ETL, or an electron injection layer EIL. However, an embodiment of the present disclosure is not limited thereto.

The electron transport region ETR may include a single layer formed using a single material, a single layer formed using a plurality of different materials, or a multilayer structure having a plurality of layers formed using a plurality of different materials.

For example, the electron transport region ETR may have a single layer structure of an electron injection layer EIL or an electron transport layer ETL, or a single layer structure formed using an electron injection material and an electron transport material. Further, the electron transport region ETR may have a single layer structure having a plurality of different materials, or a structure stacked from the emission layer EML of electron transport layer ETL/electron injection layer EIL, or hole blocking layer HBL/electron transport layer ETL/electron injection layer EIL, without limitation. The thickness of the electron transport region ETR may be, for example, about 1,000 Å to about 1,500 Å.

The electron transport region ETR may be formed using any suitable method (such as a vacuum deposition method, a spin coating method, a cast method, a Langmuir-Blodgett (LB) method, an inkjet printing method, a laser printing method, and/or a laser induced thermal imaging (LITI) method).

When the electron transport region ETR includes an electron transport layer ETL, the electron transport region ETR may include an anthracene-based compound. The electron transport region may include, for example, tris(8-hydroxyquinolinato)aluminum (Alq3), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazolyl-1-ylphenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato) aluminum (BAlq), beryllium bis(benzoquinolin-10-olate (Bebq2), 9,10-di(naphthalene-2-yl)anthracene (ADN), 1,3-bis[3,5-di(pyridine-3-yl)phenyl]benzene (BmPyPhB), or a mixture thereof, without limitation. The thickness of the electron transport layer ETL may be about 100 Å to about 1,000 Å and may be, for example, about 150 Å to about 500 Å. When the thickness of the electron transport layer ETL satisfies the above-described range, satisfactory electron transport properties may be obtained without substantial increase of a driving voltage.

When the electron transport region ETR includes the electron injection layer EIL, the electron transport region ETR may include a metal halide (such as LiF, NaCl, CsF, RbCl, and/or RbI), a lanthanide metal (such as ytterbium (Yb)), a metal oxide (such as $Li_2O$ and/or BaO), or lithium quinolate (e.g., 8-hydroxyl-lithium quinolate). However, an embodiment of the present disclosure is not limited thereto. The electron injection layer EIL may also be formed using a mixture of an electron transport material and an insulating organo metal salt. The organo metal salt may be a material having an energy band gap of about 4 eV or more. For example, the organo metal salt may include a metal acetate, a metal benzoate, a metal acetoacetate, a metal acetylacetonate, or a metal stearate. The thickness of the electron injection layer EIL may be about 1 Å to about 100 Å, and about 3 Å to about 90 Å. When the thickness of the electron injection layer EIL satisfies the above described range, satisfactory electron injection properties may be obtained without inducing substantial increase of a driving voltage.

The electron transport region ETR may include a hole blocking layer HBL as described above. The hole blocking layer HBL may include, for example, at least one of 2,9-dimethyl-4,7-diphenyl-1,10-phenanthroline (BCP), or 4,7-diphenyl-1,10-phenanthroline (Bphen). However, an embodiment of the present disclosure is not limited thereto.

The second electrode EL2 is provided on the electron transport region ETR. The second electrode EL2 may be a common electrode or a cathode. The second electrode EL2 may be a transmissive electrode, a transflective electrode, or a reflective electrode. When the second electrode EL2 is a transmissive electrode, the second electrode EL2 may include a transparent metal oxide, for example, ITO, IZO, ZnO, ITZO, etc.

When the second electrode EL2 is a transflective electrode or a reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (for example, a mixture of Ag and Mg). The second electrode EL2 may have a multilayered structure including a reflective layer or a transflective layer formed using the above-described materials and a transparent conductive layer formed using ITO, IZO, ZnO, ITZO, etc.

In some embodiments, the second electrode EL2 may be connected with an auxiliary electrode. When the second electrode EL2 is connected with an auxiliary electrode, the resistance of the second electrode EL2 may decrease.

In some embodiments, a capping layer CPL may be further disposed on the second electrode EL2 of the organic electroluminescence device 10 of an embodiment. The capping layer CPL may include, for example, α-NPD, NPB, TPD, m-MTDATA, Alq3, CuPc, N4,N4,N4',N4'-tetra(biphenyl-4-yl) biphenyl-4,4'-diamine (TPD15), 4,4',4"-tris(carbazol-9-yl) triphenylamine (TCTA), etc.

In the organic electroluminescence device 10, during the application of a voltage across the first electrode EL1 and the second electrode EL2, holes injected from the first electrode EL1 may move through a hole transport region HTR to the emission layer EML, and electrons injected from the second electrode EL2 may move through an electron transport region ETR to the emission layer EML. Electrons and holes may recombine in the emission layer EML to produce excitons, and light may be emitted due to the transition of the excitons from an excited state to the ground state.

The organic electroluminescence device 10 according to an embodiment of the present disclosure includes the polycyclic compound of an embodiment in the emission layer EML disposed between the first electrode EL1 and the second electrode EL2, and thereby shows excellent emission efficiency and a narrow full width at half maximum in a light-emitting wavelength region of blue light. In some embodiments, the polycyclic compound according to an embodiment may be to emit thermally activated delayed fluorescence, and the emission layer EML may include the polycyclic compound of an embodiment to emit thermally activated delayed fluorescence and show high emission efficiency properties.

In some embodiments, the compound of an embodiment may be included in an organic layer other than the emission layer EML as a material for the organic electroluminescence device 10. For example, the organic electroluminescence device 10 according to an embodiment of the present disclosure may include the compound in at least one functional layer disposed between the first electrode EL1 and the second electrode EL2, or in a capping layer CPL disposed on the second electrode EL2.

The polycyclic compound of an embodiment may have a stabilized molecular structure in which aromatic rings are combined via a B—O bond or a B—S bond, includes a plurality of condensed aromatic rings capable of multiple resonance structures, and has a high lowest triplet excitation energy level, and may accordingly be used as a material for delayed fluorescence emission. In addition, an organic electroluminescence device including the polycyclic compound of an embodiment in the emission layer may emit blue light having a narrow full width at half maximum and may show long-life characteristics.

Hereinafter, the polycyclic compound according to an embodiment and the organic electroluminescence device of an embodiment of the present disclosure will be particularly explained referring to embodiments and comparative embodiments. Embodiments are only illustrations to assist the understanding of the present disclosure, and the scope of the present disclosure is not limited thereto.

1. Synthetic Examples

The polycyclic compound according to an embodiment may be synthesized, for example, as follows. However, the synthetic method of the polycyclic compound explained below is an example method, and synthetic methods of the polycyclic compound according to an embodiment of the present disclosure are not limited thereto.

A. Synthesis of Compound B-1

[Reaction 1]

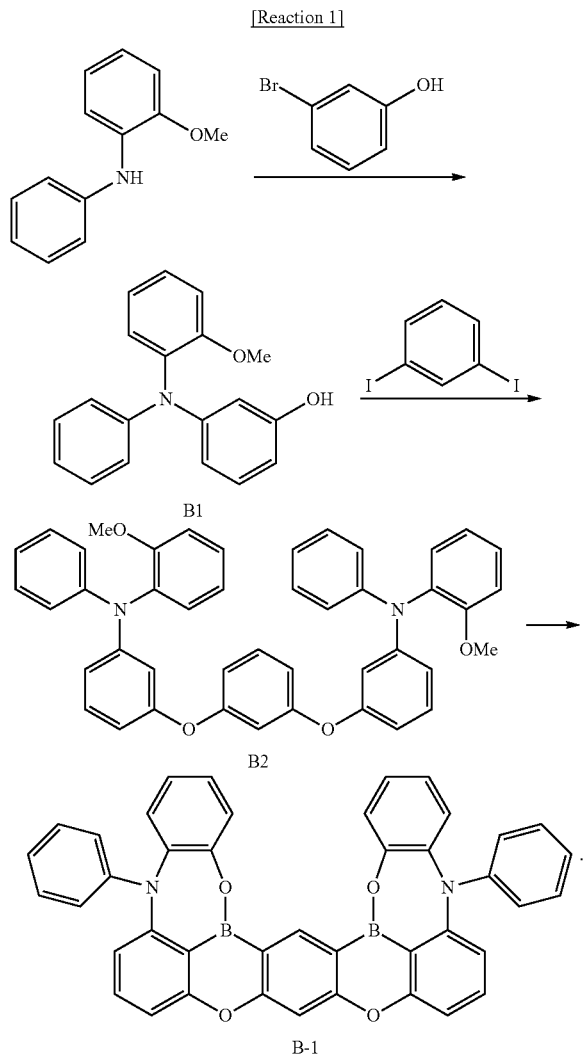

(1) Synthesis of Intermediate Compound B13

A toluene solution (350 ml) including 2-methoxy-N-phenylaniline (27 g), 3-bromophenol (20 g), sodium butoxide (26 g), $Pd_2(dba)_3$ (2 g) and $Ph(^tBu)_3/BF_4$ (2.5 g) was heated and refluxed in an oil bath for about 3 hours. After cooling to room temperature, the reaction solution was poured into water. A target material was extracted with toluene, dried with magnesium sulfate. and concentrated under reduced pressure. The mixture thus obtained was separated by silica gel chromatography to obtain 28 g (yield 83%) of Intermediate Compound B1.

(2) Synthesis of Intermediate Compound B2

A DMSO (120 mL) solution including Intermediate Compound B1 (28 g), 1,3-diiodobenzene (14.4 g), potassium carbonate (26.6 g), copper iodide (0.4 g), and iron (III) acetylacetonate (1.5 g) was heated and stirred at about 150° C. for about 15 hours. After cooling to room temperature, the reaction solution was poured into water. A target material was extracted with ethyl acetate, dried with magnesium sulfate, and concentrated under reduced pressure. The mixture thus obtained was separated by silica gel chromatography to obtain 23 g (yield 80%) of Intermediate Compound B2.

(3) Synthesis of Compound B-1

To a 1,2-dichlorobenzene (100 mL) solution including Intermediate Compound B2 (5 g) obtained above, a heptane solution (17.5 mL) of 1 M boron tribromide was added under ice cooling. After finishing dropwise addition, the reactants were heated and stirred under heating conditions of about 80° C. for about 20 hours. After cooling to room temperature, N,N-diisopropylethylamine (6 mL) was added thereto, followed by stirring. The reaction solvents were removed by distillation under reduced pressure. The mixture thus obtained was separated by silica gel chromatography to obtain 2 g (yield 40%) of a target material. Using FAB-MS measurement, the molecular weight of the target material was confirmed as 644. Compound B-1 thus obtained was separated further by sublimation, and used as a specimen for evaluation. By the measurement of light-emitting spectrum of a device, the emission wavelength of Compound B-1 was evaluated as about 453 nm.

B. Synthesis of Compound D-1

[Reaction 2]

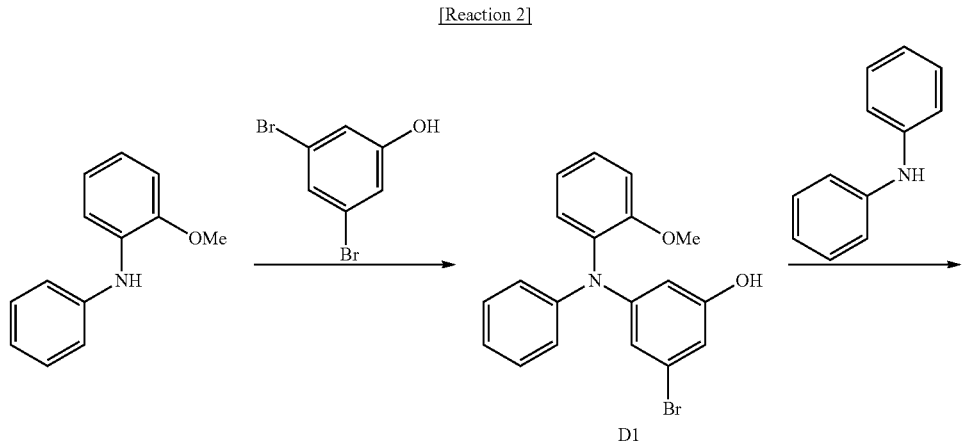

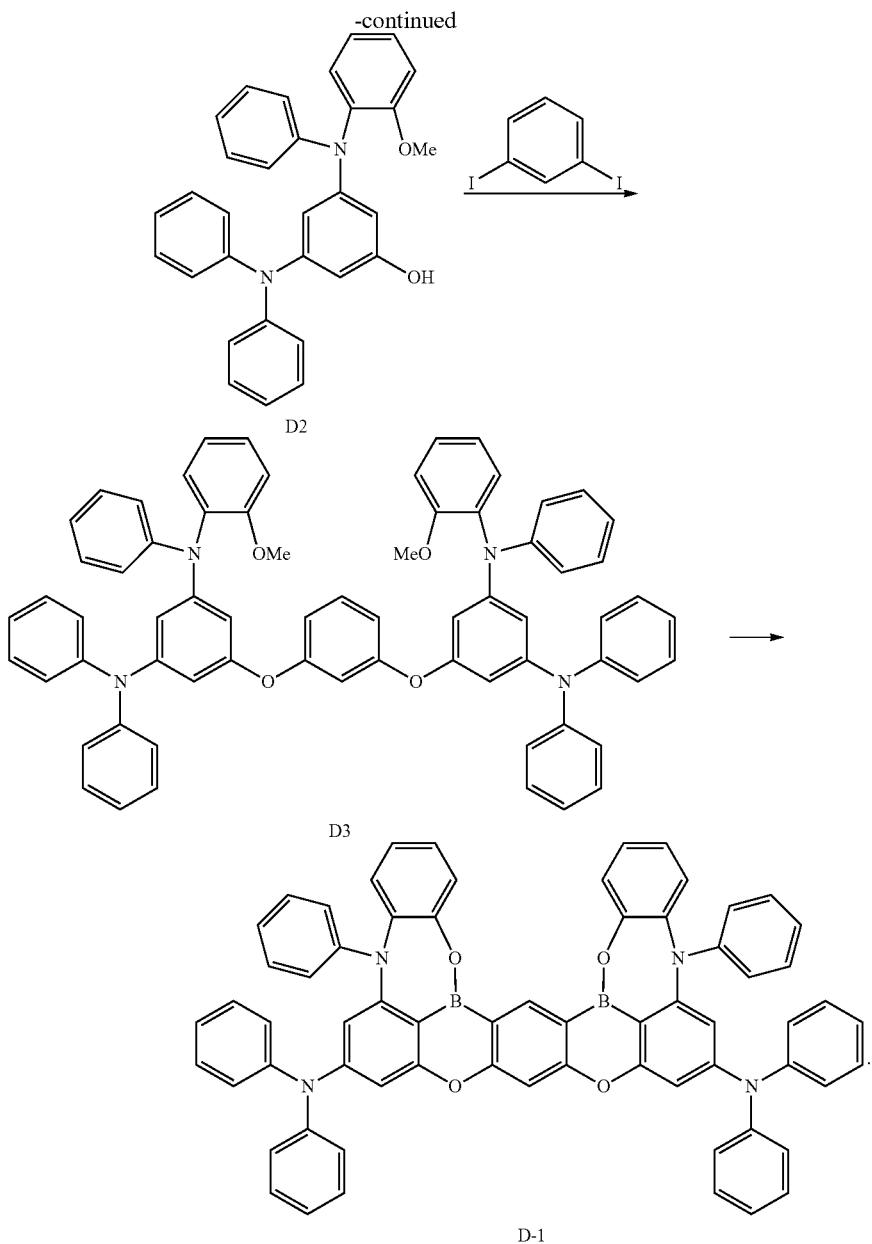

(1) Synthesis of Intermediate Compound D1

A toluene (200 mL) solution including 2-methoxy-N-phenylaniline (10 g), 3,5-dibromophenol (20 g), sodium butoxide (13 g), $Pd_2(dba)_3$ (1 g) and $Ph(^tBu)_3/BF_4$ (1.3 g) was heated and refluxed under heating conditions in an oil bath for about 3 hours. After cooling to room temperature, the reaction solution was poured into water. A target material was extracted with toluene, dried with magnesium sulfate, and concentrated under a reduced pressure. The mixture thus obtained was separated by silica gel chromatography to obtain 13 g (yield 70%) of Intermediate Compound D1.

(2) Synthesis of Intermediate Compound D2

A toluene (200 mL) solution including Intermediate Compound D1 (13 g), diphenylaniline (7.1 g), sodium butoxide (13 g), $Pd_2(dba)_3$ (1 g) and $Ph(^tBu)_3/BF_4$ (1.3 g) was heated and refluxed under heating conditions in an oil bath for about 3 hours. After cooling to room temperature, the reaction solution was poured into water. A target material was extracted with toluene, dried with magnesium sulfate, and concentrated under reduced pressure. The mixture thus obtained was separated by silica gel chromatography to obtain 13 g (yield 81%) of Intermediate Compound D2.

(3) Synthesis of Compound D-1

3.2 g of Target Compound D-1 was obtained by performing the reaction of Intermediate Compound D2 with 1,3-diiodobenzene, followed by the reaction of Intermediate Compound D3 with boron tribromide as in the synthetic example of B-1. Using FAB-MS measurement, the molecular weight of the target material was confirmed as 978. The compound thus obtained was separated further by sublimation and used as a specimen for evaluation.

By the measurement of light-emitting spectrum of a device, the emission wavelength of Compound D-1 was evaluated as about 450 nm.

C. Synthesis of Compound E-16

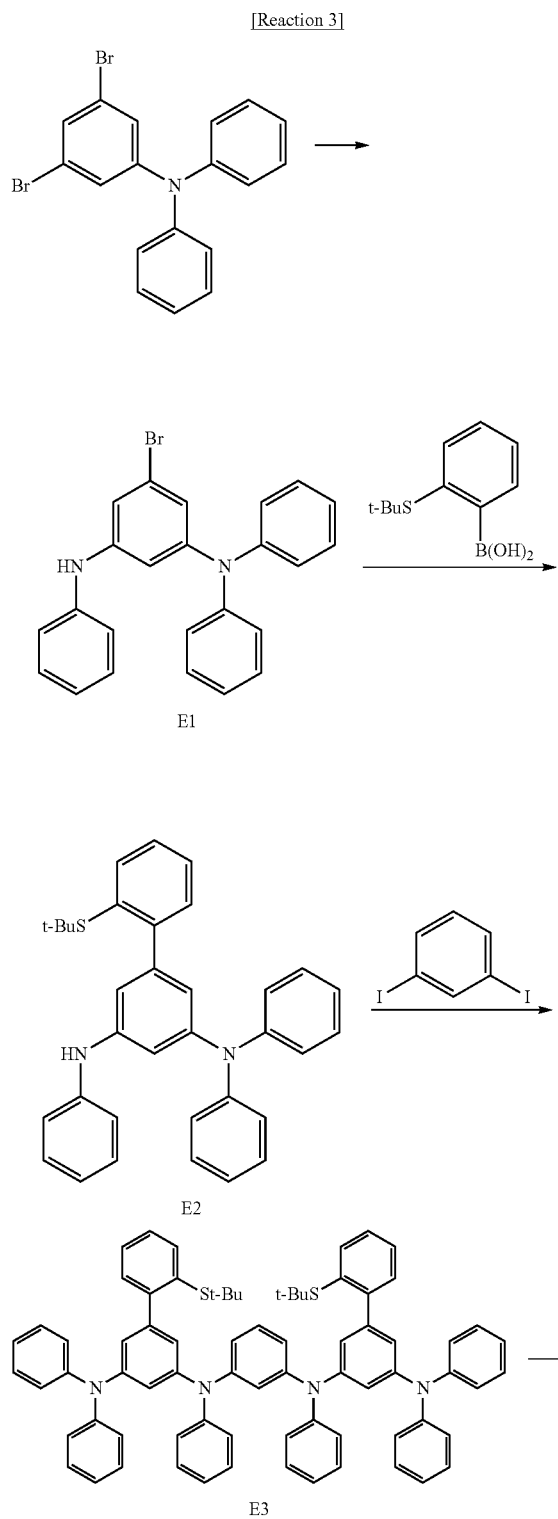

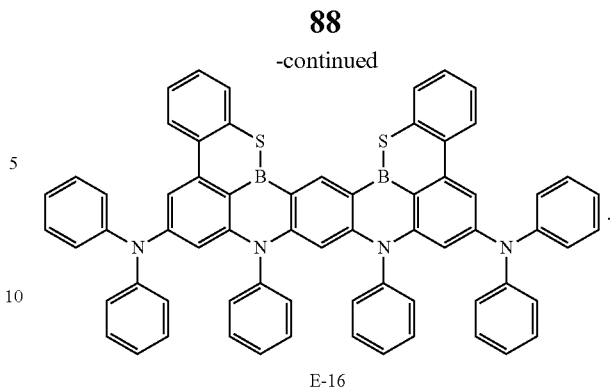

E-16

(1) Synthesis of Intermediate Compound E1

A toluene (200 mL) solution including 3,5-dibromo-N,N-diphenylaniline (20 g), aniline (3.7 g), sodium butoxide (6 g), $Pd_2(dba)_3$ (0.5 g) and $Ph(^tBu)_3/BF_4$ (0.7 g) was heated and refluxed under heating conditions in an oil bath for about 3 hours. After cooling to room temperature, the reaction solution was poured into water. A target material was extracted with toluene, dried with magnesium sulfate, and concentrated under a reduced pressure. The mixture thus obtained was separated by silica gel chromatography to obtain 13 g (yield 78%) of Intermediate Compound E1.

(2) Synthesis of Intermediate Compound E2

A mixture solution of toluene (200 mL) and water (70 mL), including Intermediate Compound E1 (13 g), (2-(tert-butylthio)phenyl)boronic acid (8.5 g), potassium carbonate (11 g) and $Pd(PPh_3)_4$ (0.5 g) was heated at about 80° C. for about 24 hours. After cooling to room temperature, the reaction solution was poured into water. A target material was extracted with toluene, dried with magnesium sulfate, and concentrated under a reduced pressure. The mixture thus obtained was separated by silica gel chromatography to obtain 9.6 g (yield 62%) of Intermediate Compound E2.

(3) Synthesis of Compound E-16

2.4 g of Target Compound E-16 was obtained by performing i the reaction of Intermediate Compound E2 with 1,3-diiodobenzene, followed by the reaction of Intermediate Compound E3 with boron tribromide as in the synthetic example of B-1. Using FAB-MS measurement, the molecular weight of the target material was confirmed as 978. The compound thus obtained was separated further by sublimation, and used as a specimen for evaluation. By the measurement of light-emitting spectrum of a device, the emission wavelength of Compound E-16 was evaluated as about 460 nm.

2. Evaluation of Energy Level of Compound

Evaluation of the light-emitting properties of the polycyclic compound of an embodiment and an organic electroluminescence device of an embodiment including the polycyclic compound of an embodiment in an emission layer, was conducted using the methods described below. The manufacturing method of an organic electroluminescence device for the device evaluation is described below.

The organic electroluminescence devices of Example 1 to Example 3 were manufactured using the polycyclic compounds of Compounds B-1, D-1 and E-16, respectively, as dopant materials for an emission layer. The organic electroluminescence devices of Comparative Example 1 and Comparative Example 2 were manufactured using Comparative Compounds C1 and C2, respectively, as dopant materials of an emission layer.

The compounds used as the dopant materials in Example 1 to Example 3 and Comparative Example 1 and Comparative Example 2 are as follows.
TABLE 1
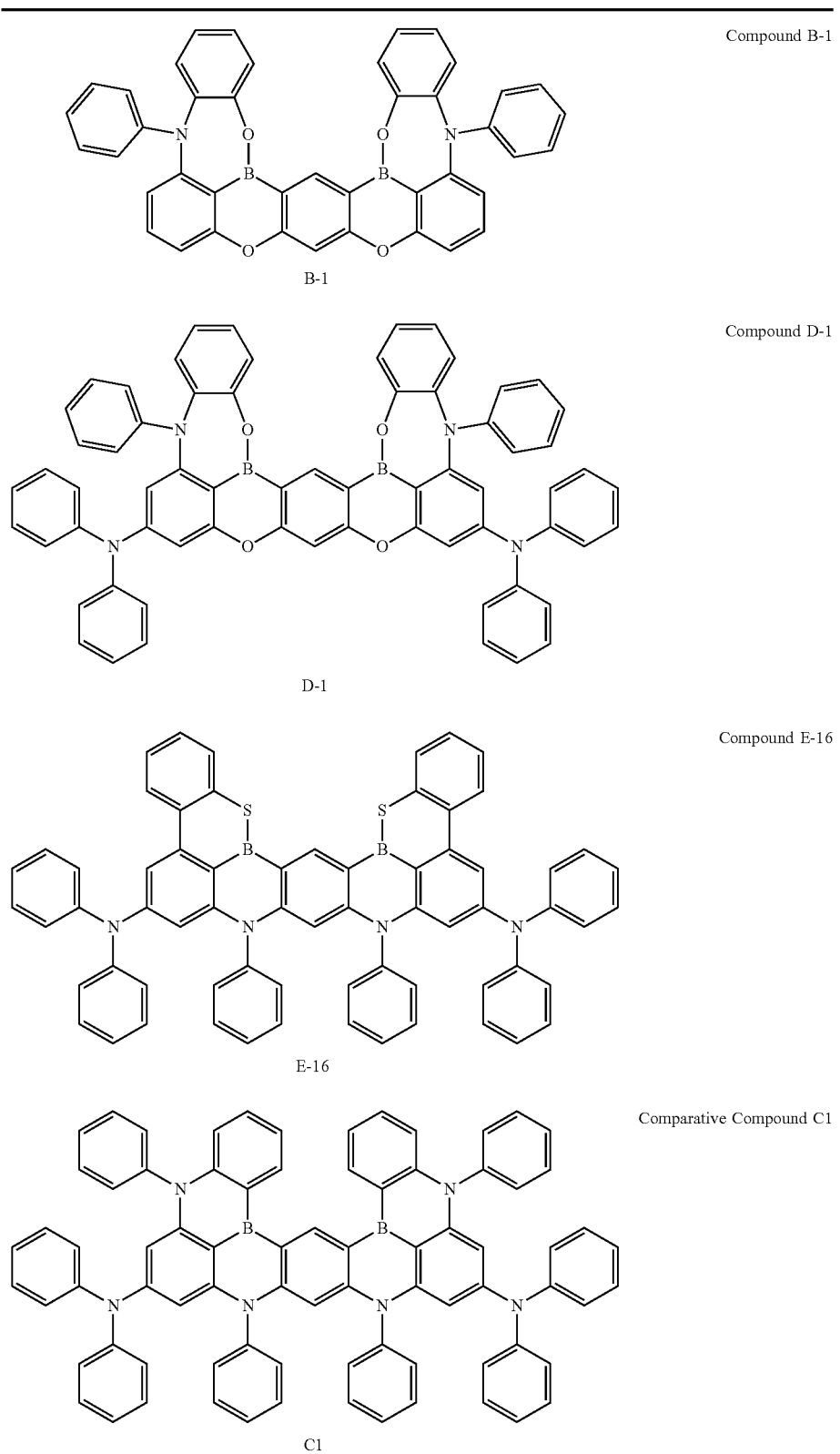

TABLE 1-continued

Comparative Compound C2

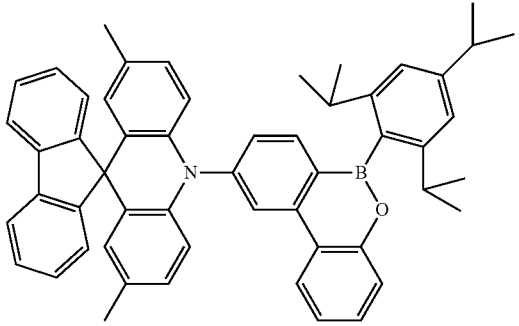

C2

Manufacture of Organic Electroluminescence Device

On a glass substrate, ITO with a thickness of about 1,500 Å was patterned and washed with ultra-pure water, cleaned with ultrasonic waves, exposed to UV for about 30 minutes, and treated with ozone. Then, HAT-CN was deposited to a thickness of about 100 Å, α-NPD was deposited to about 800 Å, and mCP was deposited to a thickness of about 50 Å to form a hole transport region.

Then, the polycyclic compound of an embodiment or the Comparative Compound and a host material were co-deposited in a ratio of 6:94 to form a layer into a thickness of about 200 Å to form an emission layer. For example, a co-deposited emission layer was formed by mixing Compound B-1, D-1 and E-16 with the host material of Example 1 to Example 3, respectively, or Comparative Compounds C1 and C2 with the host material of Comparative Examples 1 and 2, respectively. mCP was used as the co-deposited host material in the emission layer.

After that, on the emission layer, a layer with a thickness of about 100 Å was formed using DPEPO, a layer with a thickness of about 300 Å was formed using TPBi, and a layer with a thickness of about 50 Å was formed using LiF in order to form an electron transport region. Then, a second electrode with a thickness of about 1,000 Å was formed using aluminum (Al).

In the Examples, the hole transport region, the emission layer, the electron transport region, and the second electrode were formed using a vacuum deposition apparatus.

Compounds of Functional Layers

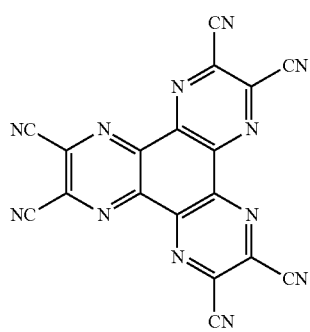

NPD

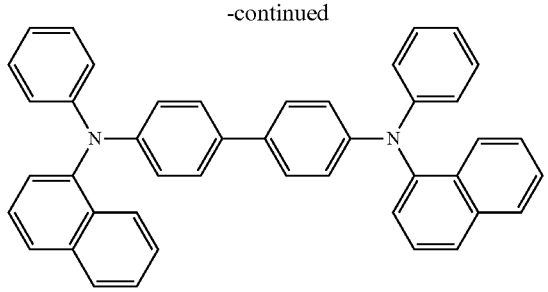

mCP

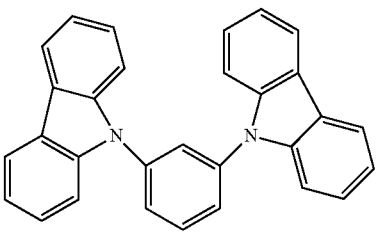

HAT-CN

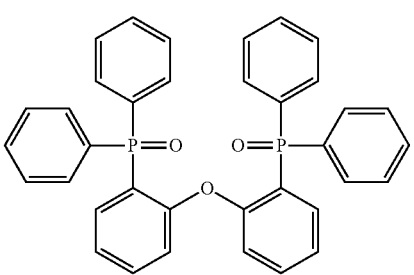

DPEPO

-continued

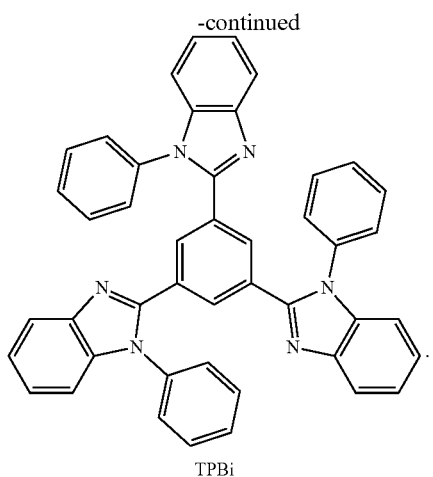

TPBi

Evaluation of Properties of Organic Electroluminescence Device

In Table 2, the evaluation results of organic electroluminescence devices of Example 1 to Example 3, Comparative Example 1, and Comparative Example 2 are shown. In Table 2, the full width at half maximum (FWHM), maximum emission wavelength (λmax), and device life of the organic electroluminescence devices thus manufactured are compared and shown. In the evaluation results for the Examples and the Comparative Examples, as shown in Table 2, the maximum emission wavelength (λmax) corresponds to the maximum value in the emission spectrum, and the device life is shown as a relative value with respect to Comparative Example 1 (which is set to 100%).

TABLE 2

| Division | Dopant material | Full width at half maximum (nm) | $\lambda_{max}$ (nm) | Device life (%) |
| --- | --- | --- | --- | --- |
| Example 1 | Compound B-1 | 35 | 453 | 130 |
| Example 2 | Compound D-1 | 34 | 450 | 143 |
| Example 3 | Compound E-16 | 30 | 460 | 157 |
| Comparative Example 1 | Comparative Compound C1 | 18 | 467 | 100 |
| Comparative Example 2 | Comparative Compound C2 | 67 | 448 | 82 |

Referring to the results of Table 2, it could be confirmed that the organic electroluminescence devices of Example 1 to Example 3 emitted light in a blue wavelength region of about 470 nm or less and had a narrow full width at half maximum of less than about 40 nm. In addition, it could be found that the organic electroluminescence devices of Example 1 to Example 3, including the polycyclic compound of an embodiment showed excellent device life characteristics. In comparison, in Comparative Example 1, aromatic rings are combined with each other, and a cross-linked structure is shown. Accordingly, a narrow full width at half maximum of about 18 nm was shown. Without being bound by the correctness of any theory or explanation, it is thought that because Comparative Compound C1 does not include a B—O or B—S direct bond, its device life characteristics were lower than the Examples. In Comparative Example 2, a polycyclic compound with a structure including a B—O direct bond was used, but Comparative Compound C2 does not have a multiple resonance molecular structure. Accordingly, it could be found that a full width at half maximum was large, and device characteristics were low.

Without being bound by the correctness of any theory or explanation, it is thought that because the polycyclic compound of an embodiment includes a direct bond moiety of B—O or B—S, the combined condensed rings stabilize a molecular structure and contribute to the improvement of the long-life characteristics of a device.

In addition, because the polycyclic compound has a multiple resonance molecular structure, the molecular structure may be stabilized even in an excited state, and light may be emitted with a narrow full width at half maximum.

The organic electroluminescence device of an embodiment includes the polycyclic compound of an embodiment in an emission layer, to thereby emit light having a narrow full width at half maximum, with excellent color properties and improved lifespan characteristics.

The organic electroluminescence device according to an embodiment of the present disclosure may achieve long life.

The polycyclic compound according to an embodiment of the present disclosure may be applied to an organic electroluminescence device to achieve long life.

As used herein, the terms "substantially", "about", and similar terms are used as terms of approximation and not as terms of degree, and are intended to account for the inherent deviations in measured or calculated values that would be recognized by those of ordinary skill in the art.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Although example embodiments of the present disclosure have been described, it is understood that the present disclosure should not be limited to these example embodiments, but that various changes and modifications can be made by one ordinary skilled in the art within the spirit and scope of the present disclosure, as set forth in the following claims and their equivalents.

F-23
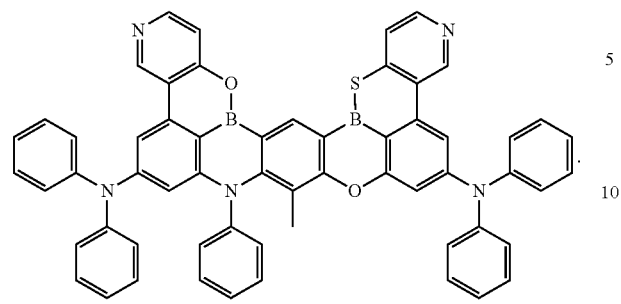

What is claimed is:

1. An organic electroluminescence device, comprising:
    a first electrode;
    a second electrode opposite the first electrode; and
    an emission layer between the first electrode and the second electrode and comprising a polycyclic compound,
    wherein the polycyclic compound comprises:
    a boron atom;
    a first aromatic ring and a second aromatic ring, which are directly connected with the boron atom;
    an oxygen atom or a sulfur atom, which is directly connected with the boron atom;
    a third aromatic ring, which is directly connected with the oxygen atom or the sulfur atom;
    a first linker connecting the first aromatic ring and the second aromatic ring; and
    a second linker connecting the second aromatic ring and the third aromatic ring, wherein the first electrode and the second electrode each independently comprise at least one selected from Ag, Mg, Cu, Al, Pt, Pd, Au, Ni, Nd, Ir, Cr, Li, Ca, LiF/Ca, LiF/Al, Mo, Ti, In, Sn, and Zn, a compound of two or more thereof, a mixture of two or more thereof, or an oxide thereof.

2. The organic electroluminescence device of claim 1, wherein the first linker is a direct linkage, *—O—* or *—NAr$_a$—*, and Ar$_a$ is a substituted or unsubstituted aryl group of 6 to 30 carbon atoms.

3. The organic electroluminescence device of claim 1, wherein the second linker is a direct linkage, *—O—*, *—S—*, *—C(=O)—*, *—SO$_2$—*, *—NAr$_b$—*, and Ar$_b$ is a substituted or unsubstituted aryl group of 6 to 30 carbon atoms.

4. The organic electroluminescence device of claim 1, wherein the first aromatic ring to the third aromatic ring are each independently a substituted or unsubstituted benzene ring or a substituted or unsubstituted pyrimidine ring.

5. The organic electroluminescence device of claim 1, wherein the emission layer is to emit delayed fluorescence.

6. The organic electroluminescence device of claim 1, wherein the emission layer comprises a host and a dopant, and the dopant comprises the polycyclic compound.

7. The organic electroluminescence device of claim 1, wherein the polycyclic compound is represented by Formula 1:

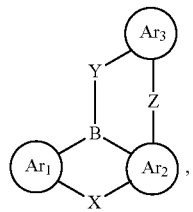

Formula 1 wherein in Formula 1, x is *—O—* or *—NAr$_4$—*,

Y is *—O—* or *—S—*,

Z is a direct linkage, *—O—*, *—S—*, *—C(=O)—*, *—SO$_2$—*, or *—NAr$_5$—*,

Ar$_1$ to Ar$_3$ are each independently a substituted or unsubstituted aromatic hydrocarbon ring of 6 to 30 carbon atoms for forming a ring, or a substituted or unsubstituted aromatic heterocycle of 2 to 30 carbon atoms for forming a ring, or are combined with an adjacent group to form a ring, and Ar$_4$ and Ar$_5$ are each independently a substituted or unsubstituted aryl group of 6 to 30 carbon atoms for forming a ring, or a substituted or unsubstituted heteroaryl group of 2 to 30 carbon atoms for forming a ring, or are combined with an adjacent group to form a ring.

8. The organic electroluminescence device of claim 7, wherein the polycyclic compound represented by Formula 1 is represented by Formula 1-1:

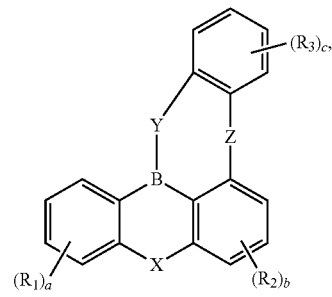

Formula 1-1 wherein in Formula 1-1,

R$_1$ to R$_3$ are each independently a hydrogen atom, a deuterium atom, an oxygen atom, a boron atom, a cyano group, a substituted or unsubstituted amine group, a substituted or unsubstituted nitro group, a substituted or unsubstituted alkyl group of 1 to 20 carbon atoms, a substituted or unsubstituted alkoxy group of 1 to 20 carbon atoms, a substituted or unsubstituted aryl group of 6 to 30 carbon atoms for forming a ring, or a substituted or unsubstituted heteroaryl group of 6 to 30 carbon atoms for forming a ring, or are combined with an adjacent group to form a ring, "a" and "c" are each independently an integer of 0 to 4, "b" is an integer of 0 to 3, and X, Y, Z, Ar$_4$ and Ar$_5$ are each independently the same as defined in Formula 1.

9. The organic electroluminescence device of claim 7, wherein the polycyclic compound represented by Formula 1 is represented by Formula 1-2:

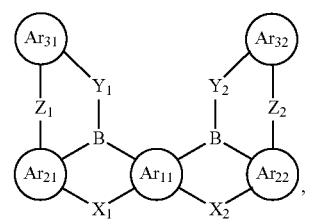

Formula 1-2 wherein in Formula 1-2,

X$_1$ and X$_2$ are each independently *—O—* or *—NAr$_4$—*,

Y$_1$ and Y$_2$ are each independently *—O—* or *—S—*,

Z$_1$ and Z$_2$ are each independently a direct linkage, *—O—*, *—S—*, *—C(=O)—*, *—SO$_2$—*, or *—NAr$_5$—*, Ar$_{11}$, Ar$_{21}$, Ar$_{22}$, Ar$_{31}$, and Ar$_{32}$ are each independently a substituted or unsubstituted aromatic hydrocarbon ring of 6 to 30 carbon atoms for forming a ring, or a substituted or unsubstituted aromatic heterocycle of 2 to 30 carbon atoms for forming a ring, or are combined with an adjacent group to form a ring, and Ar$_4$ and Ar$_5$ are each independently the same as defined in Formula 1.

10. The organic electroluminescence device of claim 7, wherein the polycyclic compound represented by Formula 1 is represented by Formula 2-1 to Formula 2-3:

Formula 2-1

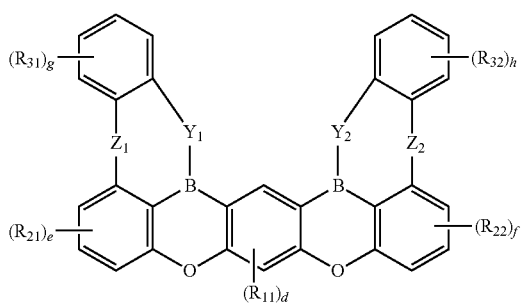

Formula 2-2

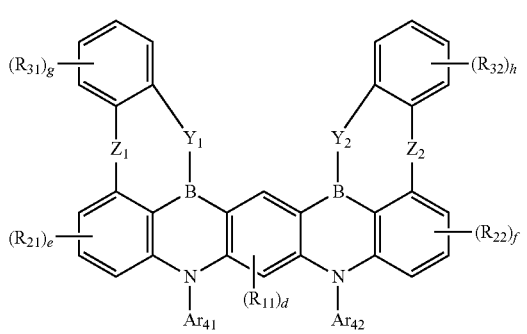

Formula 2-3

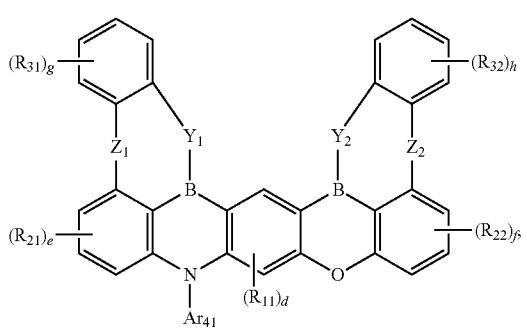

wherein in Formula 2-1 to Formula 2-3,
$Y_1$ and $Y_2$ are each independently *—O—* or *—S—*,
$Z_1$ and $Z_2$ are each independently a direct linkage, *—O—*, *—S—*, *—C(=O)—*, *—SO$_2$—*, or *—NAr$_5$—*,
$Ar_{41}$ and $Ar_{42}$ are each independently a substituted or unsubstituted aryl group of 6 to 30 carbon atoms for forming a ring, or a substituted or unsubstituted heteroaryl group of 2 to 30 carbon atoms for forming a ring, or are combined with an adjacent group to form a ring,
$R_{11}$, $R_{21}$, $R_{22}$, $R_{31}$, and $R_{32}$ are each independently a hydrogen atom, a deuterium atom, a cyano group, a substituted or unsubstituted amine group, a substituted or unsubstituted nitro group, a substituted or unsubstituted alkyl group of 1 to 20 carbon atoms, a substituted or unsubstituted alkoxy group of 1 to 20 carbon atoms, a substituted or unsubstituted aryl group of 6 to 30 carbon atoms for forming a ring, or a substituted or unsubstituted heteroaryl group of 6 to 30 carbon atoms for forming a ring, or are combined with an adjacent group to form a ring,
"d" is an integer of 0 to 2,
"e" and "f" are each independently an integer of 0 to 3,
"g" and "h" are each independently an integer of 0 to 4, and
$Ar_5$ is the same as defined in Formula 1.

11. The organic electroluminescence device of claim 7, wherein the polycyclic compound represented by Formula 1 is represented by Formula 3-1 to Formula 3-3:

Formula 3-1

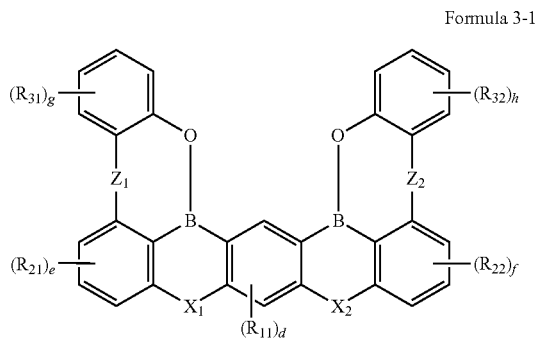

Formula 3-2

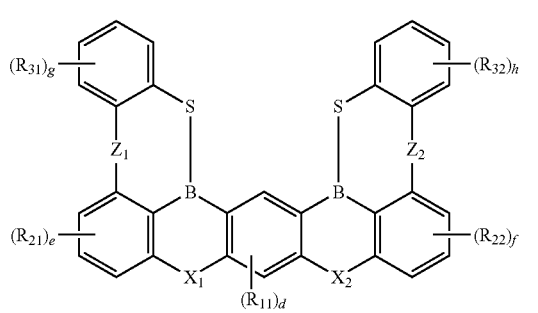

Formula 3-3

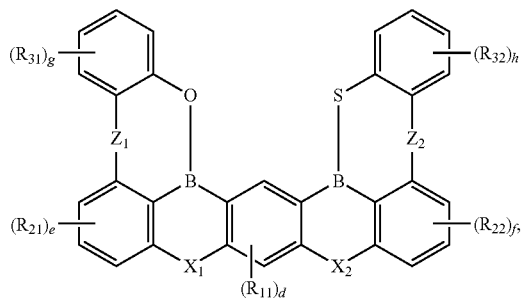

in Formula 3-1 to Formula 3-3,
$X_1$ and $X_2$ are each independently *—O—* or *—NAr$_4$—*,
$Z_1$ and $Z_2$ are each independently a direct linkage, *—O—*, *—S—*, *—C(=O)—*, *—SO$_2$—*, or *—NAr$_5$—*,
$R_{11}$, $R_{21}$, $R_{22}$, $R_{31}$, and $R_{32}$ are each independently a hydrogen atom, a deuterium atom, a cyano group, a substituted or unsubstituted amine group, a substituted or unsubstituted nitro group, a substituted or unsubstituted alkyl group of 1 to 20 carbon atoms, a substituted or unsubstituted alkoxy group of 1 to 20 carbon atoms, a substituted or unsubstituted aryl group of 6 to 30 carbon atoms for forming a ring, or a substituted or unsubstituted heteroaryl group of 6 to 30 carbon atoms for forming a ring, or are combined with an adjacent group to form a ring,
"d" is an integer of 0 to 2,
"e" and "f" are each independently an integer of 0 to 3, "g" and "h" are each independently an integer of 0 to 4, and Ar$_4$ and Ar$_5$ are each independently the same as defined in Formula 1.

12. The organic electroluminescence device of claim 7, wherein the polycyclic compound represented by Formula 1 is represented by Formula 4-1 to Formula 4-3:

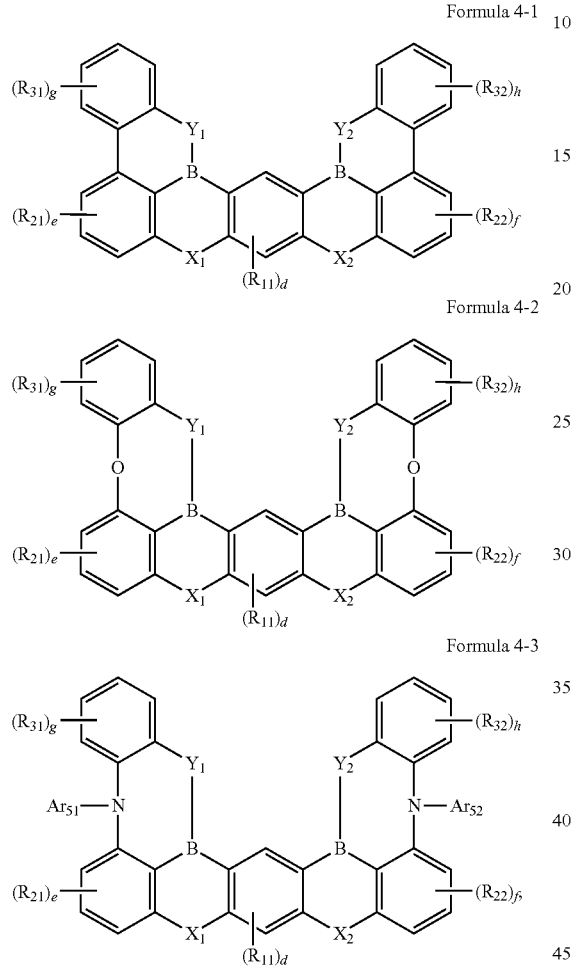

Formula 4-1

Formula 4-2

Formula 4-3 wherein in Formula 4-1 to Formula 4-3,

X$_1$ and X$_2$ are each independently *—O—* or *—NAr$_4$—*,

Y$_1$ and Y$_2$ are each independently *—O—* or *—S—*,

Ar$_{51}$ and Ar$_{52}$ are each independently a substituted or unsubstituted aryl group of 6 to 30 carbon atoms for forming a ring, or a substituted or unsubstituted heteroaryl group of 2 to 30 carbon atoms for forming a ring, or are combined with an adjacent group to form a ring, R$_{11}$, R$_{21}$, R$_{22}$, R$_{31}$, and R$_{32}$ are each independently a hydrogen atom, a deuterium atom, a cyano group, a substituted or unsubstituted amine group, a substituted or unsubstituted nitro group, a substituted or unsubstituted alkyl group of 1 to 20 carbon atoms, a substituted or unsubstituted alkoxy group of 1 to 20 carbon atoms, a substituted or unsubstituted aryl group of 6 to 30 carbon atoms for forming a ring, or a substituted or unsubstituted heteroaryl group of 6 to 30 carbon atoms for forming a ring, or are combined with an adjacent group to form a ring, "d" is an integer of 0 to 2, "e" and "f" are each independently an integer of 0 to 3, "g" and "h" are each independently an integer of 0 to 4, and Ar$_4$ is the same as defined in Formula 1.

13. The organic electroluminescence device of claim 7, wherein the polycyclic compound represented by Formula 1 is at least one selected among compounds represented in Compound Group A to Compound Group F:

Compound Group A

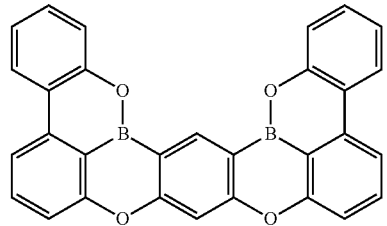

A-1

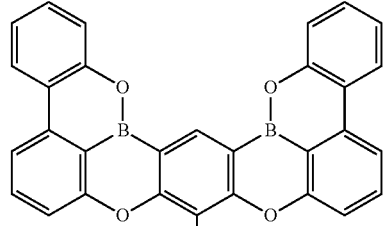

A-2

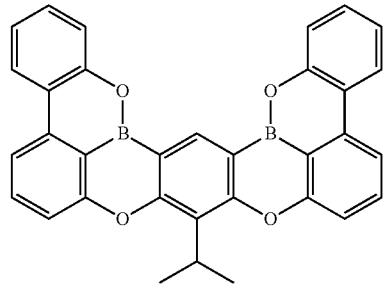

A-3

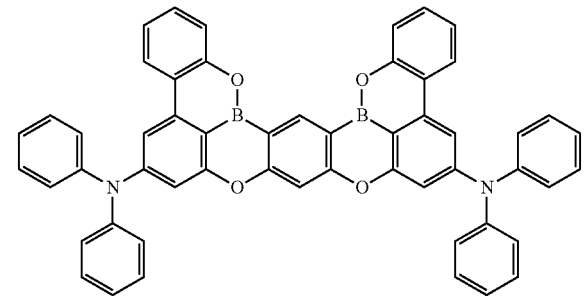

A-4

-continued
A-5
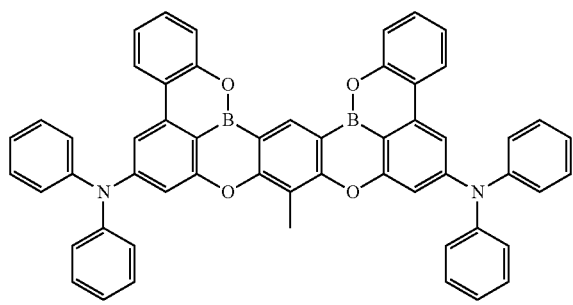
A-6
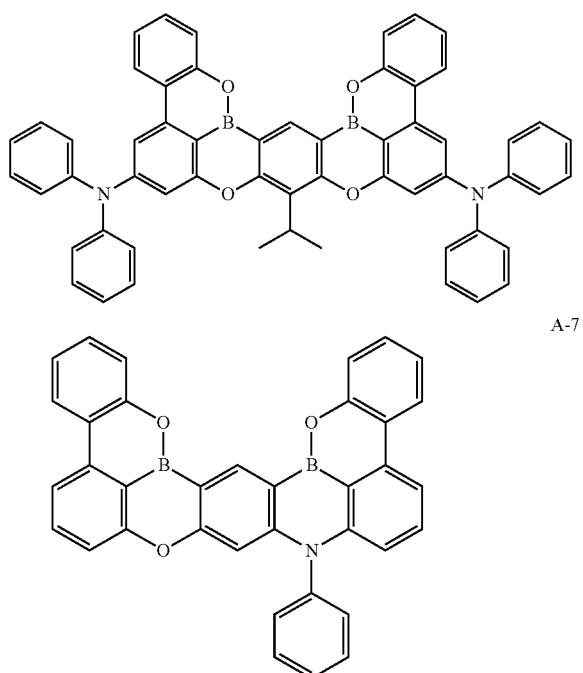
A-7
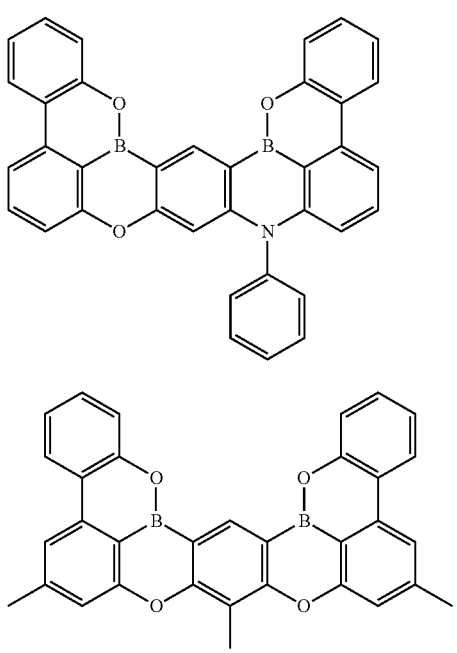
A-8
A-9
-continued
A-10
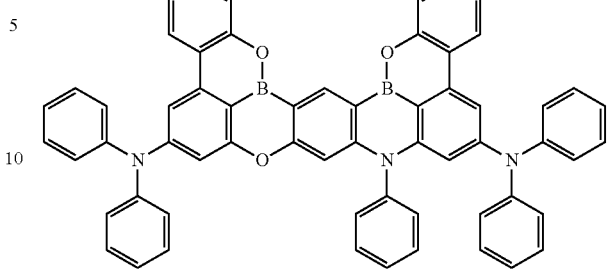
A-11
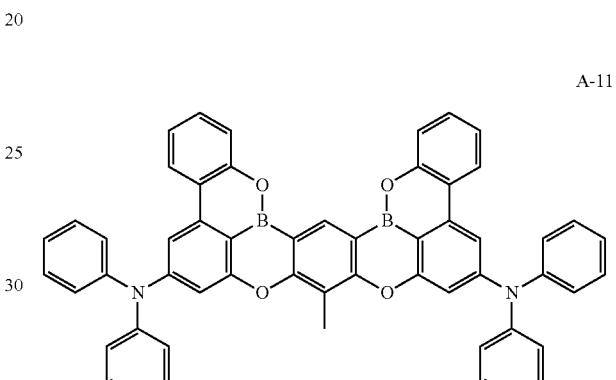
A-12
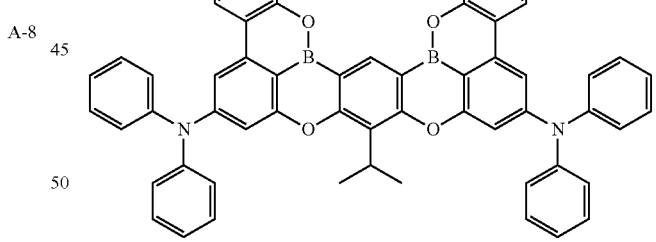
A-13
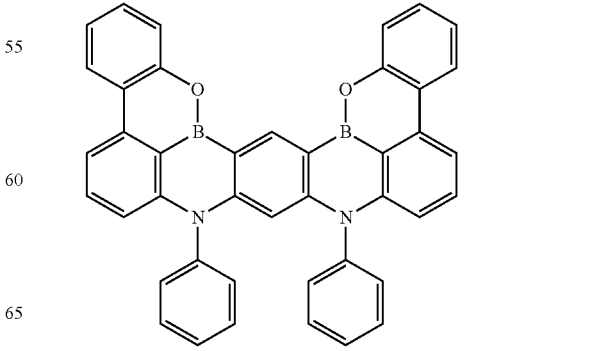

-continued
A-14
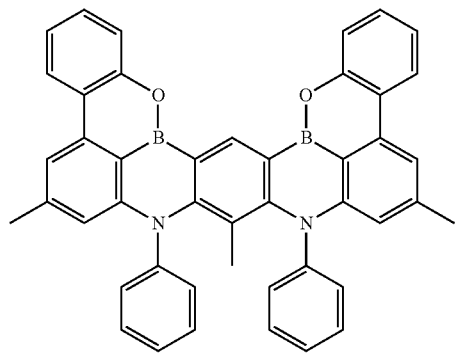
A-15
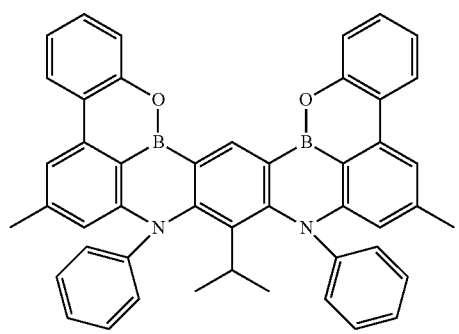
A-16
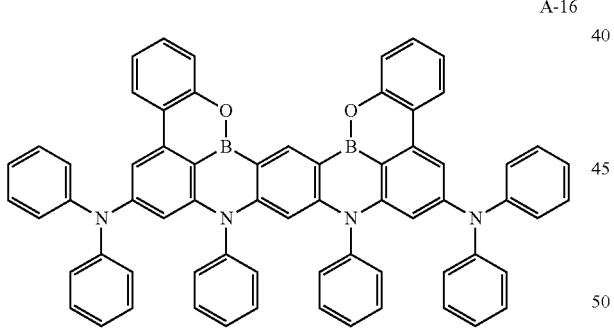
A-17
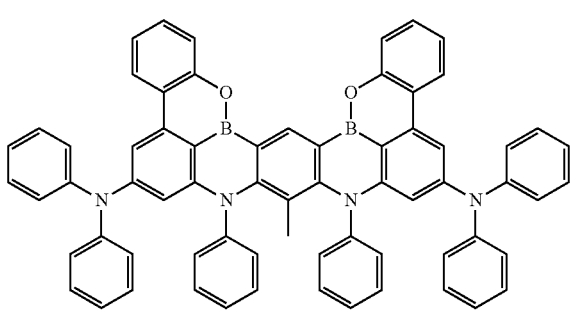
-continued
A-18
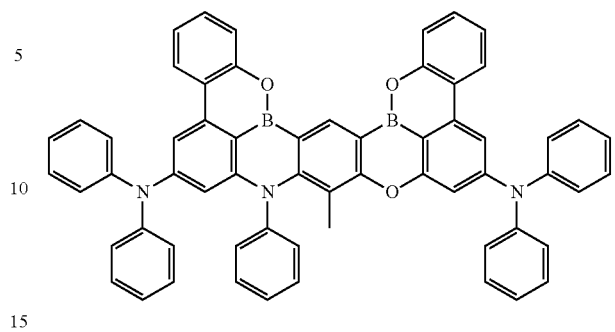
A-19
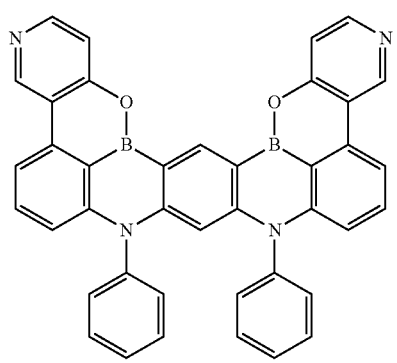
A-20
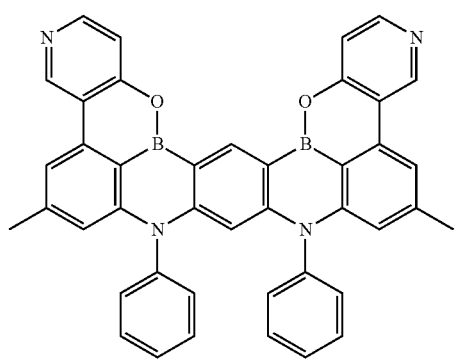
A-21
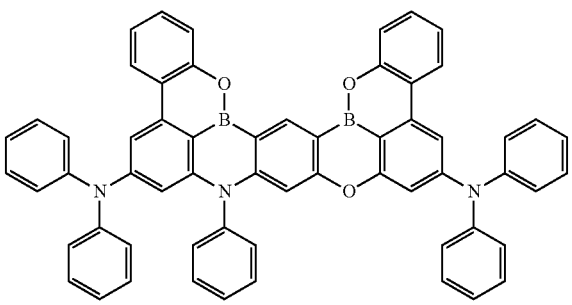

A-22
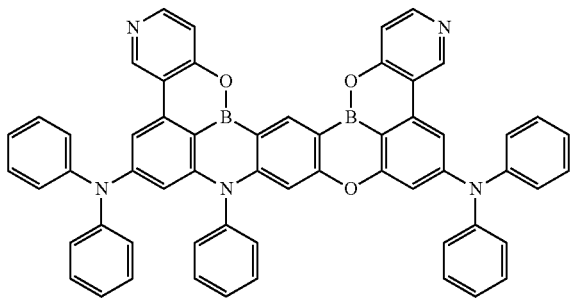
A-23
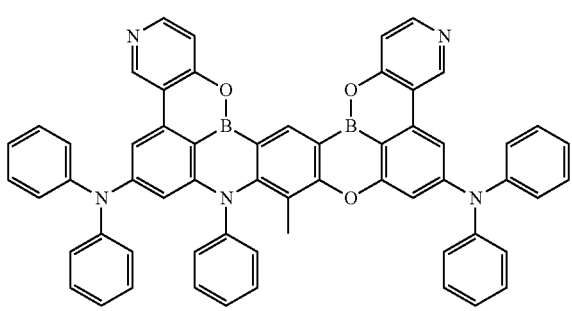
Compound Group B
B-1
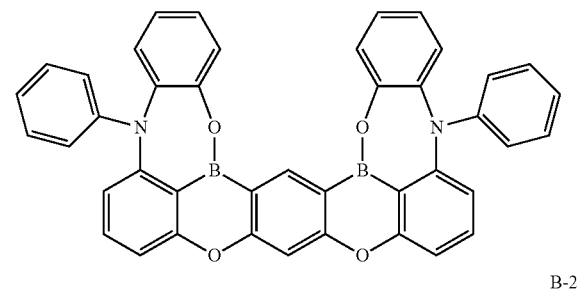
B-2
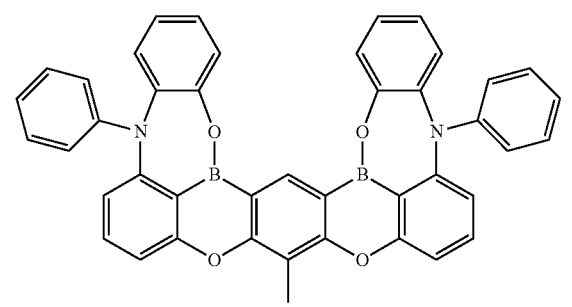
B-3
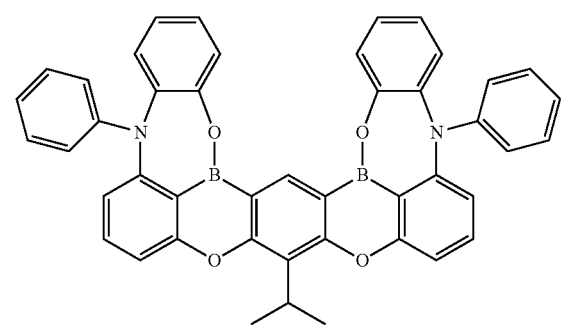
B-4
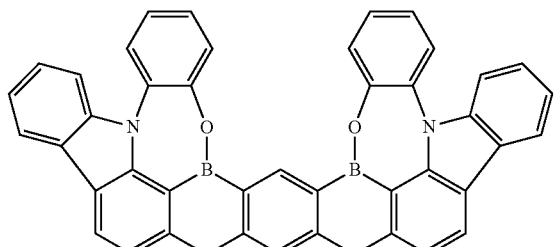
B-5
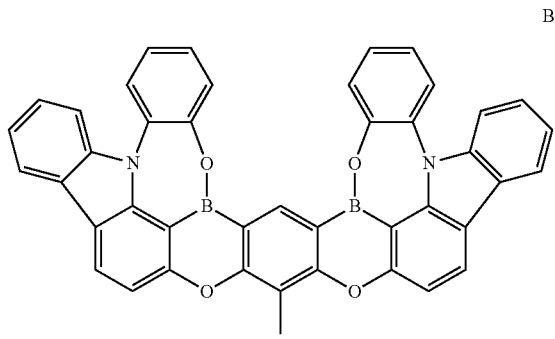
B-6
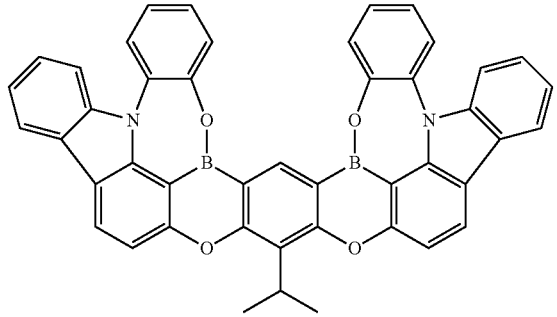
B-7
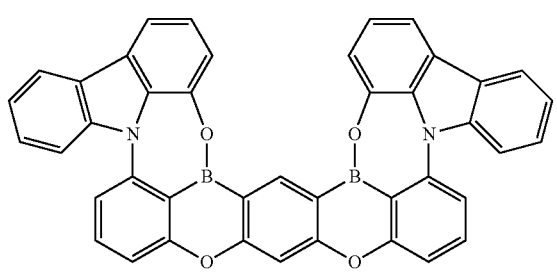
B-8
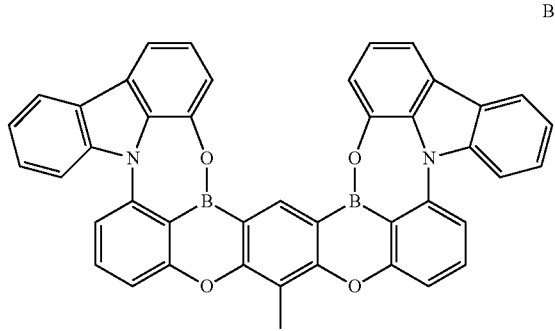

-continued
B-9
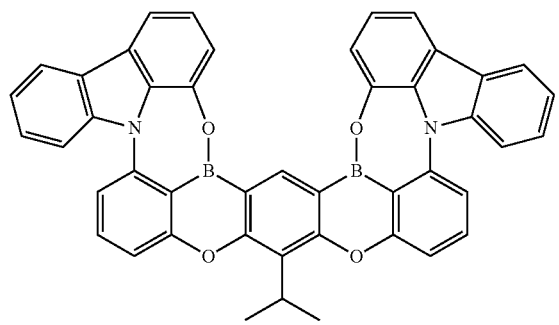
B-10
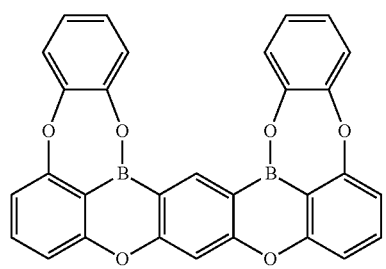
B-11
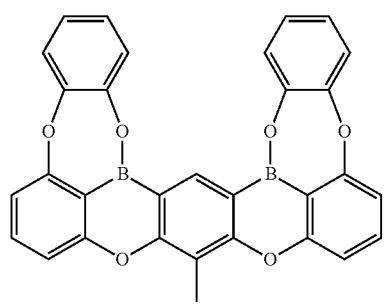
B-12
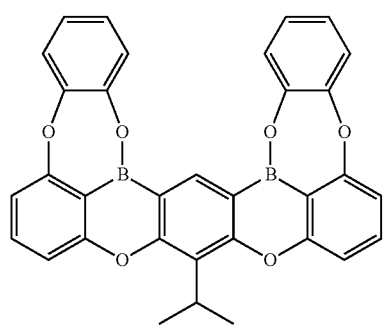
B-13
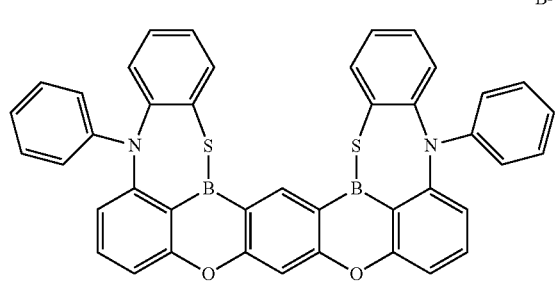
-continued
B-14
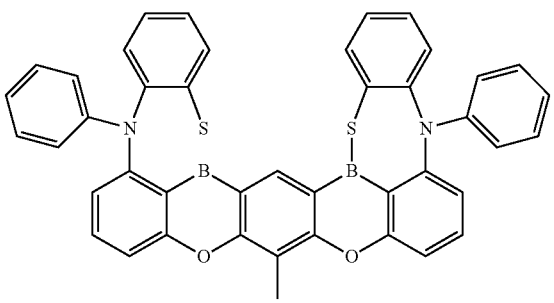
B-15
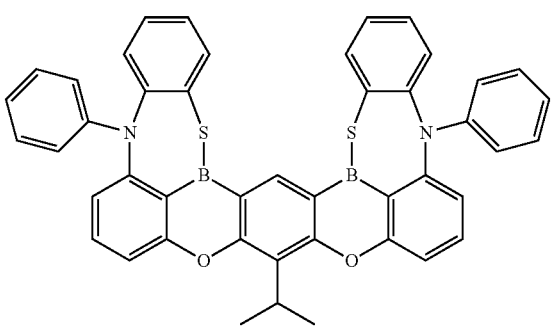
B-16
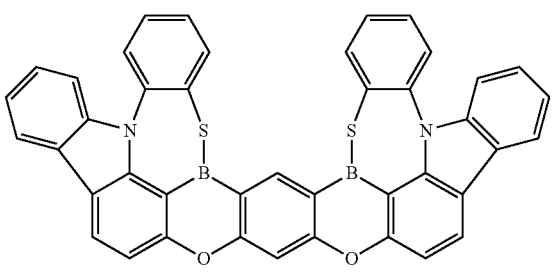
B-17
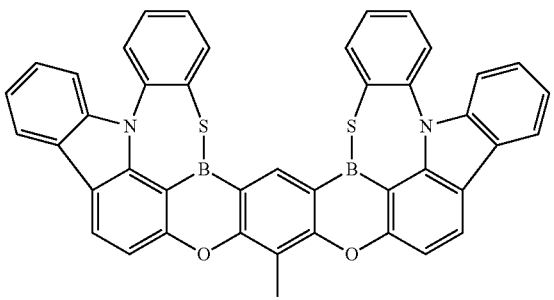
B-18
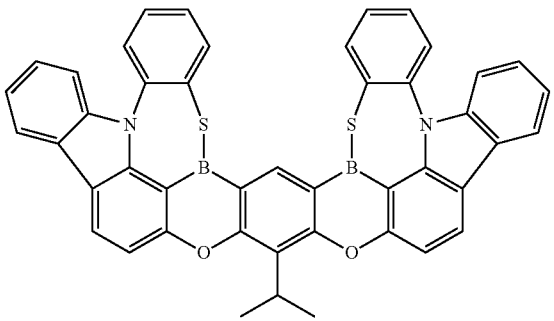

B-19
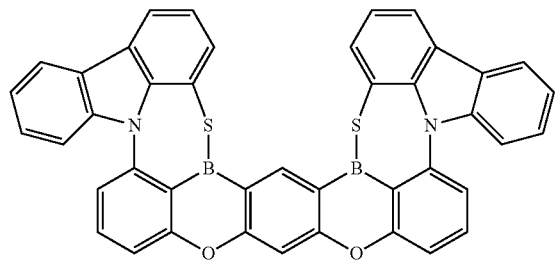
B-20
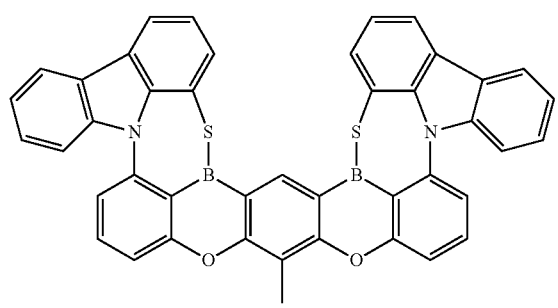
B-21
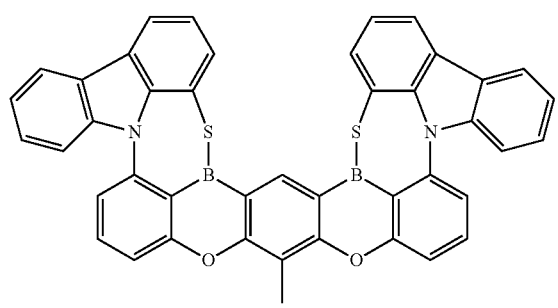
B-22
B-23
B-24
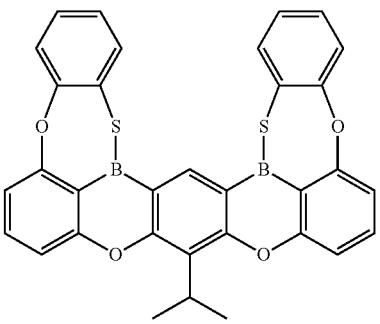
B-25
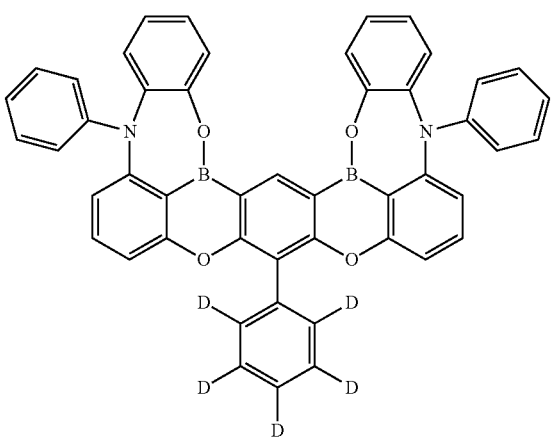
Compound Group C
C-1
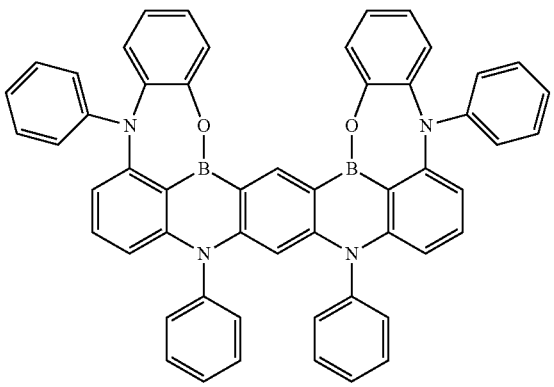
C-2
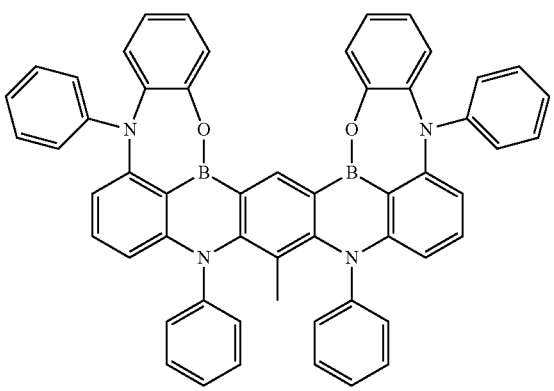

C-3
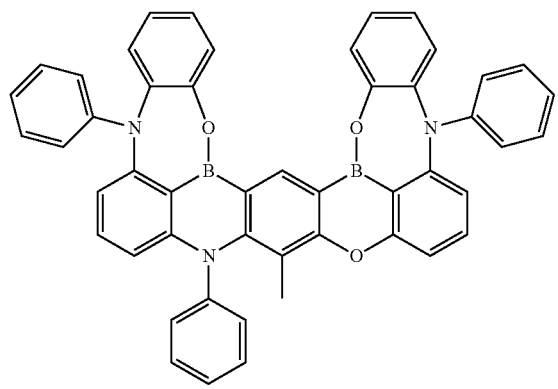
C-7
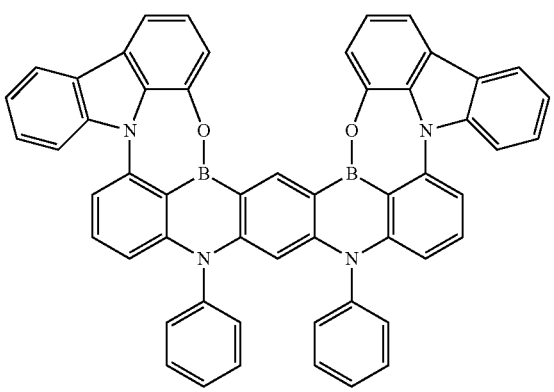
C-4
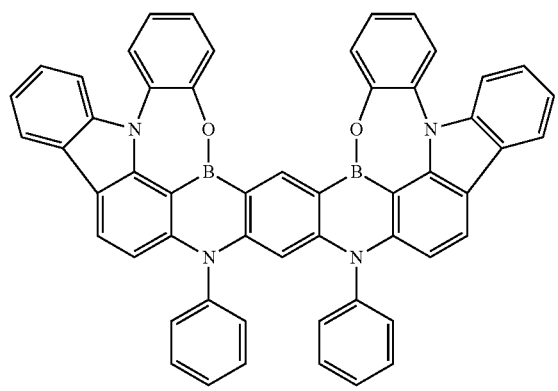
C-8
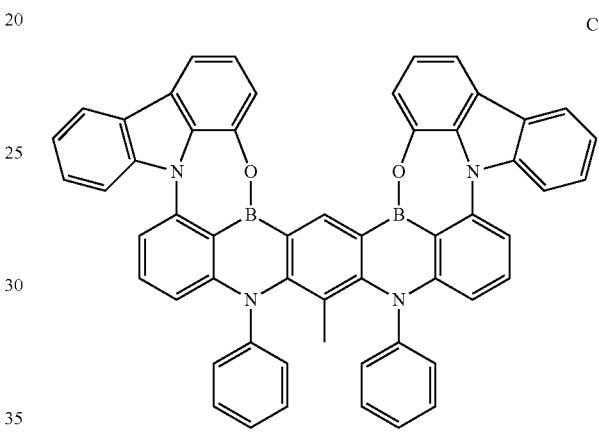
C-5
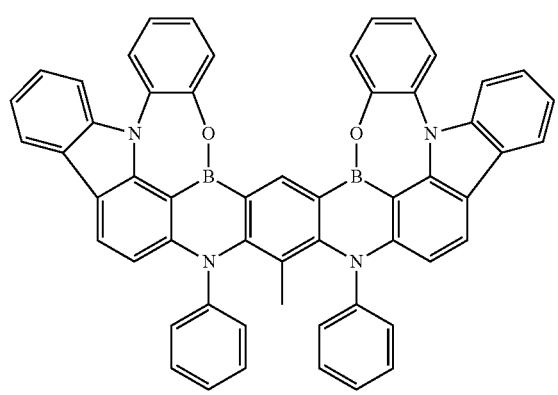
C-9
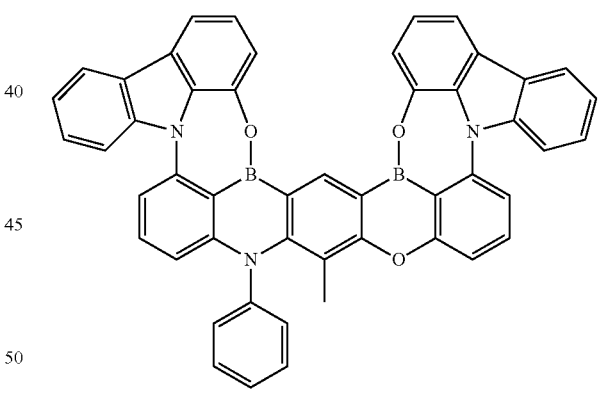
C-6
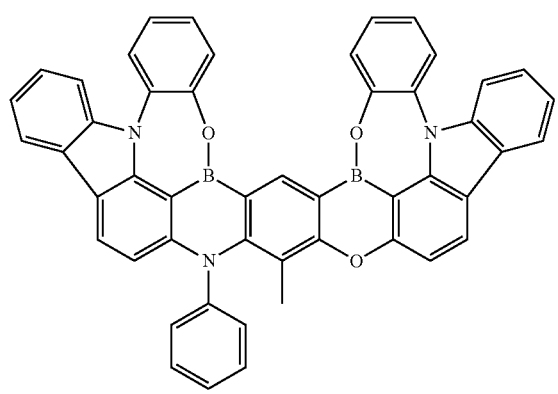
C-10
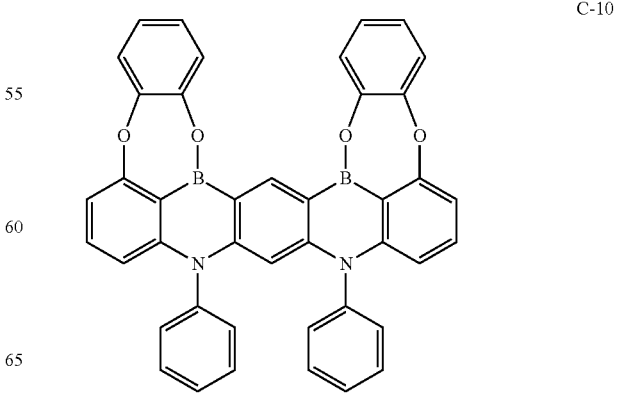

C-11
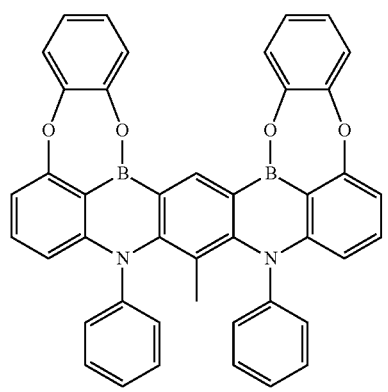
C-12
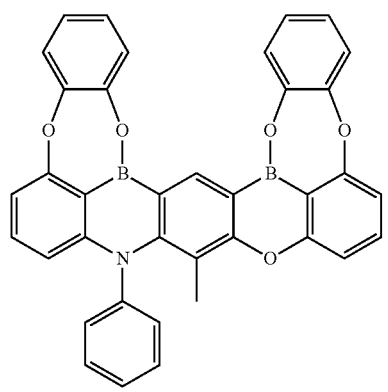
C-13
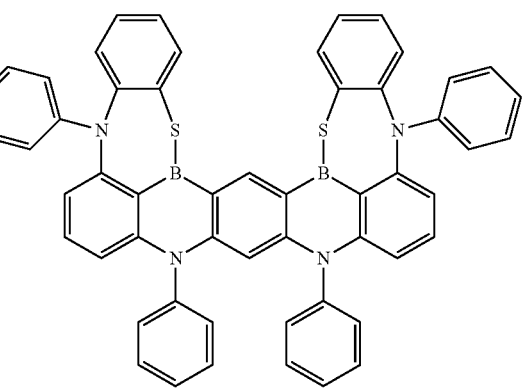
C-14
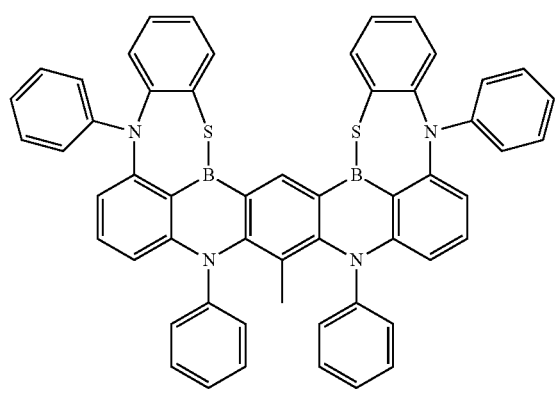
C-15
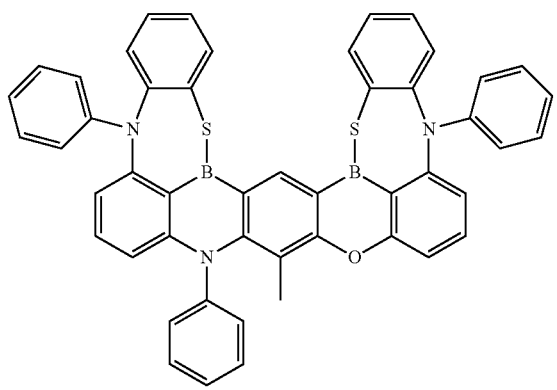
C-16
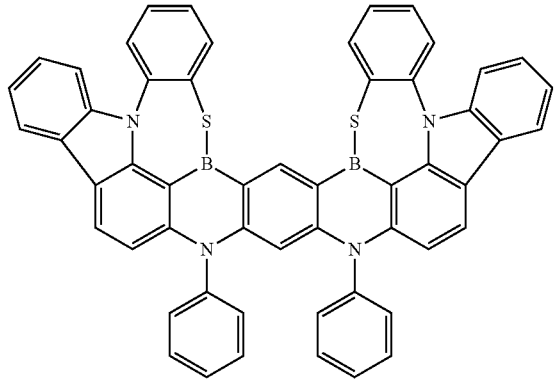
C-17
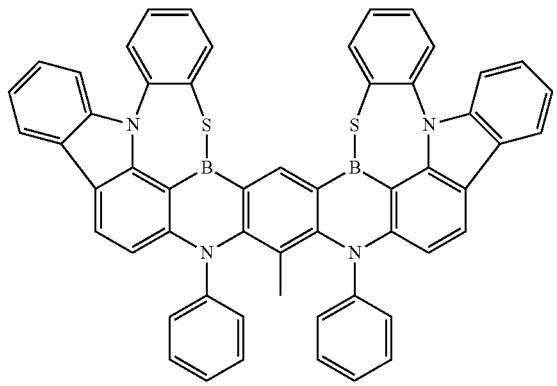
C-18
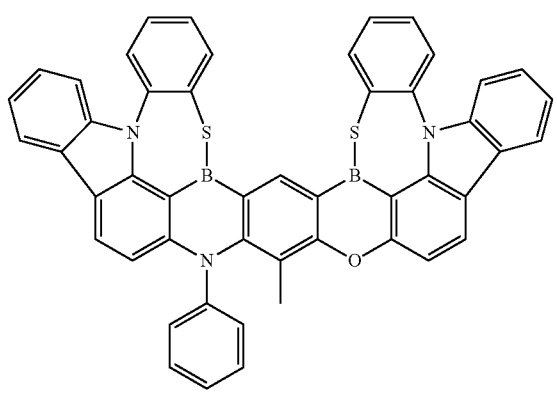

C-19
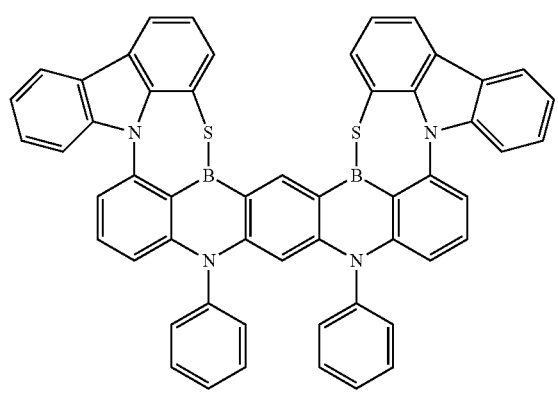
C-20
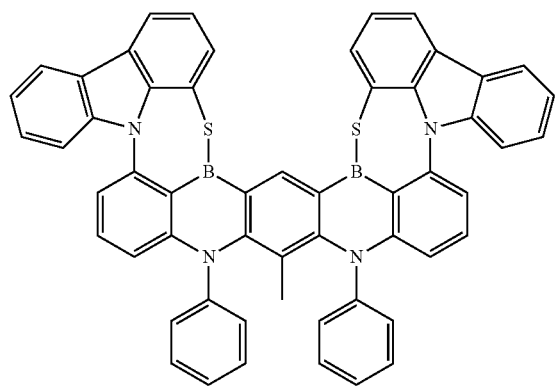
C-21
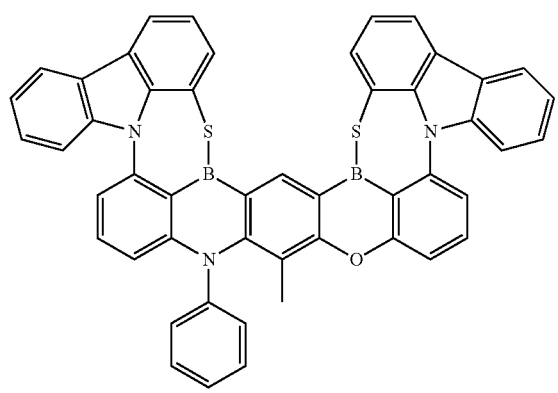
C-22
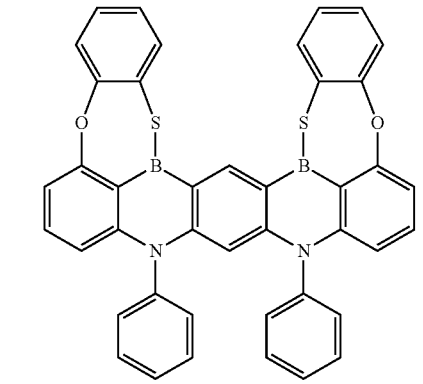
C-23
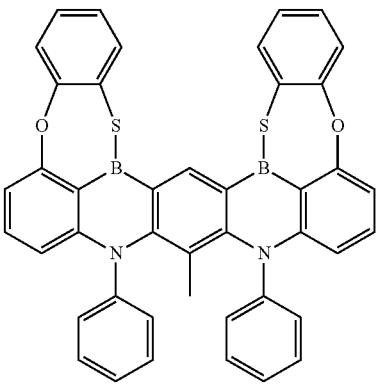
C-24
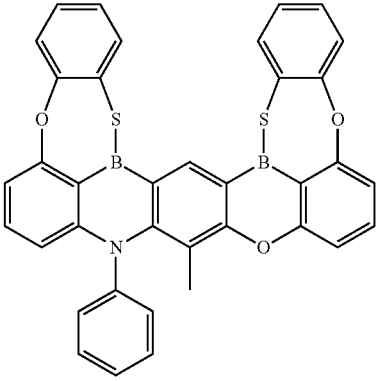
Compound Group D
D-1
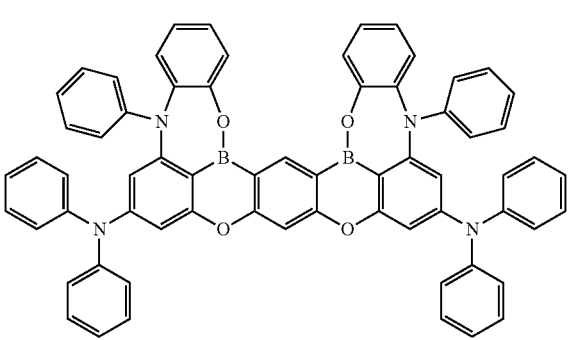
D-2
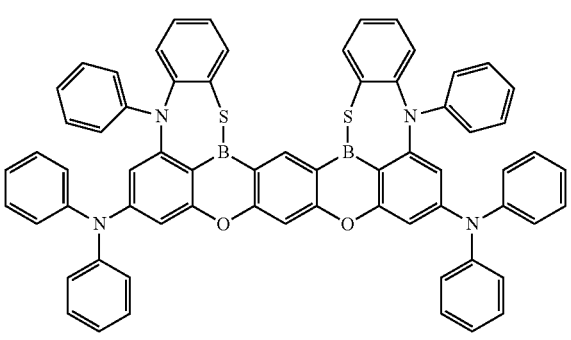

D-3
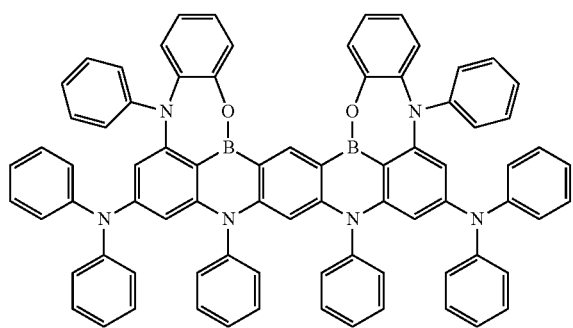
D-7
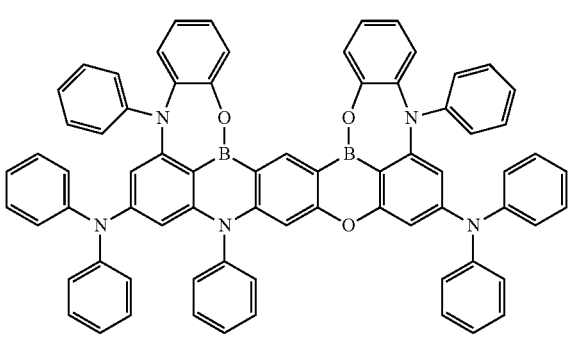
D-4
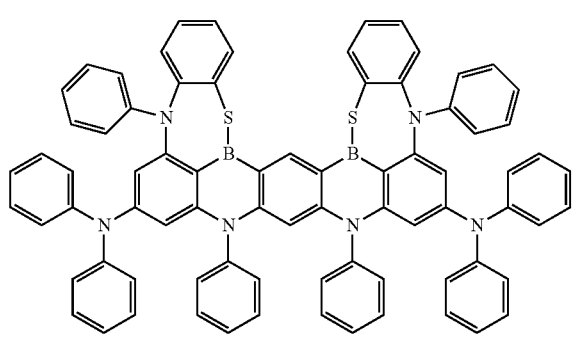
D-8
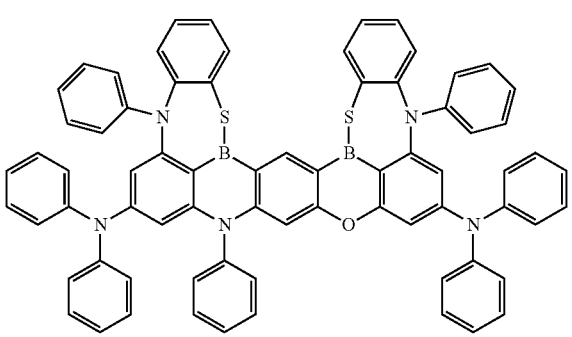
D-5
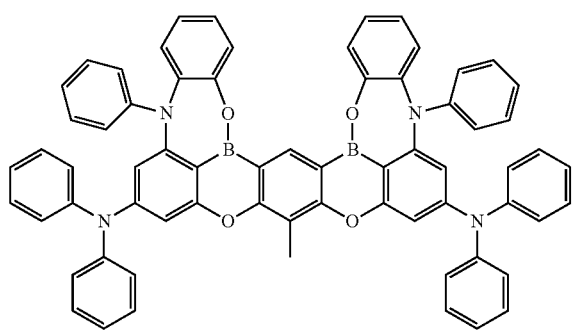
D-9
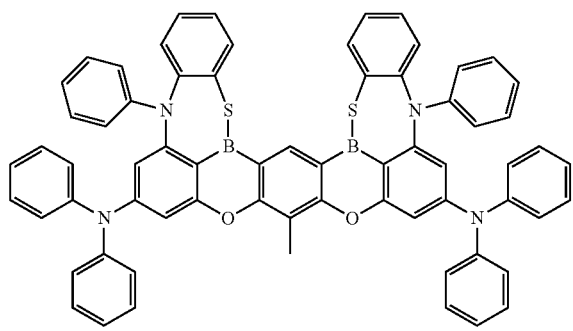
D-6
D-10
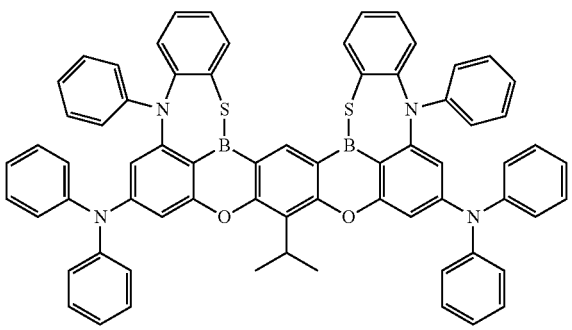

D-11
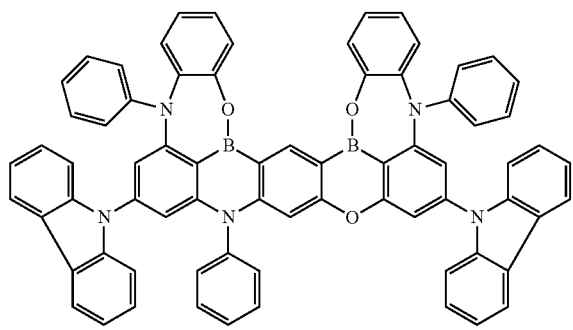
D-15
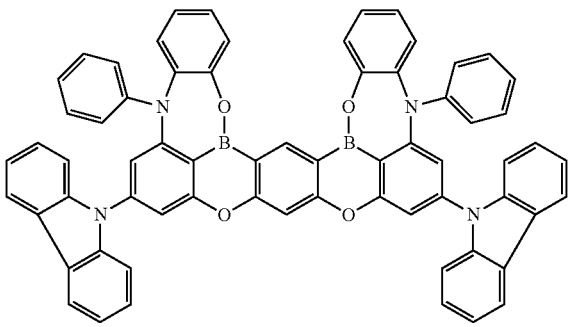
D-12
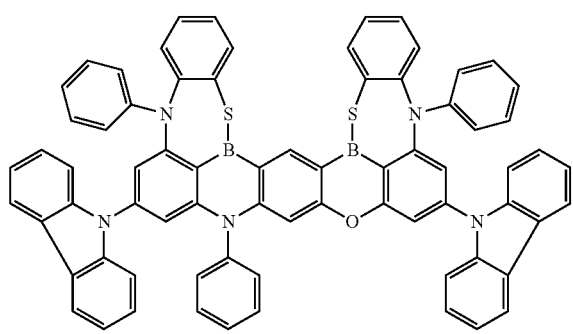
D-16
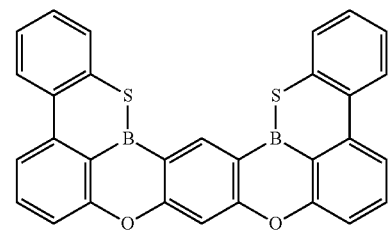
Compound Group E
D-13
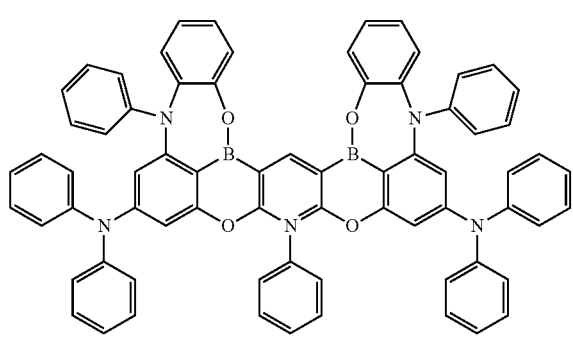
E-1
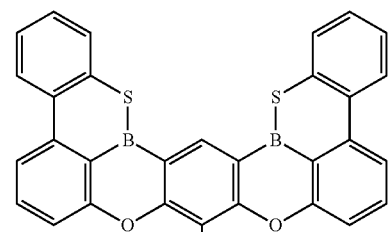
E-2
D-14
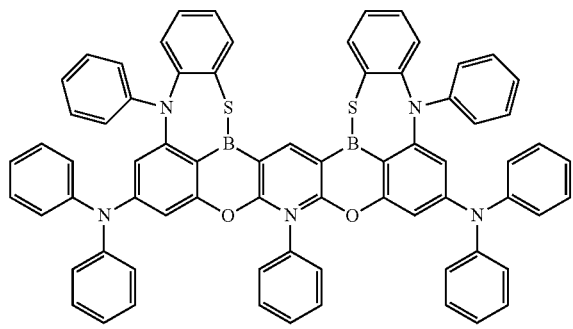
E-3
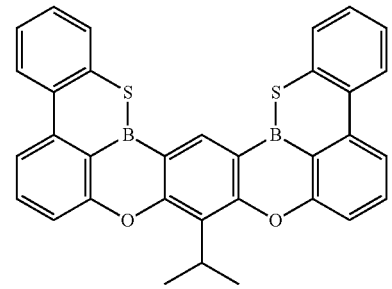

-continued
E-4
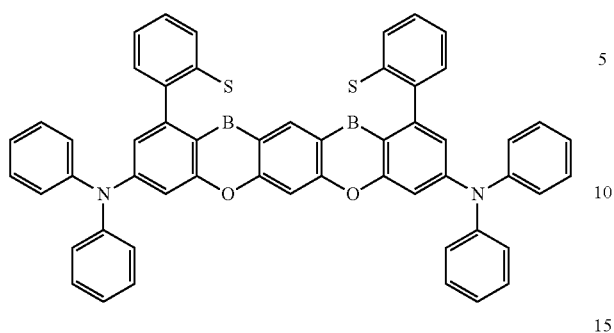
E-13
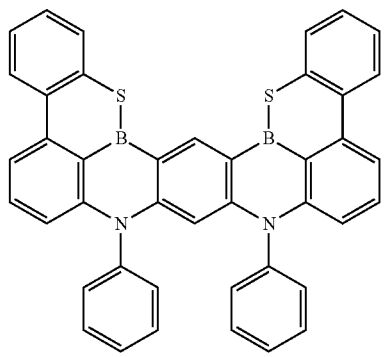
E-5
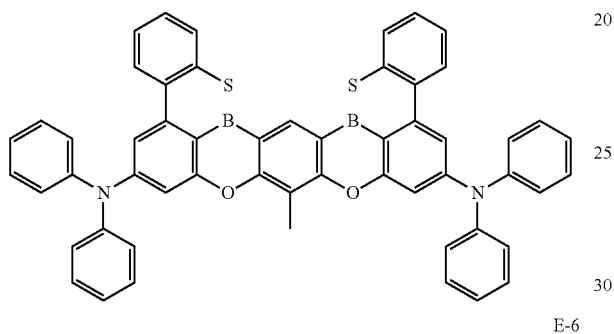
E-14
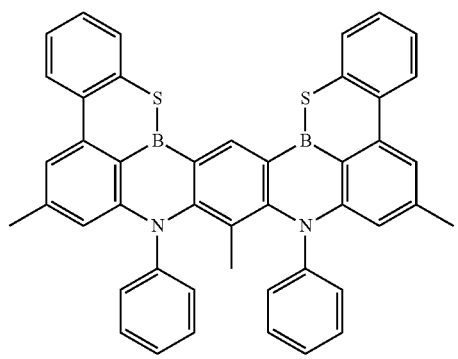
E-6
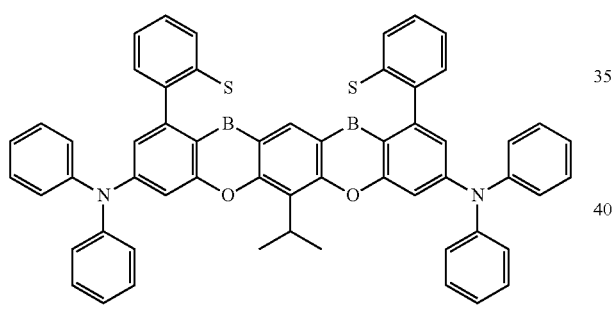
E-15
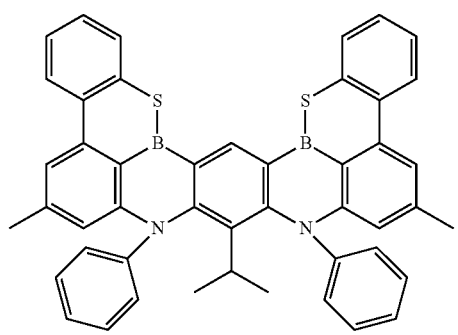
E-8
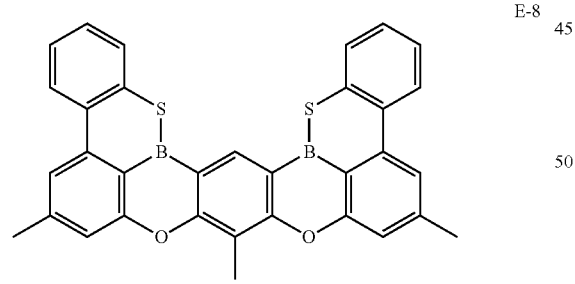
E-9
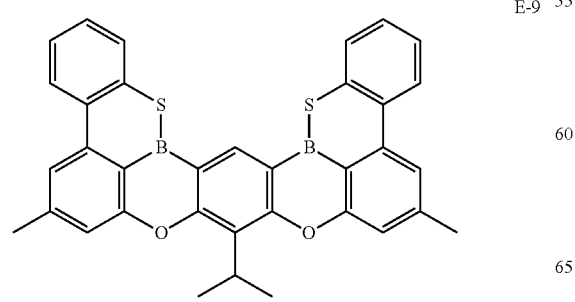
E-16
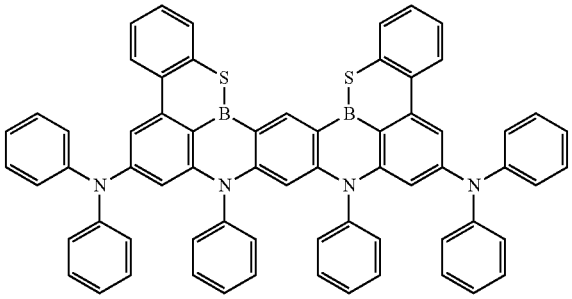

E-17
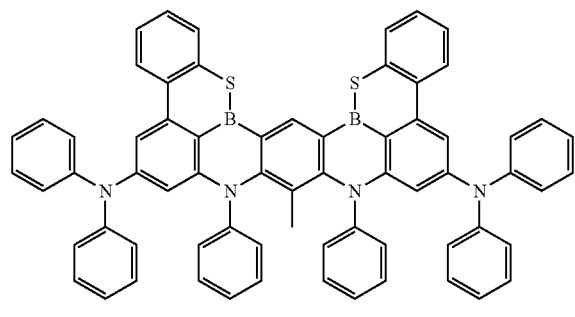
E-21
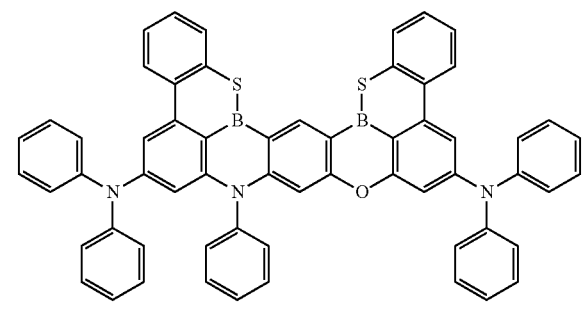
E-18
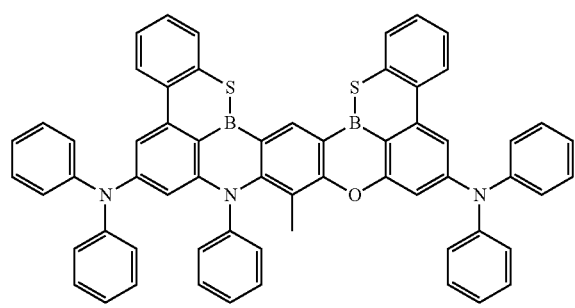
E-22
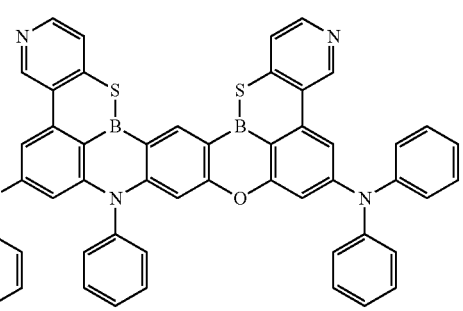
E-19
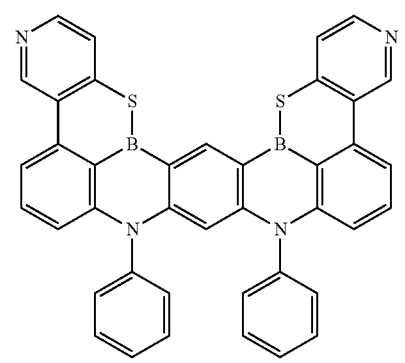
E-23
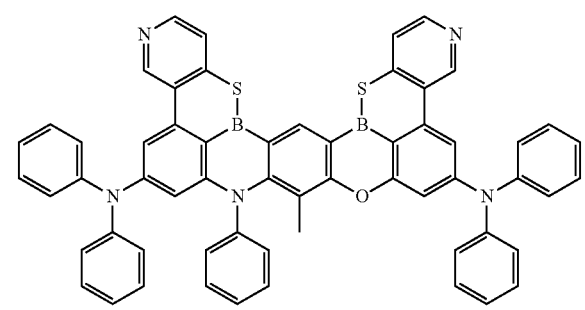
Compound Group F
E-20
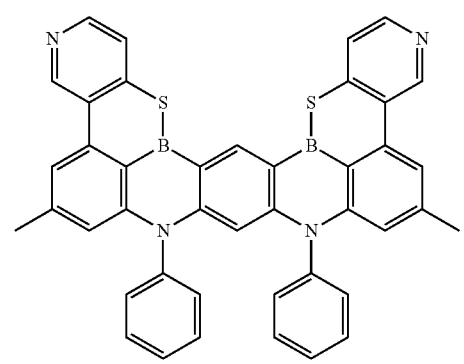
F-1
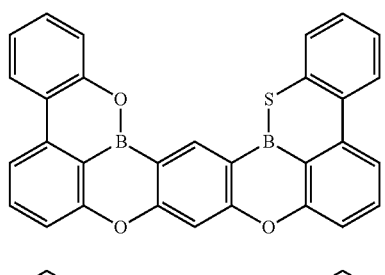
F-2
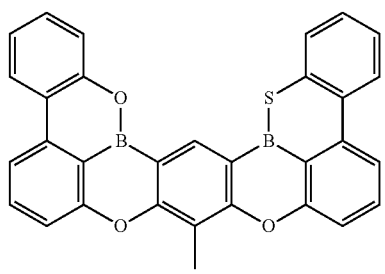

-continued
F-3
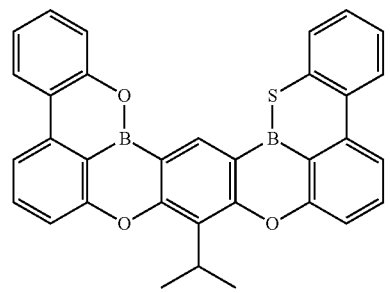
F-4
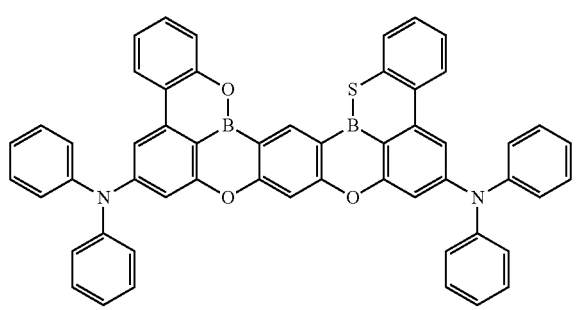
F-5
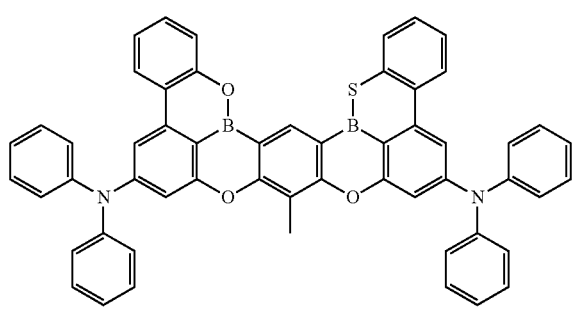
F-6
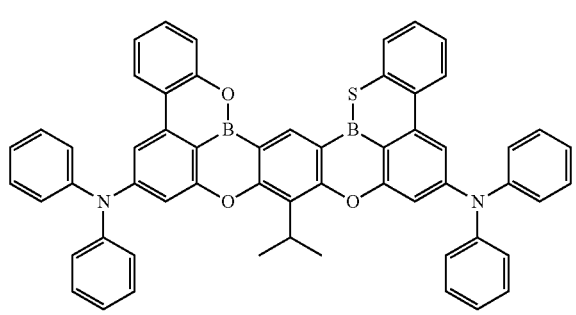
F-7
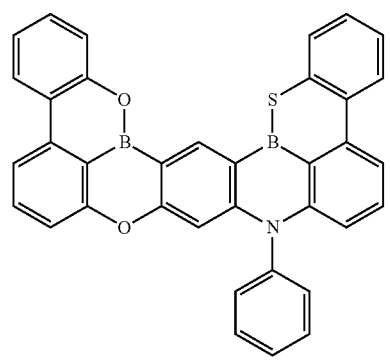
-continued
F-8
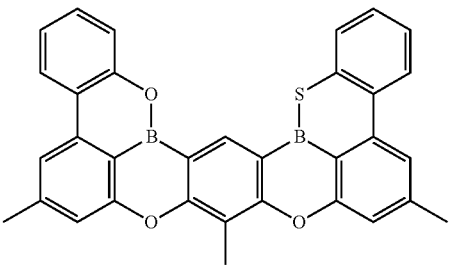
F-9
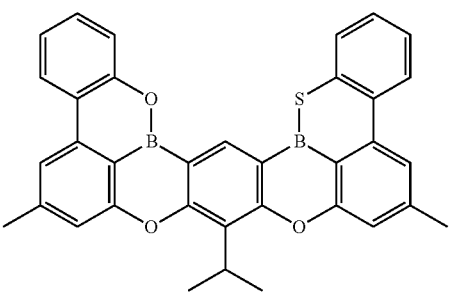
F-10
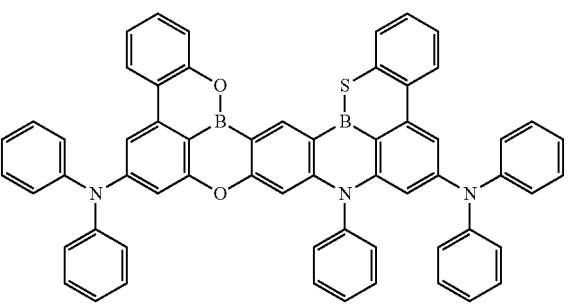
F-13
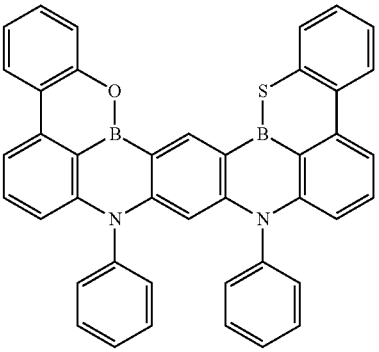
F-14
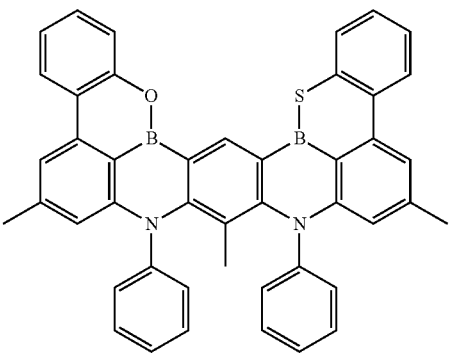

F-15
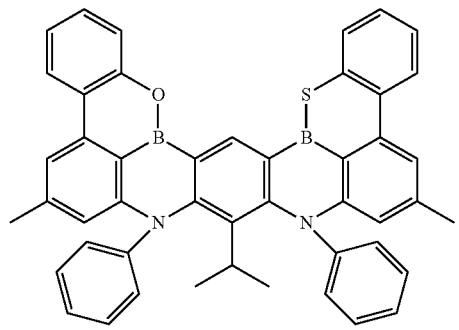
F-19
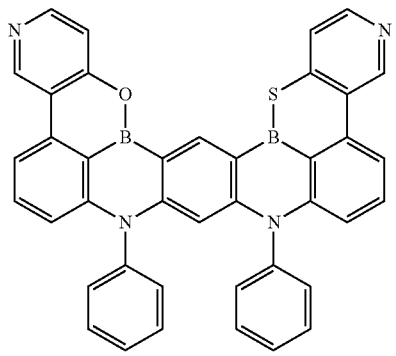
F-16
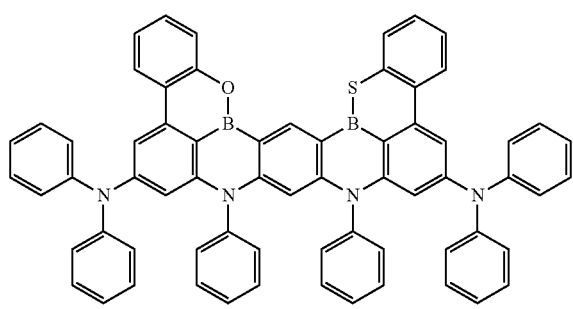
F-20
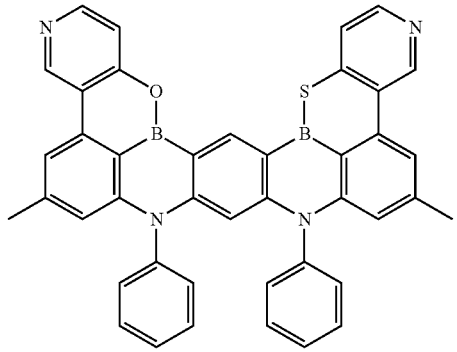
F-17
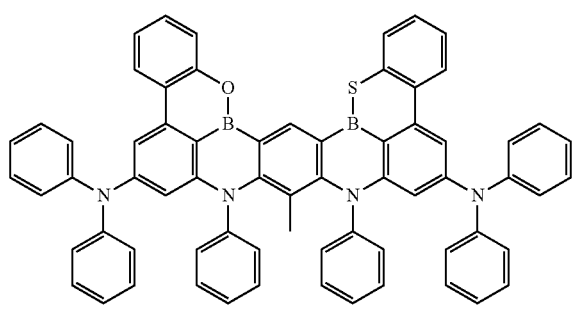
F-21
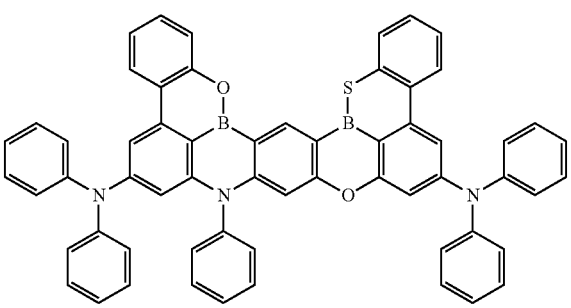
F-18
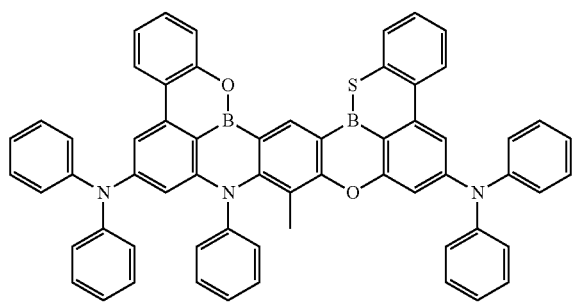
F-22
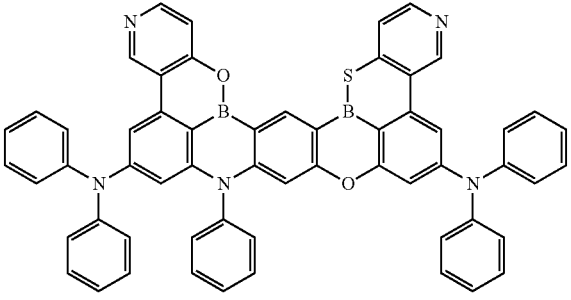

-continued

F-23

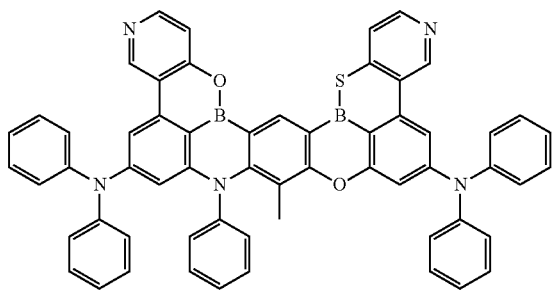

14. A polycyclic compound represented by Formula 1:

Formula 1

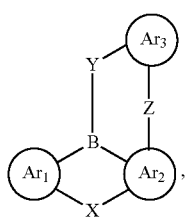

wherein in Formula 1,
x is *—O—* or *—NAr$_4$—*,
Y is *—O—* or *—S—*,
Z is a direct linkage, *—O—*, *—S—*, *—C(=O)—*, *—SO$_2$—*, or *—NAr$_5$—*,
Ar$_1$ to Ar$_3$ are each independently a substituted or unsubstituted aromatic hydrocarbon ring of 6 to 30 carbon atoms for forming a ring, or a substituted or unsubstituted aromatic heterocycle of 2 to 30 carbon atoms for forming a ring, or are combined with an adjacent group to form a ring, and
Ar$_4$ and Ar$_5$ are each independently a substituted or unsubstituted aryl group of 6 to 30 carbon atoms for forming a ring, or a substituted or unsubstituted heteroaryl group of 2 to 30 carbon atoms for forming a ring, or are combined with an adjacent group to form a ring.

15. The polycyclic compound of claim 14, wherein the polycyclic compound represented by Formula 1 is represented by Formula 1-1:

Formula 1-1

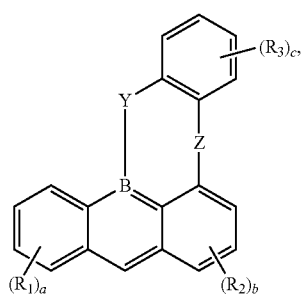

wherein in Formula 1-1,
R$_1$ to R$_3$ are each independently a hydrogen atom, a deuterium atom, an oxygen atom, a boron atom, a cyano group, a substituted or unsubstituted amine group, a substituted or unsubstituted nitro group, a substituted or unsubstituted alkyl group of 1 to 20 carbon atoms, a substituted or unsubstituted alkoxy group of 1 to 20 carbon atoms, a substituted or unsubstituted aryl group of 6 to 30 carbon atoms for forming a ring, or a substituted or unsubstituted heteroaryl group of 6 to 30 carbon atoms for forming a ring, or are combined with an adjacent group to form a ring,
"a" and "c" are each independently an integer of 0 to 4,
"b" is an integer of 0 to 3, and
X, Y, Z, Ar$_4$ and Ar$_5$ are each independently the same as defined in Formula 1.

16. The polycyclic compound of claim 14, wherein the polycyclic compound represented by Formula 1 is represented by Formula 1-2:

Formula 1-2

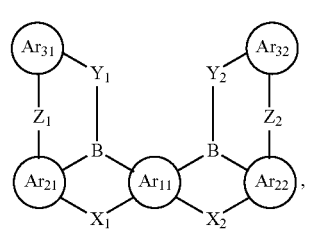

wherein in Formula 1-2,
X$_1$ and X$_2$ are each independently *—O—* or *—NAr$_4$—*,
Y$_1$ and Y$_2$ are each independently *—O—* or *—S—*,
Z$_1$ and Z$_2$ are each independently a direct linkage, —S—*, *—C(=O)—*, *—SO$_2$—*, or *—NAr$_5$—*,
Ar$_{11}$, Ar$_{21}$, Ar$_{22}$, Ar$_{31}$, and Ar$_{32}$ are each independently a substituted or unsubstituted aromatic hydrocarbon ring of 6 to 30 carbon atoms for forming a ring, or a substituted or unsubstituted aromatic heterocycle of 2 to 30 carbon atoms for forming a ring, or are combined with an adjacent group to form a ring, and
Ar$_4$ and Ar$_5$ are each independently the same as defined in Formula 1.

17. The polycyclic compound of claim 14, wherein the polycyclic compound represented by Formula 1 is represented by Formula 2-1 to Formula 2-3:

Formula 2-1

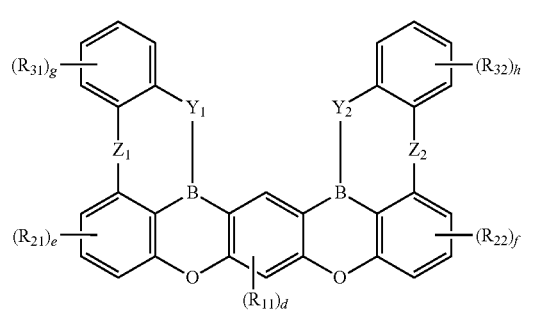

Formula 2-2

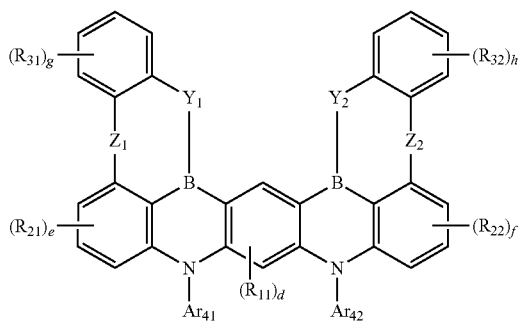

Formula 2-3

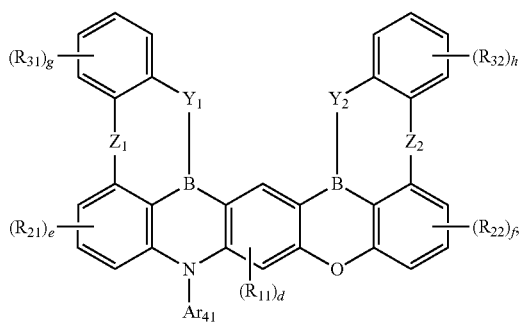

Formula 3-1

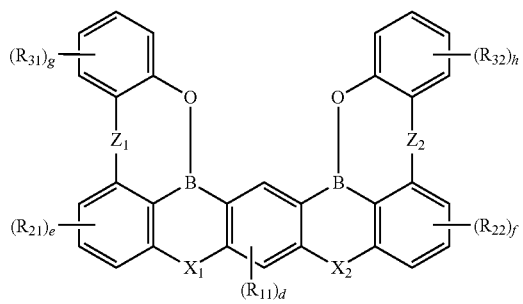

Formula 3-2

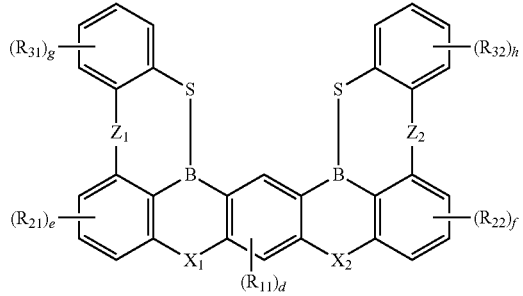

Formula 3-3

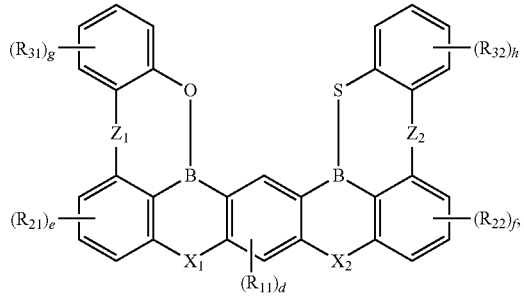

wherein in Formula 2-1 to Formula 2-3, $Y_1$ and $Y_2$ are each independently *—O—* or *—S—, $Z_1$ and $Z_2$ are each independently a direct linkage, *—O—*, *—S—*, *—C(=O)—*, *—SO$_2$—*, or *—NAr$_5$—*, $Ar_{41}$ and $Ar_{42}$ are each independently a substituted or unsubstituted aryl group of 6 to 30 carbon atoms for forming a ring, or a substituted or unsubstituted heteroaryl group of 2 to 30 carbon atoms for forming a ring, or are combined with an adjacent group to form a ring, $R_{11}$, $R_{21}$, $R_{22}$, $R_{31}$, and $R_{32}$ are each independently a hydrogen atom, a deuterium atom, a cyano group, a substituted or unsubstituted amine group, a substituted or unsubstituted nitro group, a substituted or unsubstituted alkyl group of 1 to 20 carbon atoms, a substituted or unsubstituted alkoxy group of 1 to 20 carbon atoms, a substituted or unsubstituted aryl group of 6 to 30 carbon atoms for forming a ring, or a substituted or unsubstituted heteroaryl group of 6 to 30 carbon atoms for forming a ring, or are combined with an adjacent group to form a ring, "d" is an integer of 0 to 2, "e" and "f" are each independently an integer of 0 to 3, "g" and "h" are each independently an integer of 0 to 4, and $Ar_5$ is the same as defined in Formula 1.

18. The polycyclic compound of claim 14, wherein the polycyclic compound represented by Formula 1 is represented by Formula 3-1 to Formula 3-3:

in Formula 3-1 to Formula 3-3, $X_1$ and $X_2$ are each independently *—O—* or *—NAr$_4$—*, $Z_1$ and $Z_2$ are each independently a direct linkage, *—O—*, *—S—*, *—C(=O)—*, *—SO$_2$—*, or *—NAr$_5$—*, $R_{11}$, $R_{21}$, $R_{22}$, $R_{31}$, and $R_{32}$ are each independently a hydrogen atom, a deuterium atom, a cyano group, a substituted or unsubstituted amine group, a substituted or unsubstituted nitro group, a substituted or unsubstituted alkyl group of 1 to 20 carbon atoms, a substituted or unsubstituted alkoxy group of 1 to 20 carbon atoms, a substituted or unsubstituted aryl group of 6 to 30 carbon atoms for forming a ring, or a substituted or unsubstituted heteroaryl group of 6 to 30 carbon atoms for forming a ring, or are combined with an adjacent group to form a ring, "d" is an integer of 0 to 2, "e" and "f" are each independently an integer of 0 to 3, "g" and "h" are each independently an integer of 0 to 4, and $Ar_4$ and $Ar_5$ are each independently the same as defined in Formula 1.

19. The polycyclic compound of claim 14, wherein the polycyclic compound represented by Formula 1 is represented by Formula 4-1 to Formula 4-3:

Formula 4-1

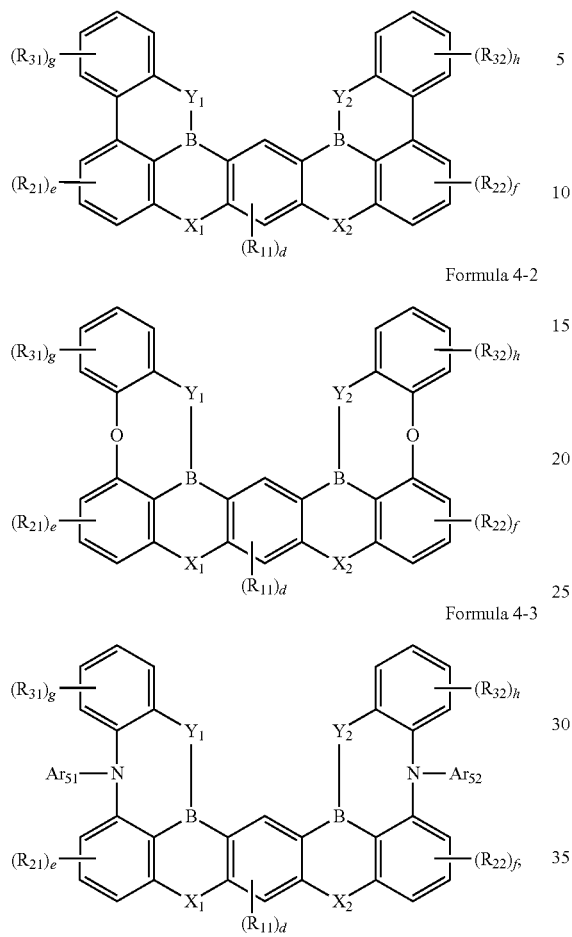

Formula 4-2

Formula 4-3 wherein in Formula 4-1 to Formula 4-3, $X_1$ and $X_2$ are each independently *—O—* or *—NAr$_4$—*, $Y_1$ and $Y_2$ are each independently *—O—* or *—S—*, Ar$_{51}$ and Ar$_{52}$ are each independently a substituted or unsubstituted aryl group of 6 to 30 carbon atoms for forming a ring, or a substituted or unsubstituted heteroaryl group of 2 to 30 carbon atoms for forming a ring, or are combined with an adjacent group to form a ring, $R_{11}$, $R_{21}$, $R_{22}$, $R_{31}$, and $R_{32}$ are each independently a hydrogen atom, a deuterium atom, a cyano group, a substituted or unsubstituted amine group, a substituted or unsubstituted nitro group, a substituted or unsubstituted alkyl group of 1 to 20 carbon atoms, a substituted or unsubstituted alkoxy group of 1 to 20 carbon atoms, a substituted or unsubstituted aryl group of 6 to 30 carbon atoms for forming a ring, or a substituted or unsubstituted heteroaryl group of 6 to 30 carbon atoms for forming a ring, or are combined with an adjacent group to form a ring, "d" is an integer of 0 to 2, "e" and "f" are each independently an integer of 0 to 3, "g" and "h" are each independently an integer of 0 to 4, and Ar$_4$ is the same as defined in Formula 1.

20. The polycyclic compound of claim 14, wherein the polycyclic compound represented by Formula 1 is at least one selected among compounds represented in Compound Group A to Compound Group F:

Compound Group A

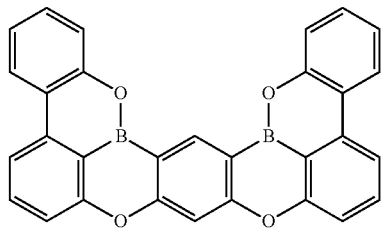
A-1

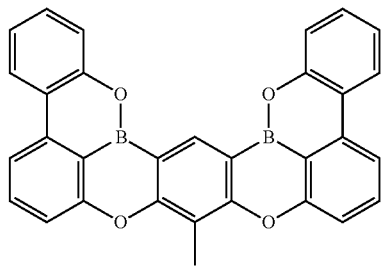
A-2

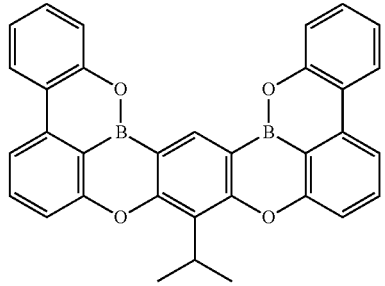
A-3

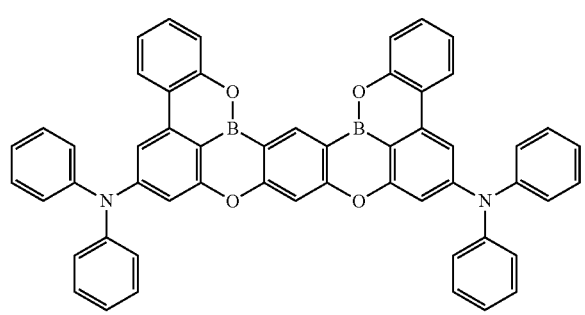
A-4

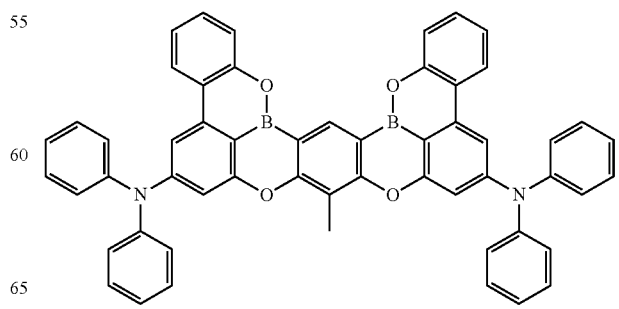
A-5

A-6
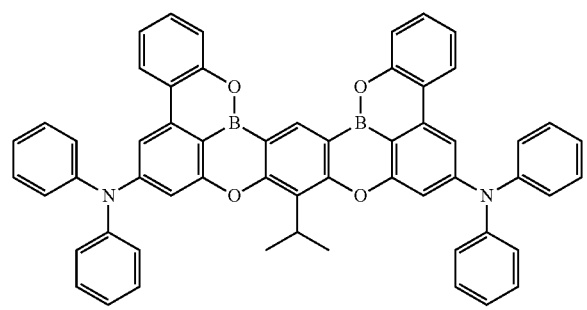
A-7
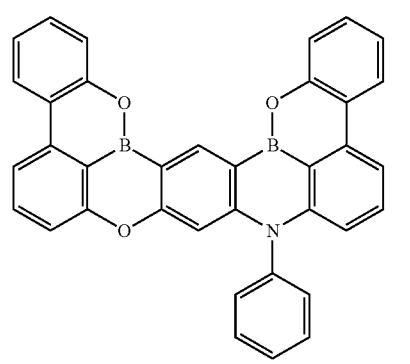
A-8
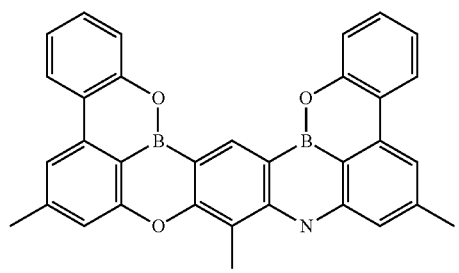
A-9
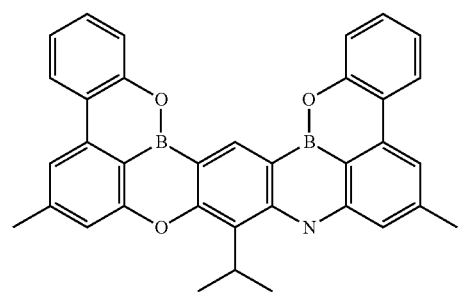
A-10
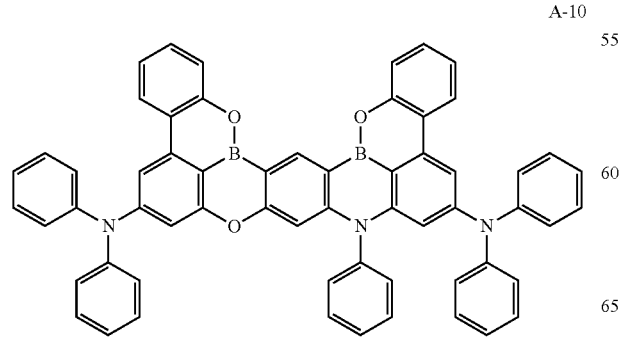
A-11
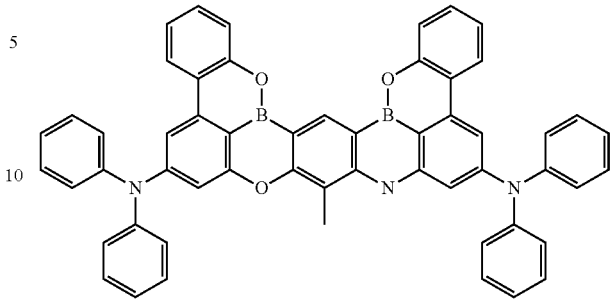
A-12
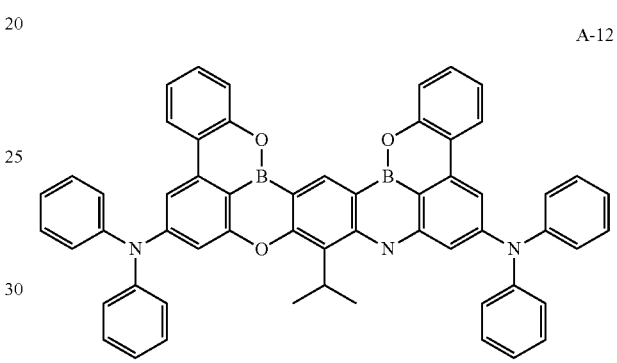
A-13
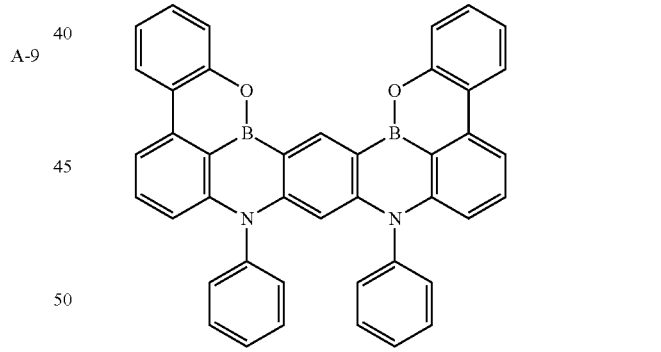
A-14
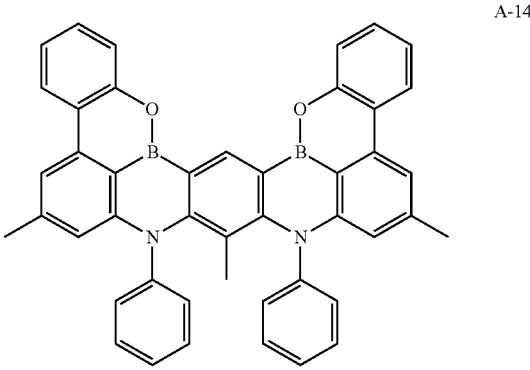

A-15
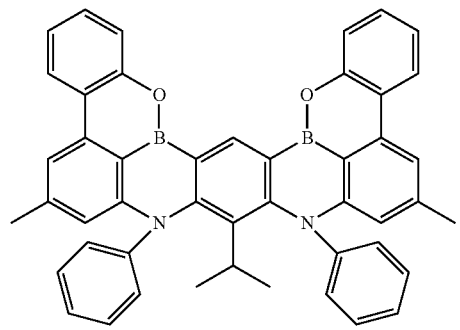
A-19
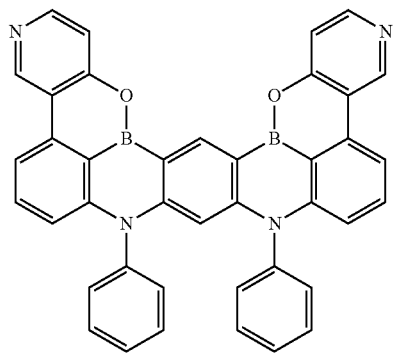
A-16
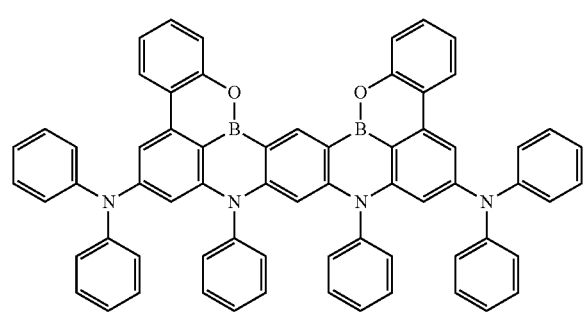
A-20
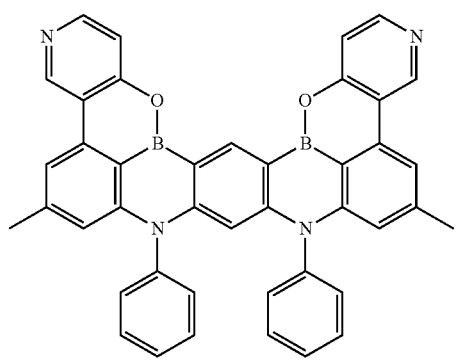
A-17
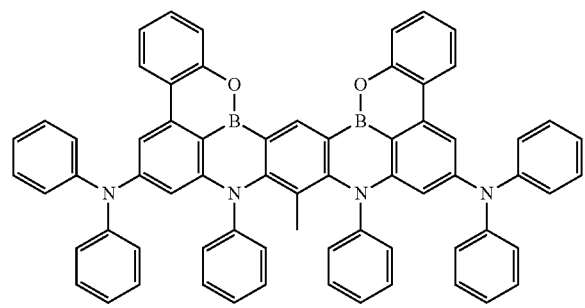
A-21
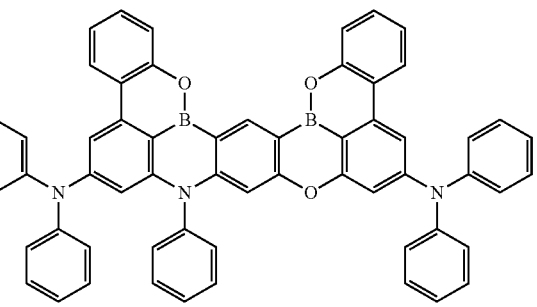
A-18
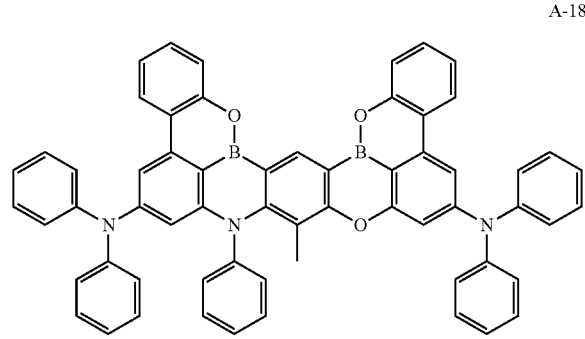
A-22
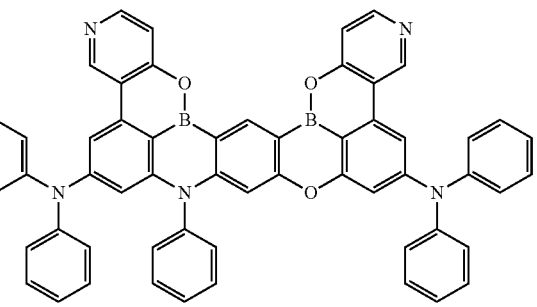

A-23
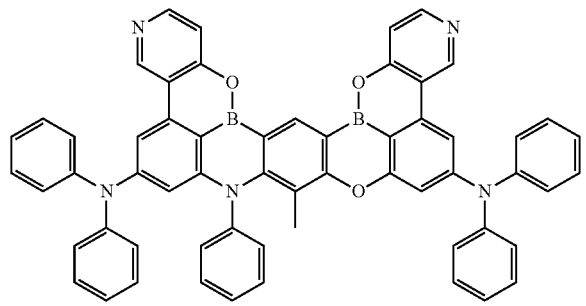
Compound Group B
B-1
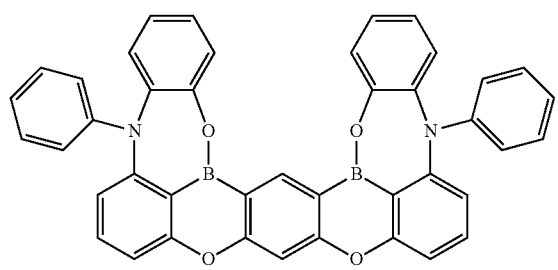
B-2
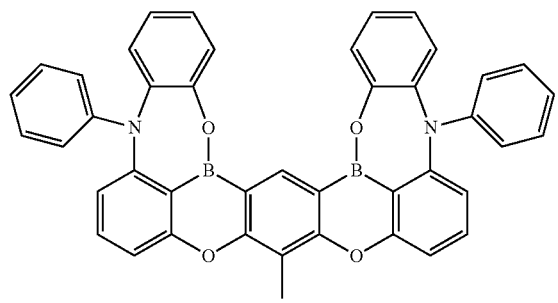
B-3
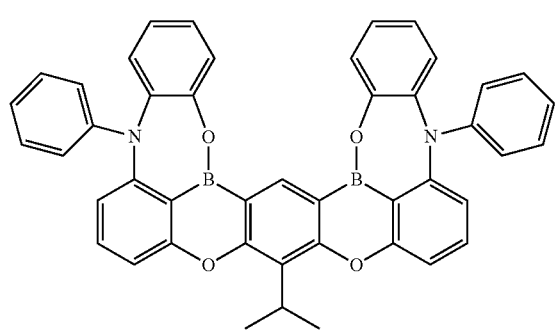
B-4
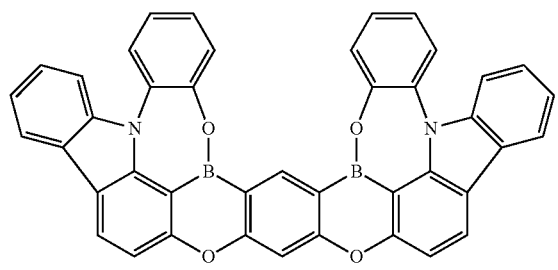
B-5
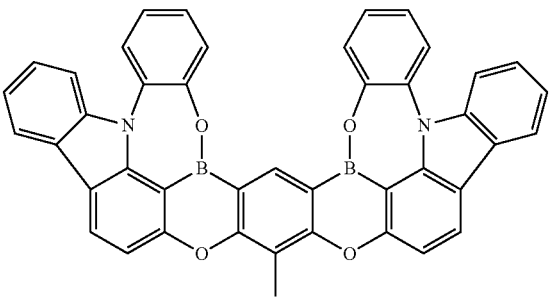
B-6
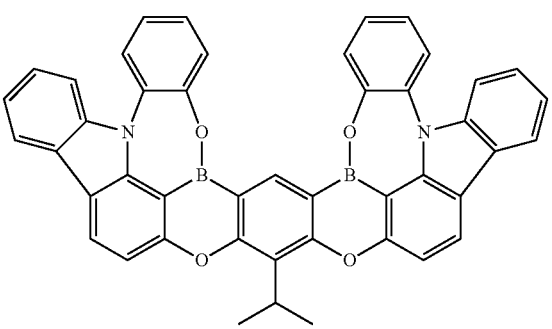
B-7
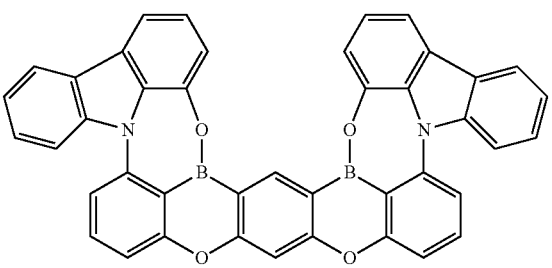
B-8
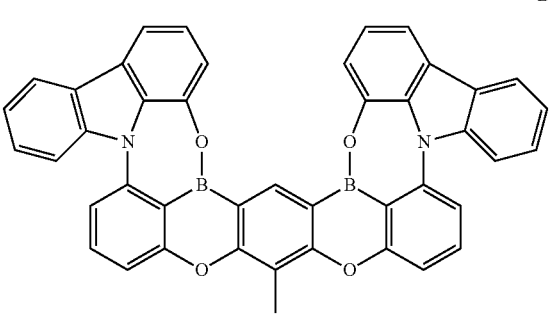
B-9
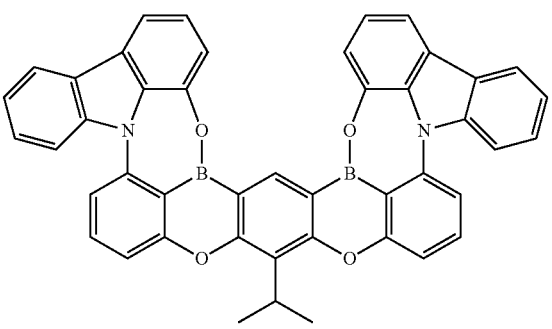

B-10
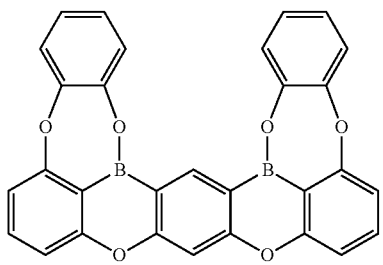
B-11
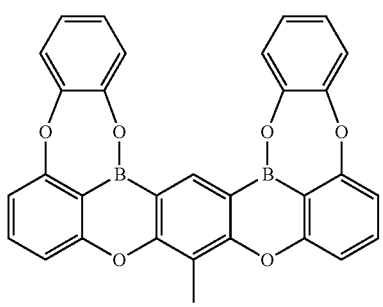
B-12
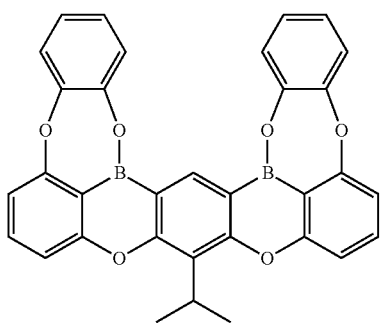
B-13
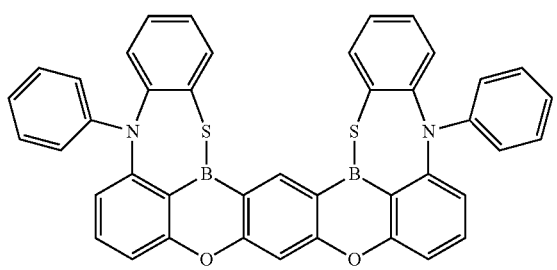
B-14
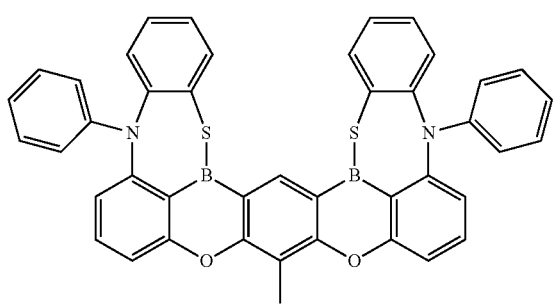
B-15
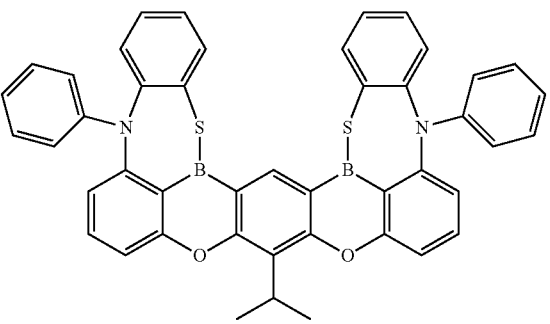
B-16
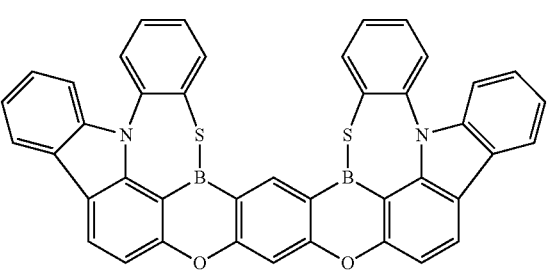
B-17
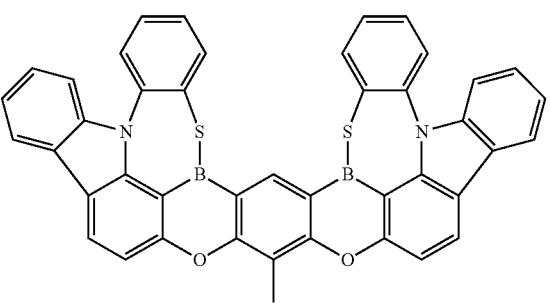
B-18
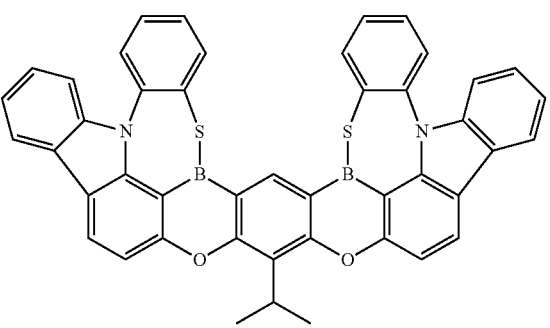
B-19
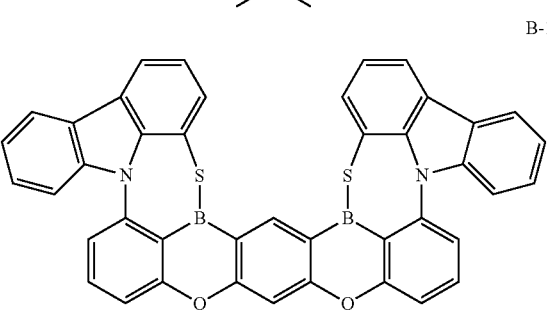

B-20
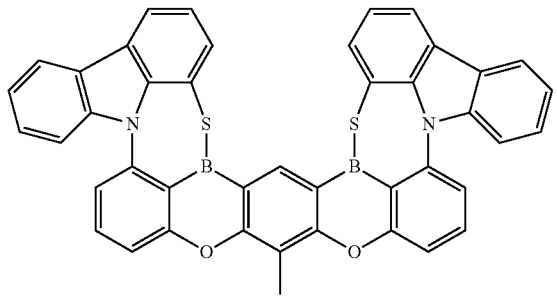
B-21
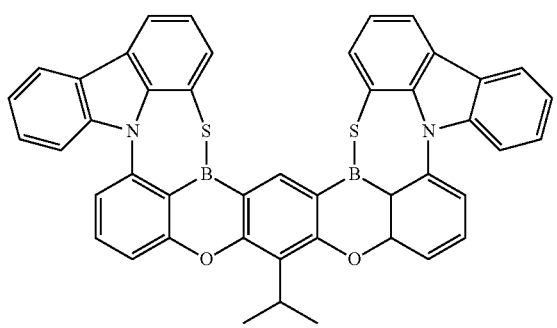
B-25
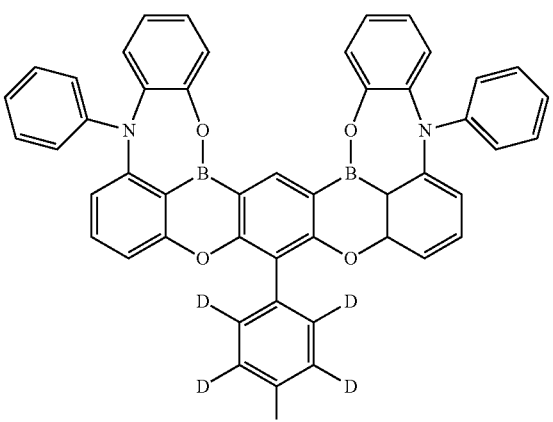
Compound Group C
B-22
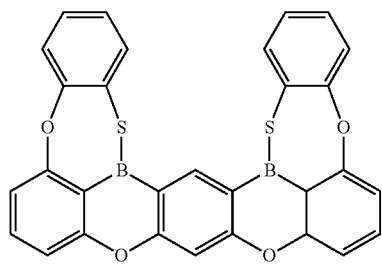
B-23
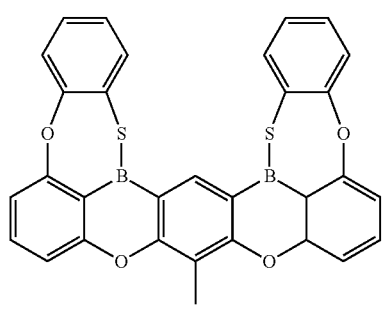
B-24
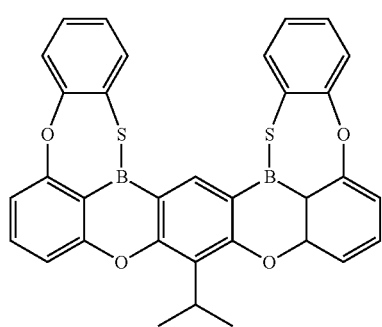
C-1
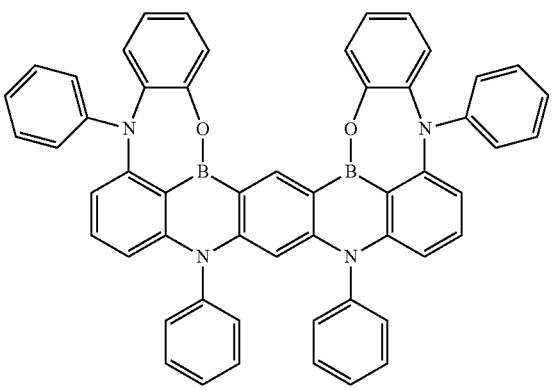
C-2
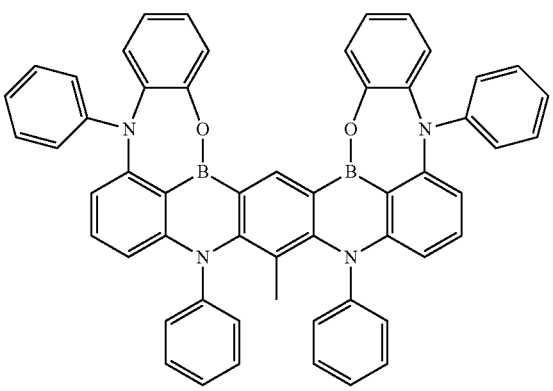

C-3
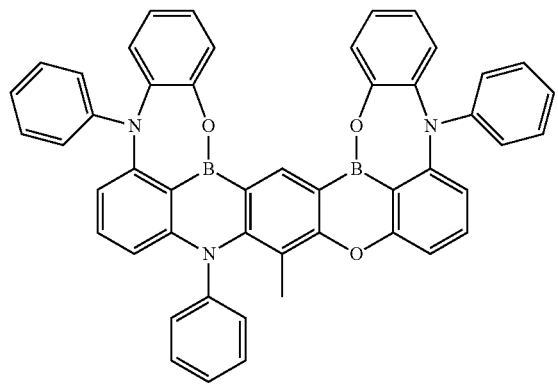
C-4
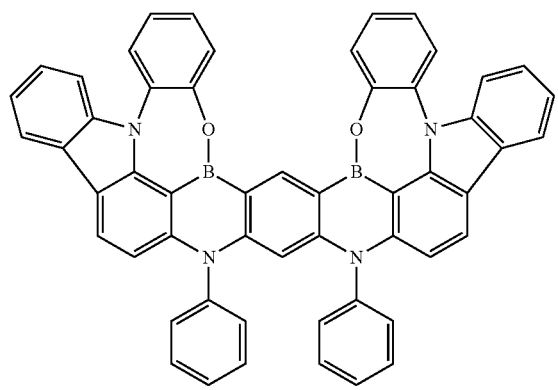
C-5
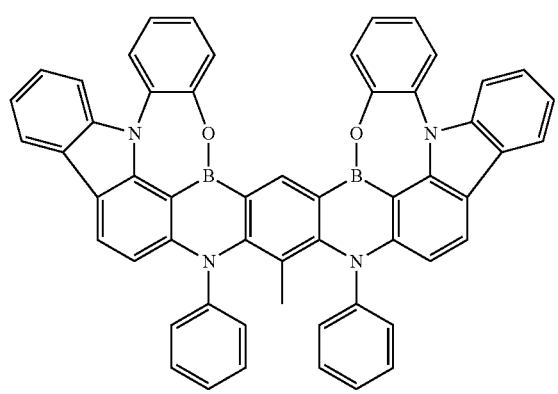
C-6
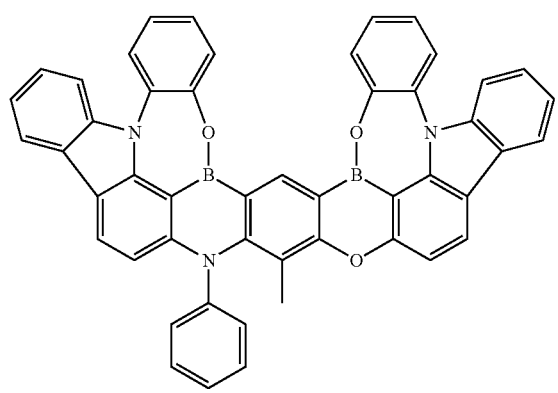
C-7
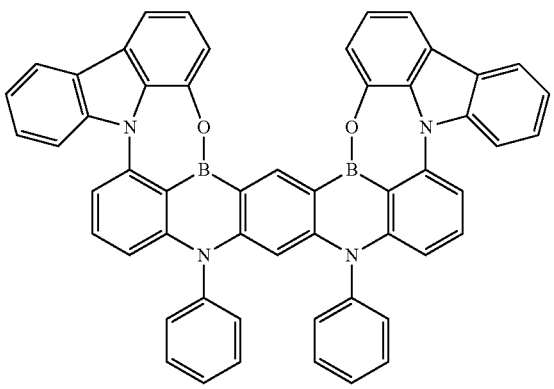
C-8
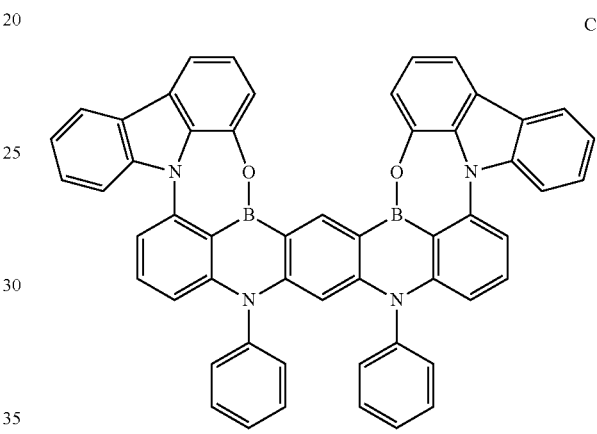
C-9
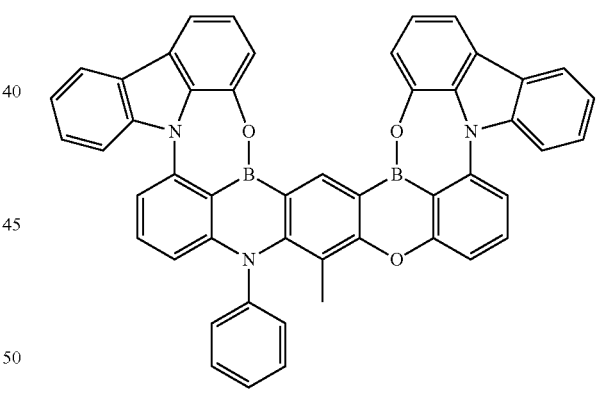
C-10
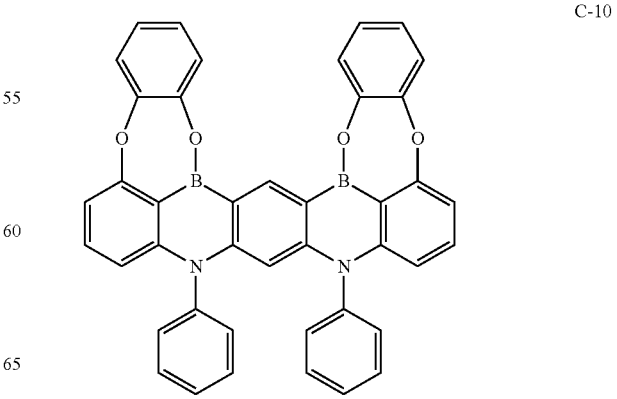

C-11
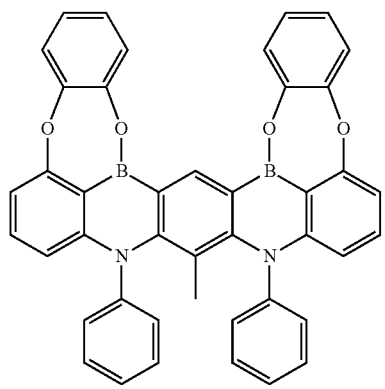
C-12
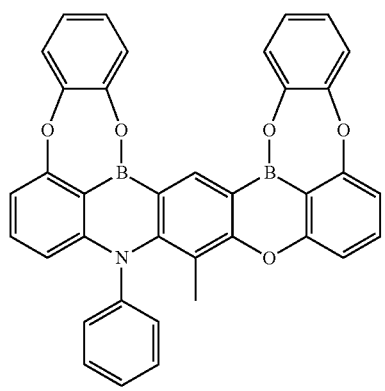
C-13
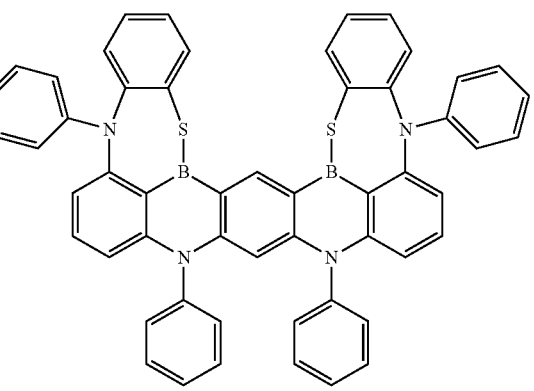
C-14
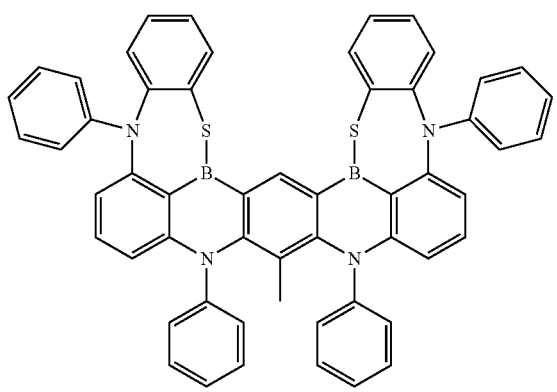
C-15
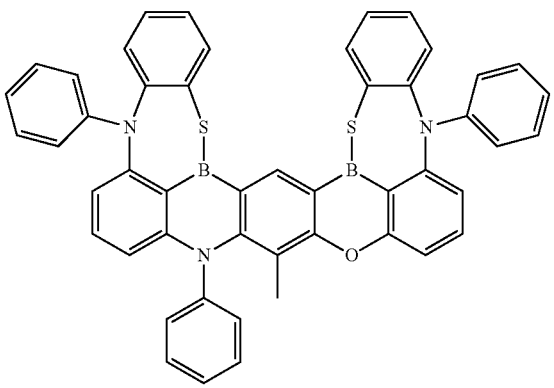
C-16
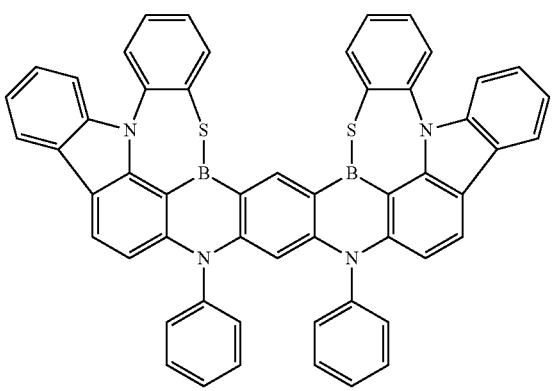
C-17
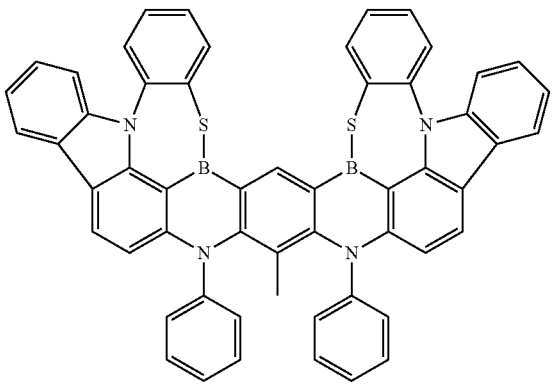
C-18
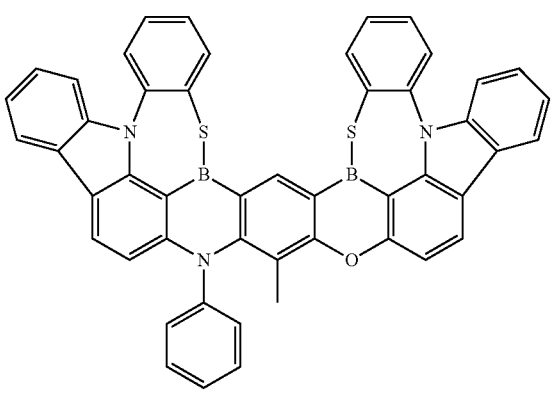

C-19
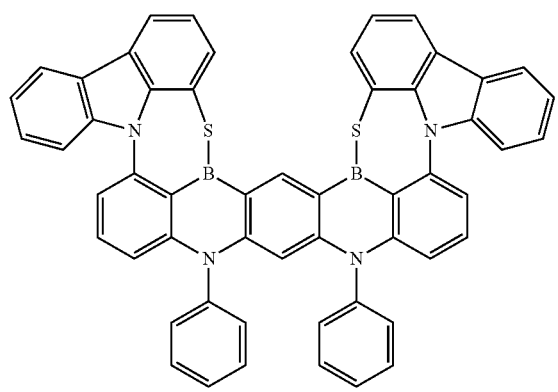
C-20
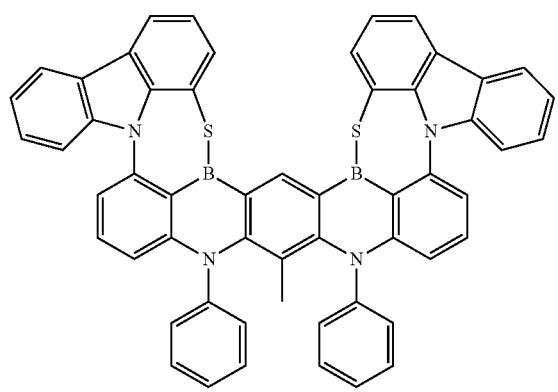
C-21
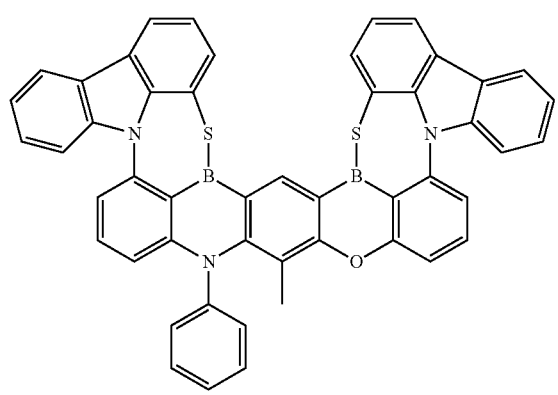
C-22
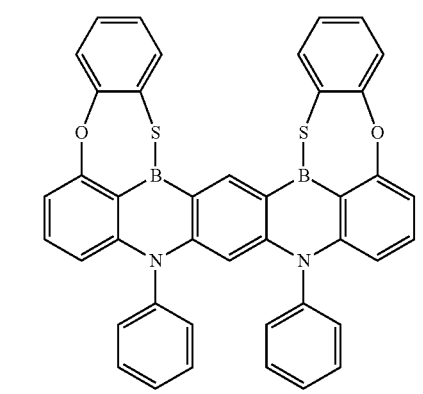
C-23
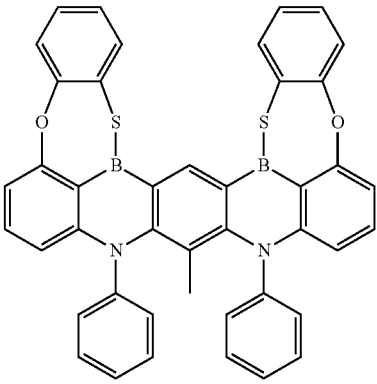
C-24
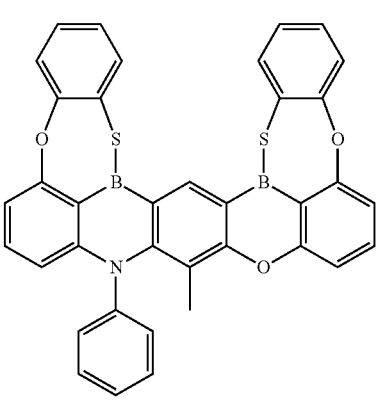
Compound Group D
D-1
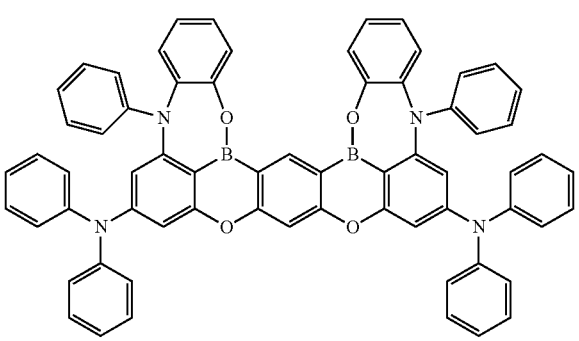
D-2
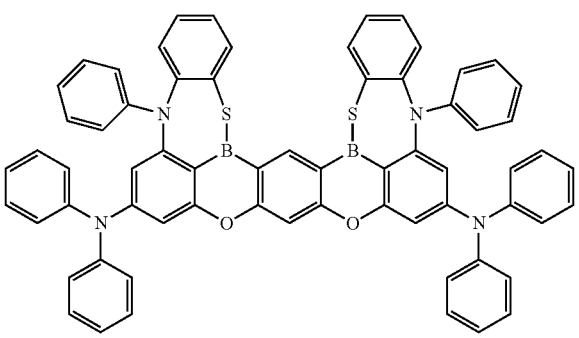

-continued
D-3
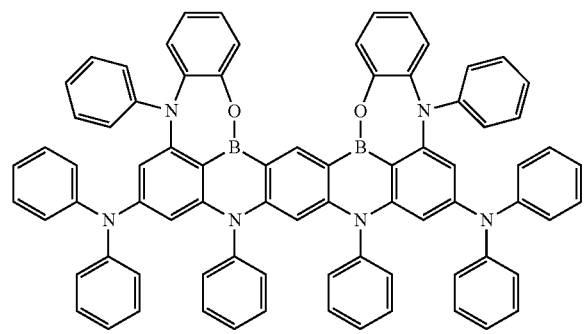
D-4
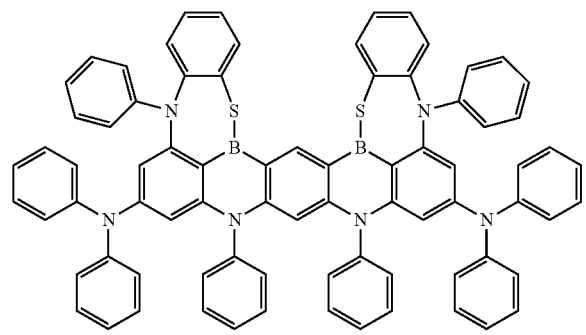
D-5
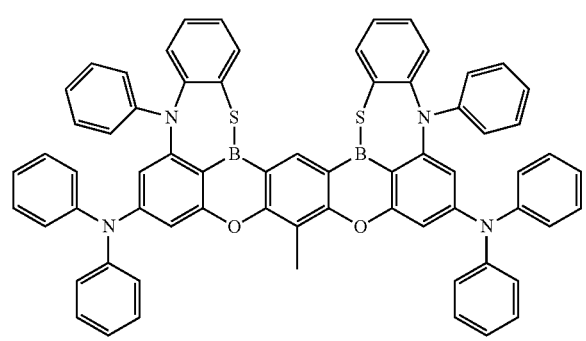
D-6
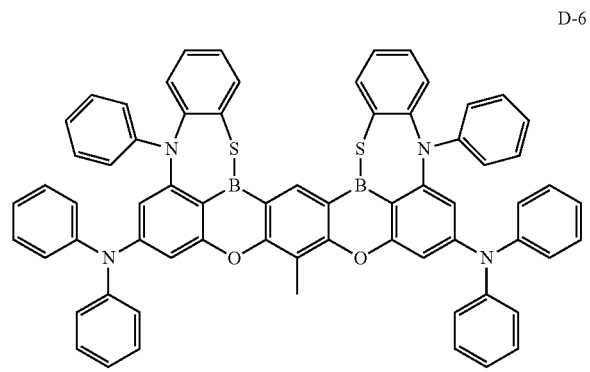 [SMILES: Cc1c2c(cc3c1Oc1cc(N(c4ccccc4)c4ccccc4)cc4c1B3Sc1ccccc1N4c1ccccc1)B1Sc3ccccc3N(c3ccccc3)c3cc(N(c4ccccc4)c4ccccc4)cc(c31)O2]
-continued
D-7
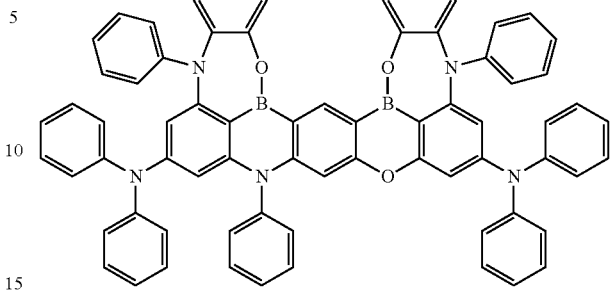
D-8
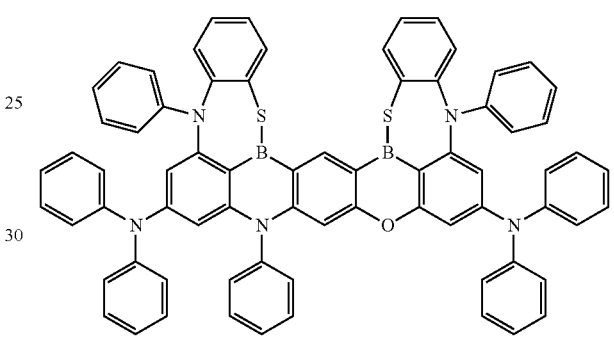
D-9
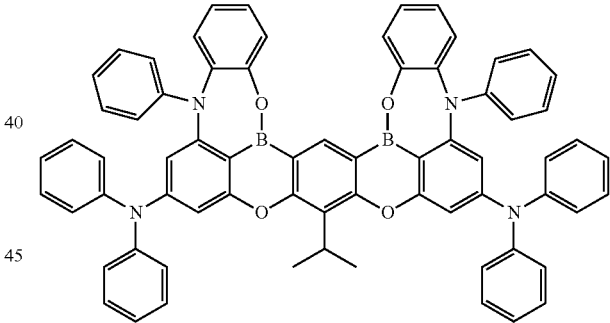
D-10
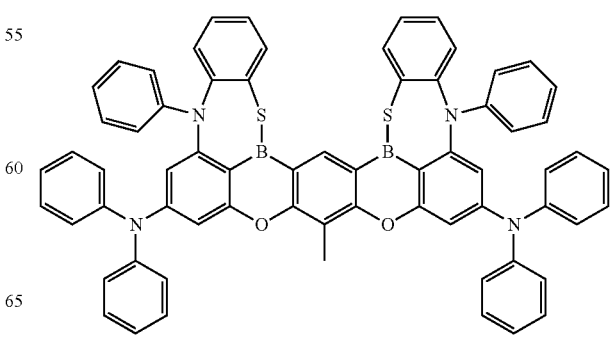

-continued
D-11
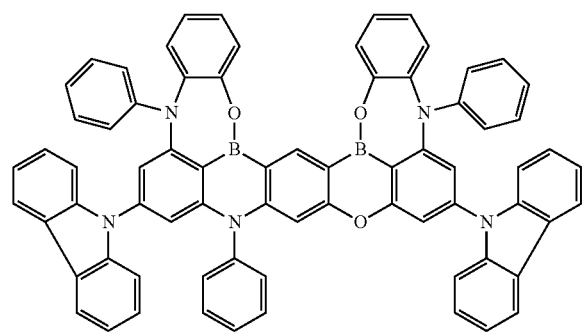
D-12
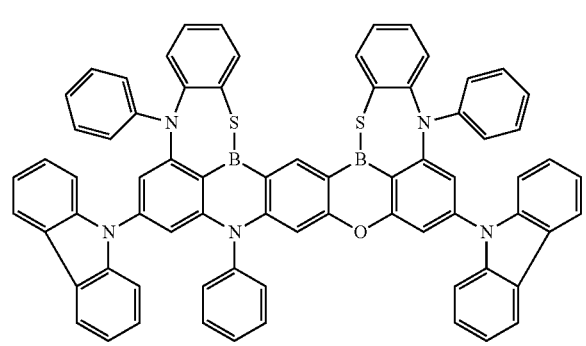
D-13
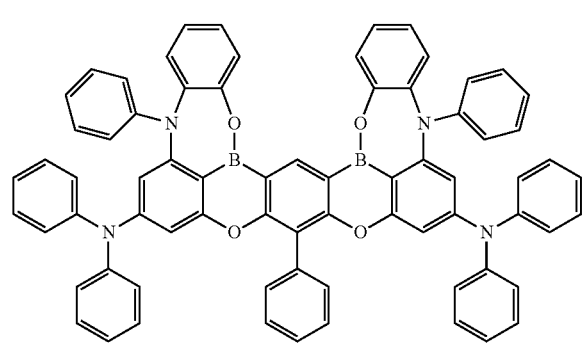
D-14
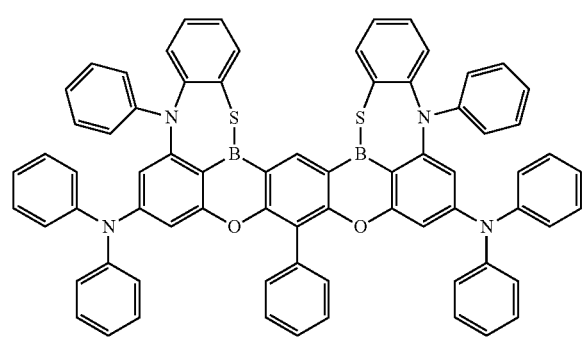
-continued
D-15
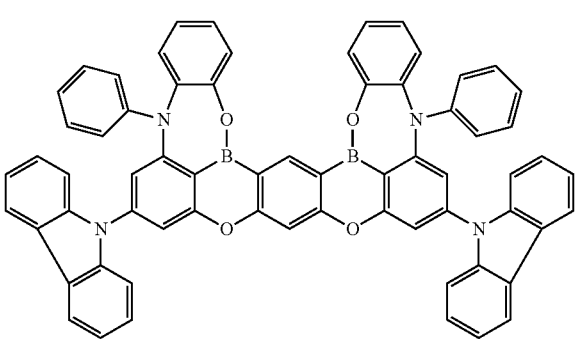
D-16
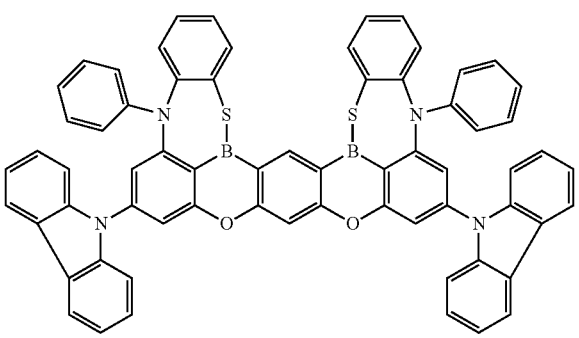
Compound Group E
E-1
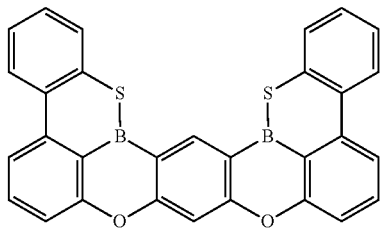
E-2
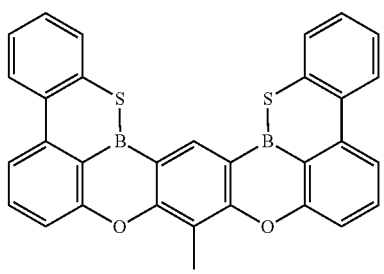
E-3
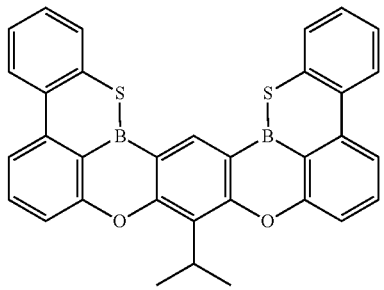

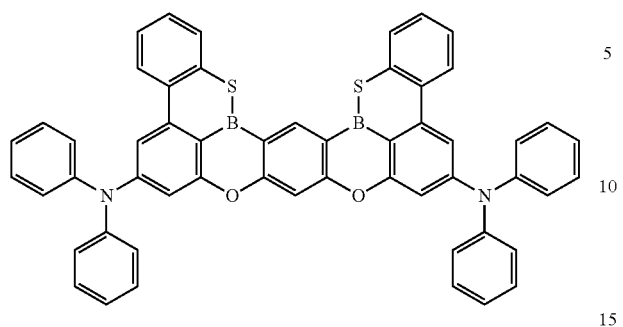
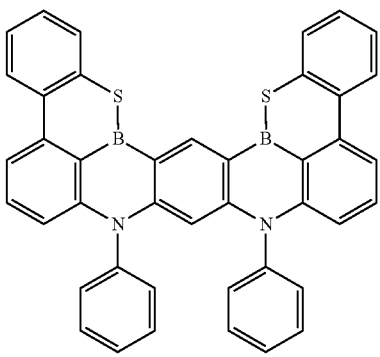

-continued
E-17
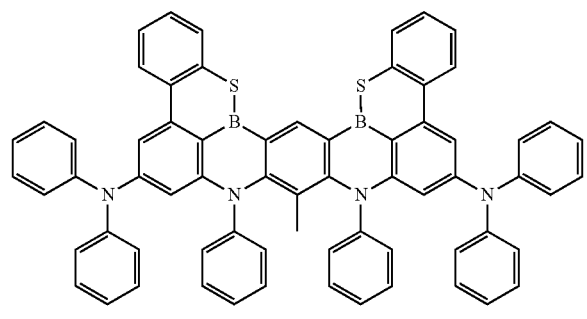
E-18
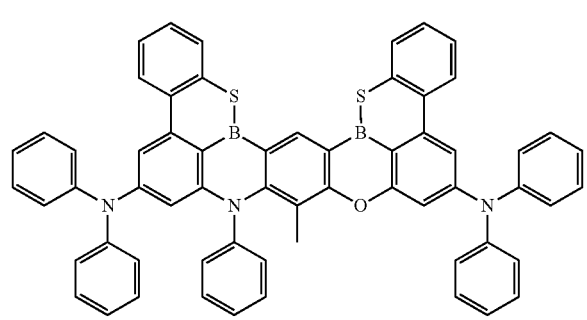
E-19
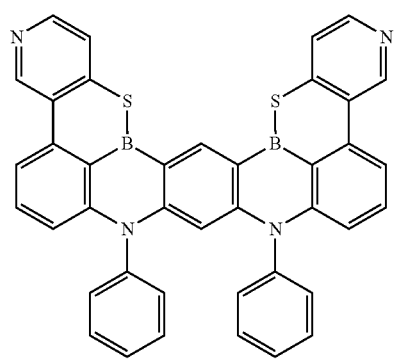
E-20
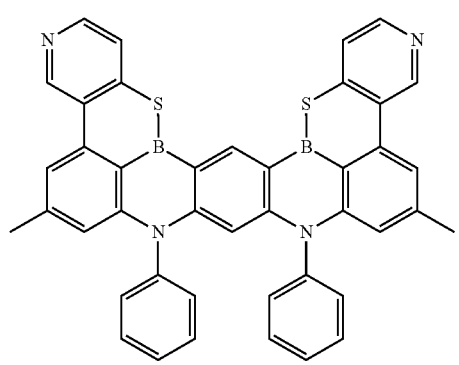
-continued
E-21
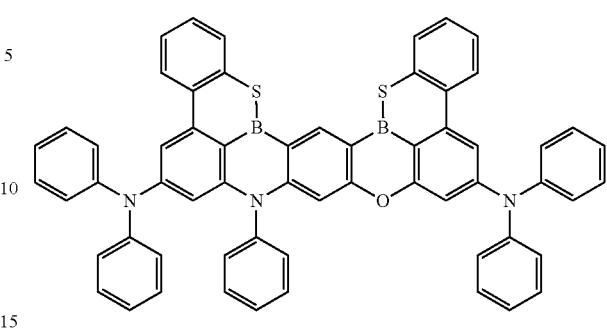
E-22
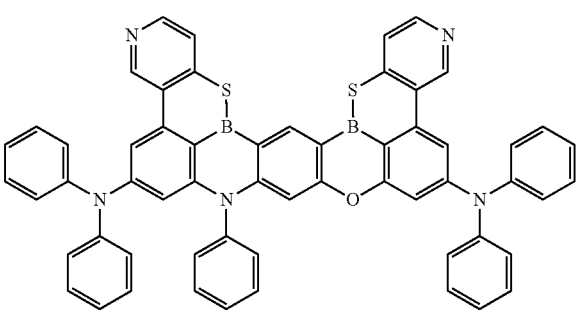
E-23
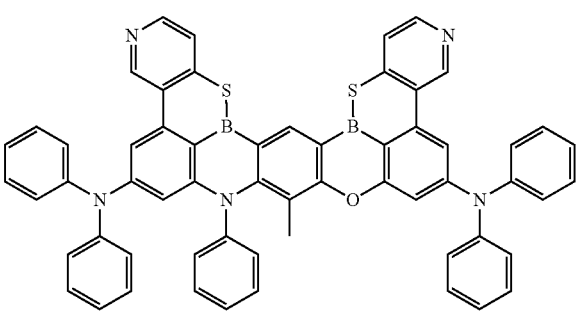
Compound Group F
F-1
F-2
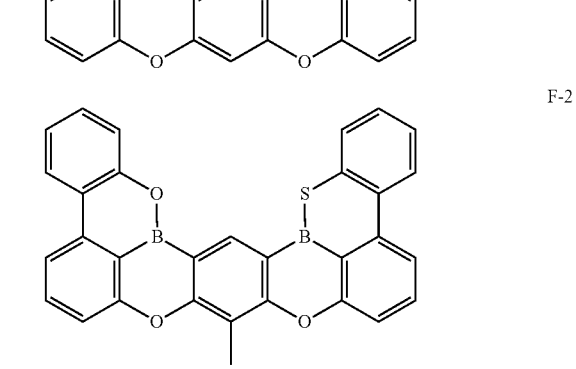

-continued
F-3
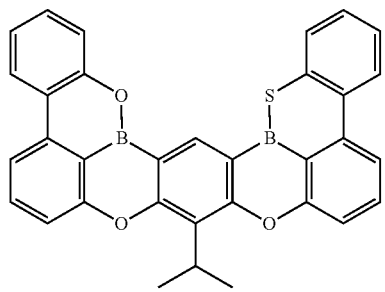
F-4
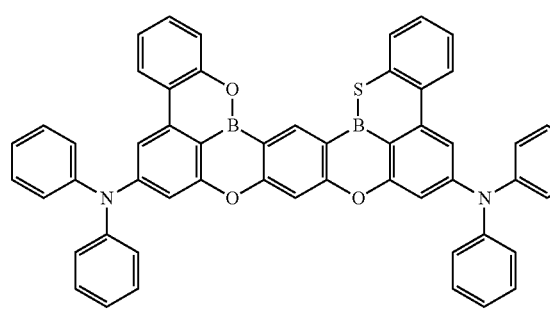
F-5
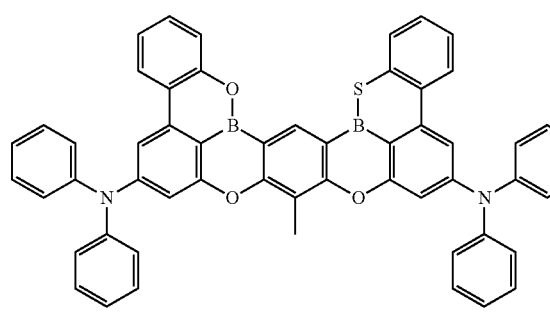
F-6
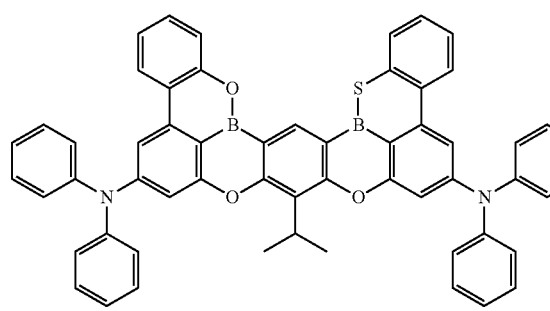
F-7
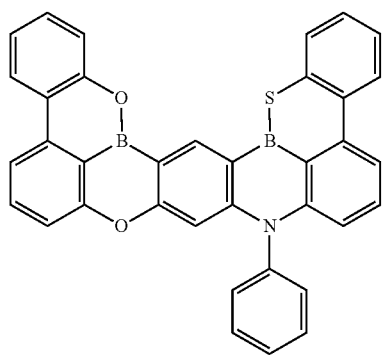
-continued
F-8
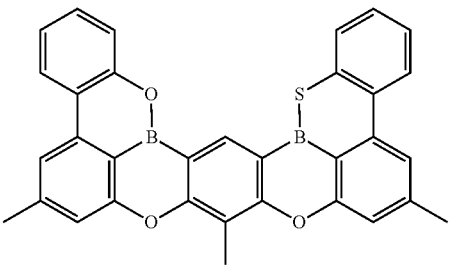
F-9
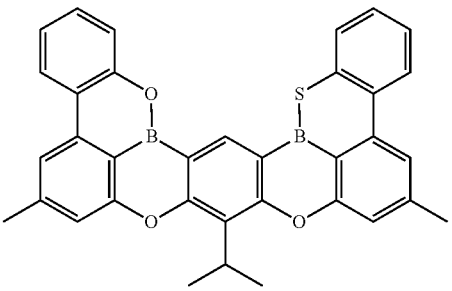
F-10
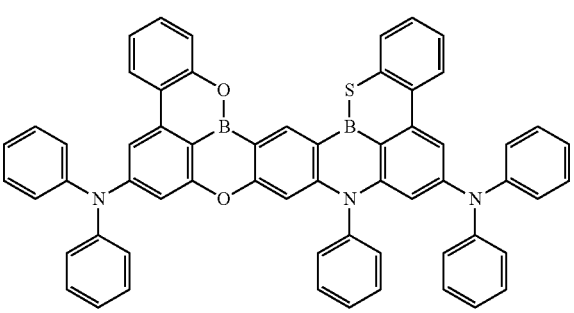
F-13
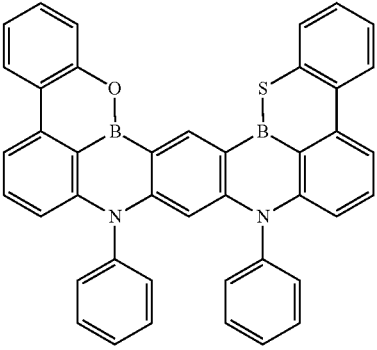
F-14
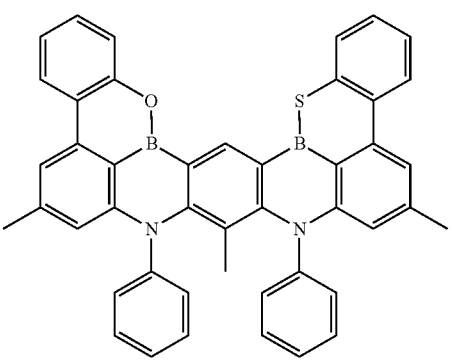

-continued
F-15
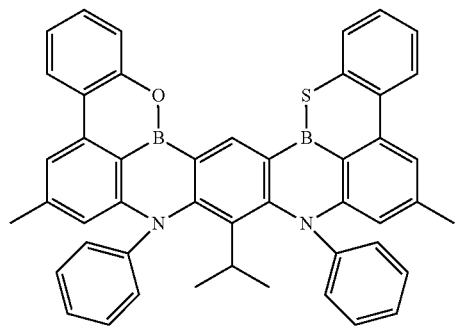
F-16
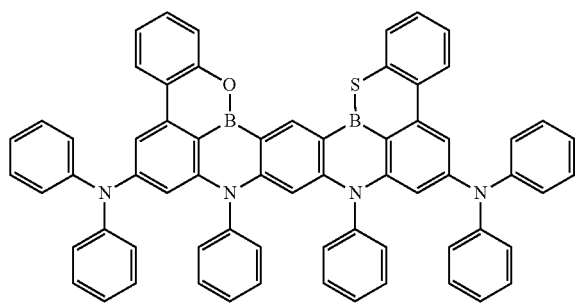
F-17
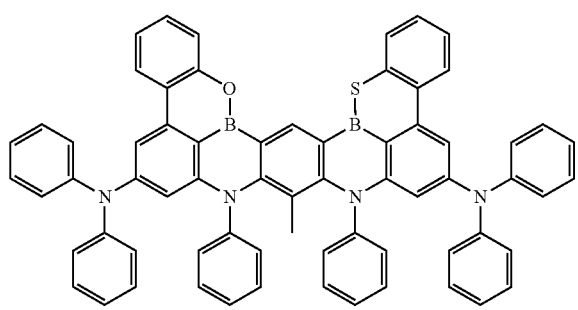
F-18
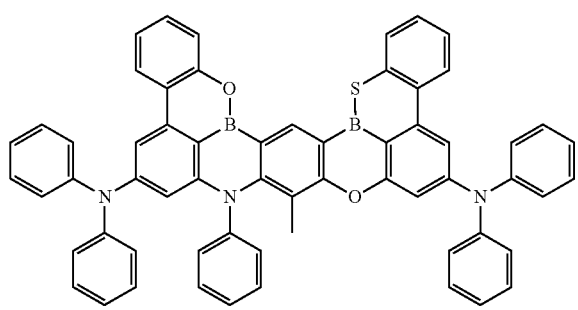
-continued
F-19
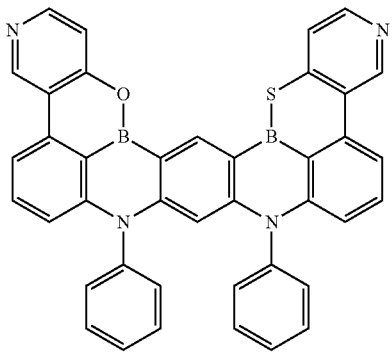
F-20
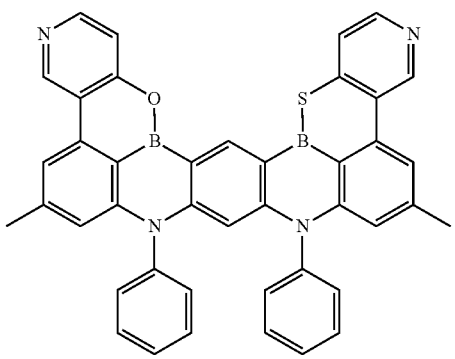
F-21
F-22